United States Patent
Lu

(10) Patent No.: US 12,400,949 B2
(45) Date of Patent: Aug. 26, 2025

(54) INTERCONNECTION STRUCTURE AND MANUFACTURE METHOD THEREOF

(71) Applicants: INVENTION AND COLLABORATION LABORATORY PTE. LTD., Singapore (SG); ETRON TECHNOLOGY, INC., Hsinchu (TW)

(72) Inventor: Chao-Chun Lu, Hsinchu (TW)

(73) Assignees: INVENTION AND COLLABORATION LABORATORY PTE. LTD., Singapore (SG); ETRON TECHNOLOGY, INC., Hsinchu (TW)

( * ) Notice: Subject to any disclaimer, the term of this patent is extended or adjusted under 35 U.S.C. 154(b) by 67 days.

(21) Appl. No.: 17/528,957

(22) Filed: Nov. 17, 2021

(65) Prior Publication Data
US 2022/0293518 A1    Sep. 15, 2022

Related U.S. Application Data

(60) Provisional application No. 63/158,896, filed on Mar. 10, 2021.

(51) Int. Cl.
*H01L 23/522*    (2006.01)
*H01L 21/768*    (2006.01)

(52) U.S. Cl.
CPC .... *H01L 23/5226* (2013.01); *H01L 21/76885* (2013.01)

(58) Field of Classification Search
CPC .......... H01L 23/5226; H01L 21/76885; H01L 21/28525; H01L 21/76805; H01L 21/76897; H01L 23/485; H01L 23/53266
See application file for complete search history.

(56) References Cited

U.S. PATENT DOCUMENTS

| | | | |
|---|---|---|---|
| 6,462,395 B1 | 10/2002 | Fukuda et al. | |
| 2001/0050395 A1 | 12/2001 | Esaki | |
| 2002/0058380 A1 | 5/2002 | Parekh et al. | |
| 2002/0096773 A1 | 7/2002 | Anezaki et al. | |

(Continued)

FOREIGN PATENT DOCUMENTS

| | | |
|---|---|---|
| EP | 0 195 977 A2 | 10/1986 |
| EP | 2 239 771 A1 | 10/2010 |

(Continued)

OTHER PUBLICATIONS

Machine Translation of KR100415519B1.*

(Continued)

*Primary Examiner* — Yara B Green
*Assistant Examiner* — Fakeha Sehar
(74) *Attorney, Agent, or Firm* — Birch, Stewart, Kolasch & Birch, LLP

(57) ABSTRACT

An interconnection structure includes a first dielectric layer, a first conduction layer, a conductor pillar, an upper dielectric layer and an upper conduction layer. The first dielectric layer is disposed over a first terminal of a device. The first conduction layer is disposed over the first dielectric layer. The conductor pillar is connected to the first terminal. The upper dielectric layer is disposed over the first conduction layer. The upper conduction layer is disposed over the upper dielectric layer. The conductor pillar connects to the upper conduction layer but disconnects from the first conduction layer.

9 Claims, 62 Drawing Sheets

(56) References Cited

U.S. PATENT DOCUMENTS

| | | |
|---|---|---|
| 2005/0258498 A1 | 11/2005 | Suzuki |
| 2006/0071074 A1* | 4/2006 | Konevecki ............. H10B 69/00 257/E21.21 |
| 2006/0131657 A1 | 6/2006 | Hamaguchi |
| 2007/0052092 A1 | 3/2007 | Kao |
| 2008/0116583 A1 | 5/2008 | Yuki |
| 2010/0289084 A1 | 11/2010 | Yoon et al. |
| 2011/0156107 A1 | 6/2011 | Bohr et al. |
| 2013/0069168 A1 | 3/2013 | Blatchford |
| 2013/0075920 A1 | 3/2013 | Chen et al. |
| 2014/0143565 A1 | 5/2014 | Paul et al. |
| 2014/0199837 A1 | 7/2014 | Hung et al. |
| 2015/0357282 A1 | 12/2015 | Lau et al. |
| 2016/0092396 A1 | 3/2016 | Rusu |
| 2016/0240541 A1 | 8/2016 | Liaw |
| 2017/0263506 A1 | 9/2017 | Bouche et al. |
| 2018/0285261 A1 | 10/2018 | Mandal et al. |
| 2018/0366329 A1 | 12/2018 | Kim |
| 2019/0250209 A1 | 8/2019 | Lee et al. |
| 2019/0296012 A1 | 9/2019 | Iwata et al. |
| 2019/0303268 A1 | 10/2019 | Ansari et al. |
| 2019/0355620 A1 | 11/2019 | Freed et al. |
| 2019/0355672 A1 | 11/2019 | Fujita et al. |
| 2020/0106441 A1 | 4/2020 | Liaw |
| 2020/0176574 A1* | 6/2020 | Huang ............. H01L 29/41725 |
| 2020/0233312 A1 | 7/2020 | Kim |
| 2020/0294180 A1 | 9/2020 | Koker et al. |
| 2020/0350322 A1 | 11/2020 | Liu et al. |
| 2020/0365464 A1 | 11/2020 | Sreenivasan et al. |
| 2021/0004241 A1 | 1/2021 | Banik et al. |
| 2021/0066187 A1 | 3/2021 | Lee et al. |
| 2021/0167176 A1 | 6/2021 | Inden et al. |
| 2021/0408245 A1 | 12/2021 | Lu |
| 2022/0059460 A1 | 2/2022 | Do et al. |
| 2023/0106517 A1 | 4/2023 | Lu et al. |

FOREIGN PATENT DOCUMENTS

| | | | |
|---|---|---|---|
| JP | 63-221649 | A | 9/1988 |
| JP | 7-99245 | A | 4/1995 |
| JP | 9-181178 | A | 7/1997 |
| JP | 9-237831 | A | 9/1997 |
| JP | 10-27887 | A | 1/1998 |
| JP | 11-121613 | A | 4/1999 |
| JP | 2001-44279 | A | 2/2001 |
| JP | 2001-44282 | A | 2/2001 |
| JP | 2001044282 | A * | 2/2001 |
| JP | 2001-244215 | A | 9/2001 |
| JP | 2005-244247 | A | 9/2005 |
| JP | 2005-327898 | A | 11/2005 |
| JP | 2009-231621 | A | 10/2009 |
| JP | 2010-212604 | A | 9/2010 |
| JP | 2011-82223 | A | 4/2011 |
| JP | 2011-228578 | A | 11/2011 |
| JP | 2013-143485 | A | 7/2013 |
| JP | 2016-530704 | A | 9/2016 |
| JP | 2018-536214 | A | 12/2018 |
| KR | 10-2001-0051294 | A | 6/2001 |
| KR | 100415519 | B1 * | 1/2004 |
| KR | 10-2005-0087626 | A | 8/2005 |
| KR | 10-2015-0041092 | A | 4/2015 |
| TW | 200529364 | A | 9/2005 |
| TW | 201715648 | A | 5/2017 |
| TW | 202022960 | A | 6/2020 |
| TW | I710064 | B | 11/2020 |
| WO | WO 2011/014409 | A1 | 2/2011 |
| WO | WO 2017/095494 | A1 | 6/2017 |
| WO | WO 2019/094843 | A1 | 5/2019 |
| WO | WO 2020/054109 | A1 | 3/2020 |

OTHER PUBLICATIONS

Extended European Search Report for European Application No. 22161038.9, dated Feb. 20, 2023.

Japanese Office Action dated May 30, 2023 for Application No. 2022-037100 with an English translation.

Chang et al., "A 5nm 135Mb SRAM in EUV and High-Mobility-Channel FinFET Technology with Metal Coupling and Charge-Sharing Write-Assist Circuitry Schemes for High-Density and Low-VMIN Applications," 2020 IEEE, ISSCC, Feb. 16, 2020, pp. 238-240.

Extended European Search Report for European Application No. 22160758.3, dated Dec. 5, 2022.

Extended European Search Report for European Application No. 22160726.0, dated Nov. 30, 2022.

Extended European Search Report for European Application No. 22160752.6, dated Dec. 13, 2022.

Extended European Search Report for European Application No. 22161083.5, dated Dec. 15, 2022.

Partial European Search Report for European Application No. 22161038.9, dated Dec. 15, 2022.

Salahuddin et al., "SRAM With Buried Power Distribution to Improve Write Margin and Performance in Advanced Technology Nodes," IEEE Electron Device Letters, vol. 40, No. 8, Aug. 2019, pp. 1261-1264.

Schor, "VLSI 2018: Samsung's 2nd Gen 7nm, EUV Goes HVM," WikiChip Fuse, Aug. 4, 2018, 6 pages total.

Japanese Office Action dated Aug. 1, 2023 for Application No. 2022-036485 with an English translation.

Extended European Search Report for European Application No. 22160535.5, dated Aug. 16, 2022.

Partial European Search Report for European Application No. 22160726.0, dated Jul. 25, 2022.

Partial European Search Report for European Application No. 22160752.6, dated Jul. 27, 2022.

Partial European Search Report for European Application No. 22161083.5, dated Jul. 29, 2022.

Taiwanese Office Action and Search Report for Taiwanese Application No. 111108252, dated Jul. 5, 2022.

Japanese Office Action for Japanese Application No. 2022-036485, dated Jan. 9, 2024, with English translation.

Korean Office Action for Korean Application No. 10-2022-0028713, dated Jan. 8, 2024, with English translation.

Song et al., "A 10 nm FinFET 128 Mb SRAM With Assist Adjustment System for Power, Performance, and Area Optimization," IEEE Journal of Solid-State Circuits, vol. 52, No. 1, Jan. 2017, pp. 240-249.

Hoefflinger, "Chips 2020 vol. 2", The Frontiers Collection, Chapter 11, 2016, pp. 181-187.

Korean Office Action for Korean Application No. 10-2022-0029992, dated Jun. 28, 2024, with English translation.

Tong et al., "Two-terminal vertical memory cell for cross-point static random access memory applications", J. Vac. Sci. Technol. B, vol. 32, No. 2, 2014, pp. 021205-1-021205-7.

US Office Action for U.S. Appl. No. 17/395,922, dated May 23, 2024.

US Office Action for U.S. Appl. No. 17/528,481, dated May 31, 2024.

Taiwanese Office Action and Search Report for Taiwanese Application No. 111108252, dated Oct. 16, 2024.

Japanese Office Action for Japanese Application No. 2024-092248, dated Mar. 25, 2025, with English translation.

US Office Action for U.S. Appl. No. 17/395,922, dated May 20, 2025.

Japanese Office Action for Japanese Application No. 2024-125159, dated Jun. 3, 2025, with English translation.

U.S. Office Action for U.S. Appl. No. 17/528,481, dated Jun. 25, 2025.

* cited by examiner

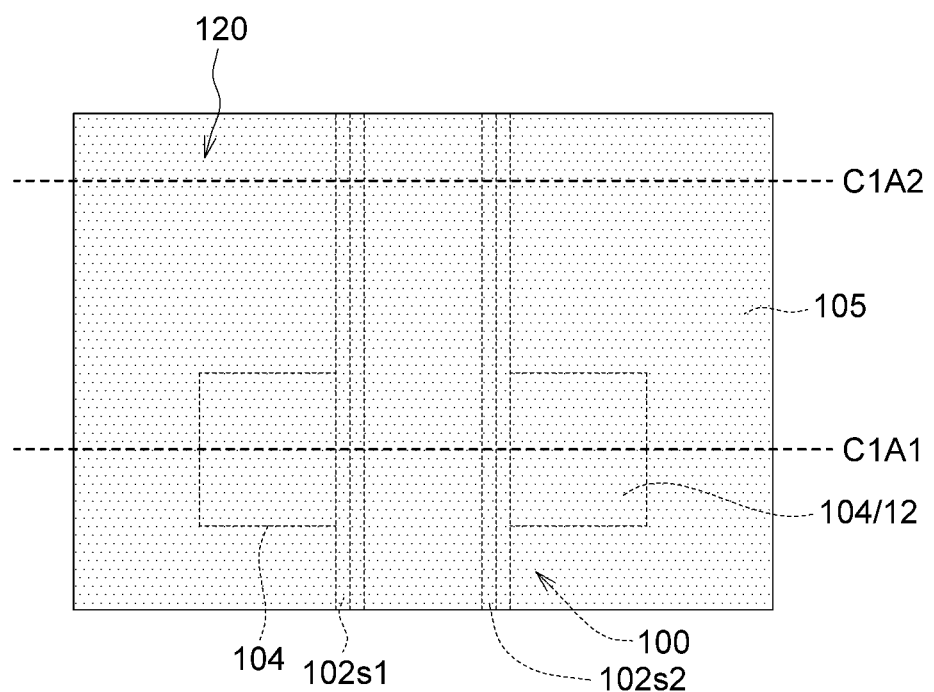
FIG. 1A(1)

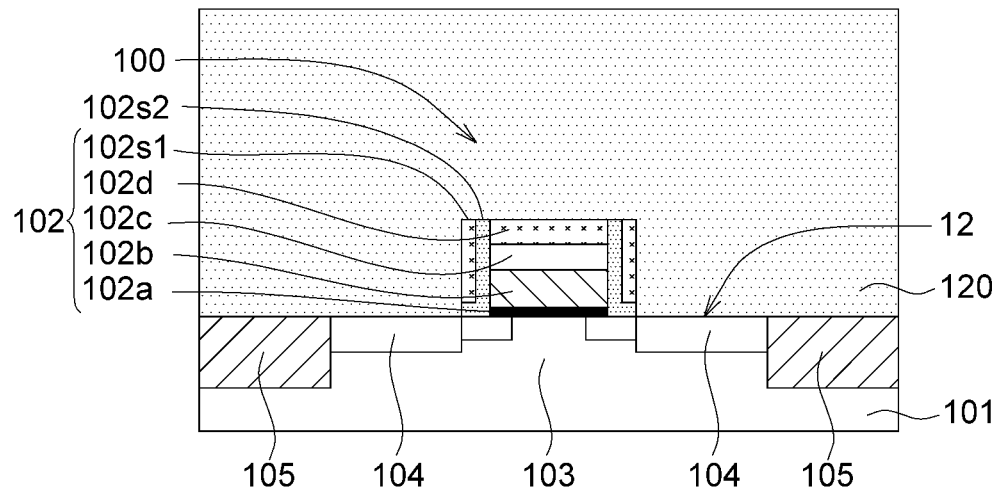
FIG. 1A(2)
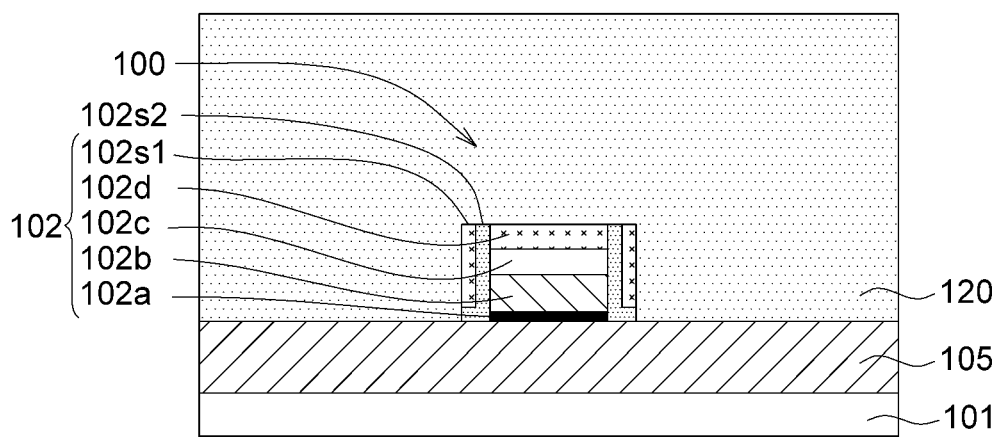
FIG. 1A(3)

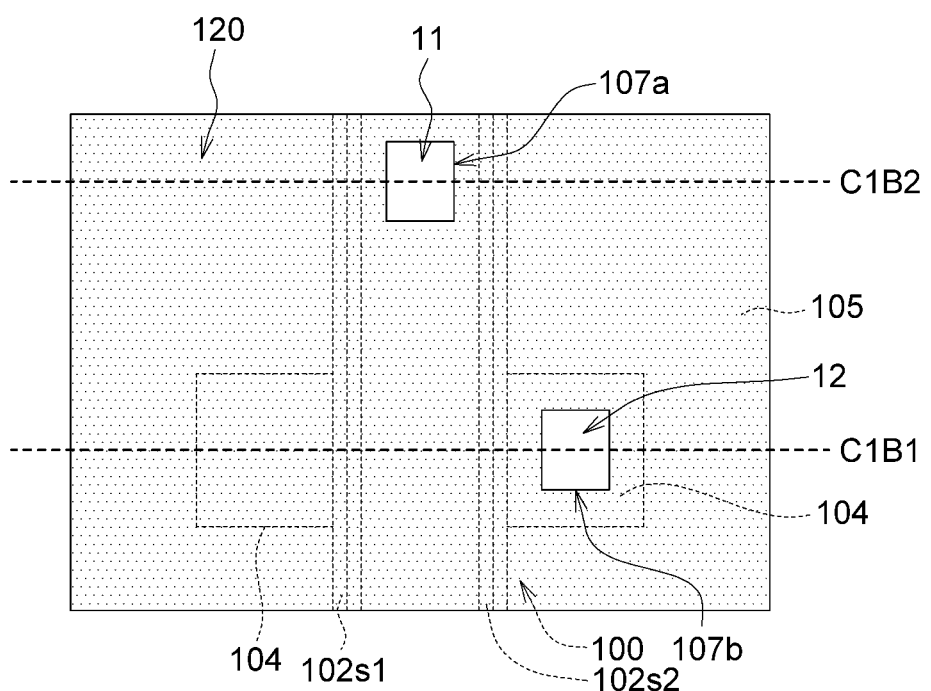
FIG. 1B(1)

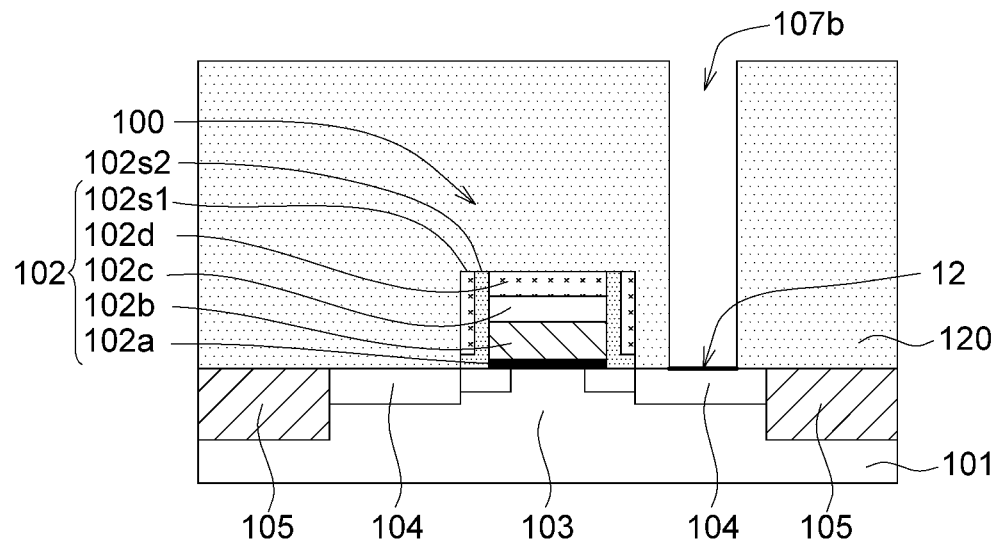
FIG. 1B(2)
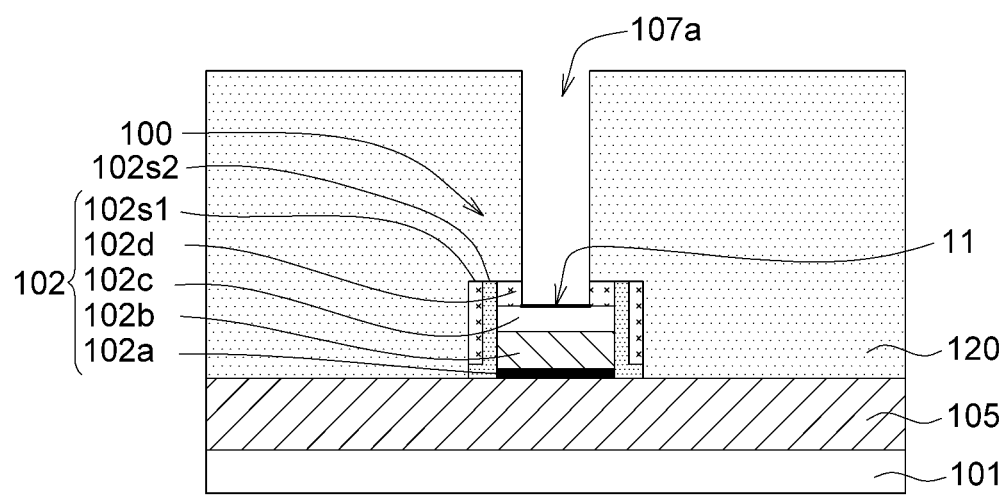
FIG. 1B(3)

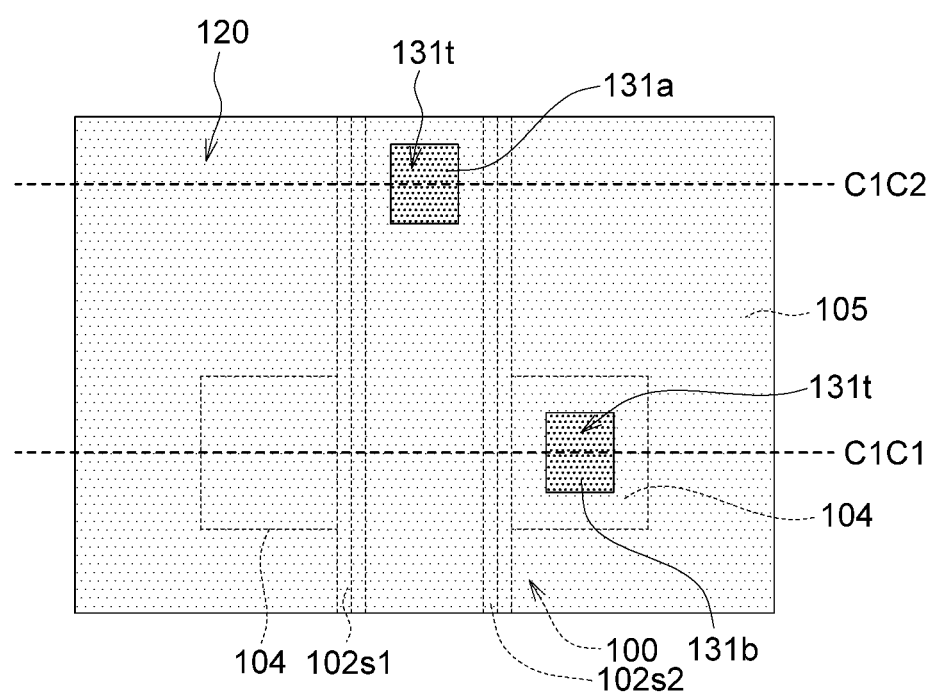
FIG. 1C(1)

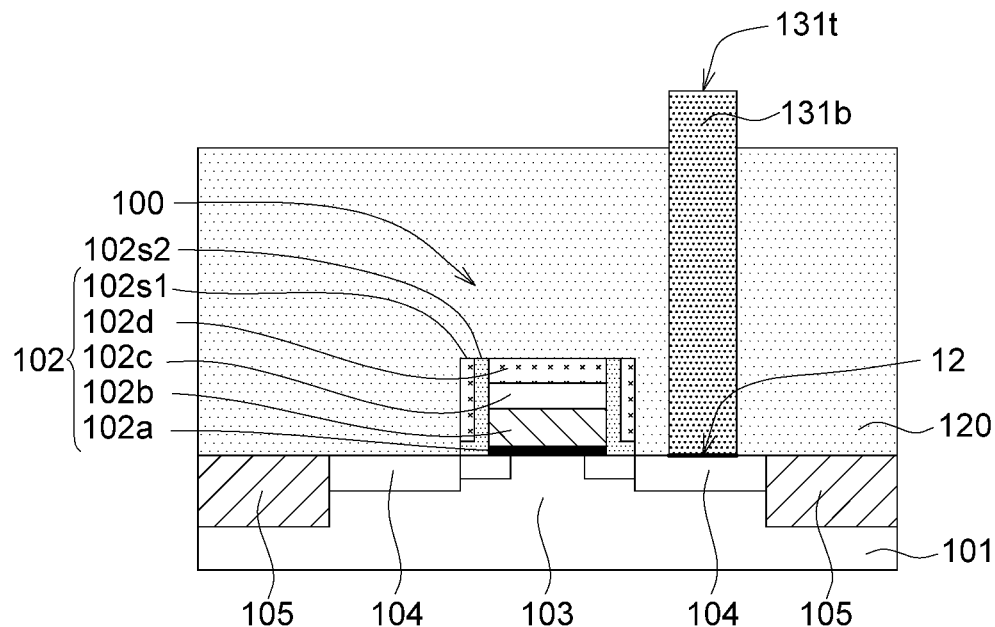
FIG. 1C(2)
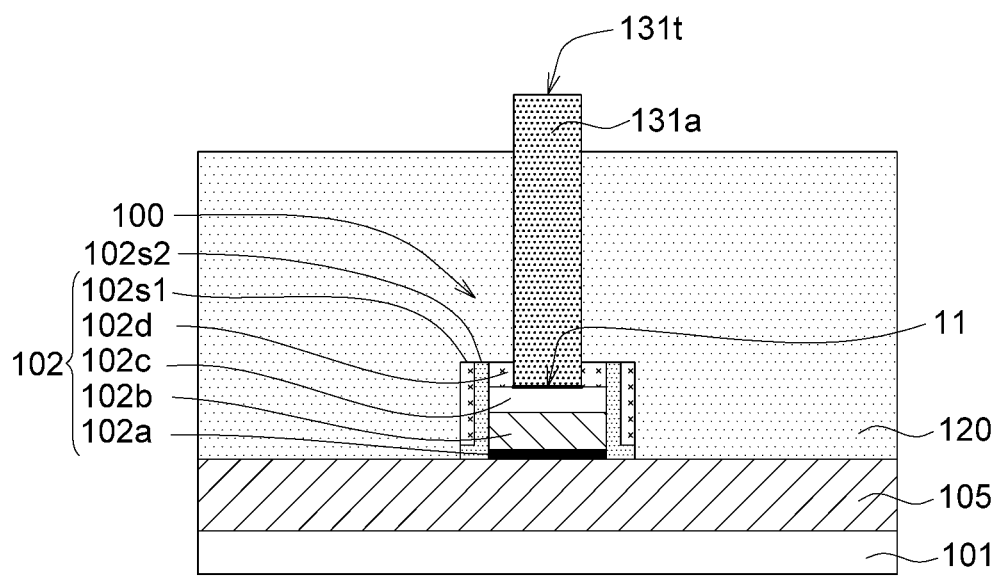
FIG. 1C(3)

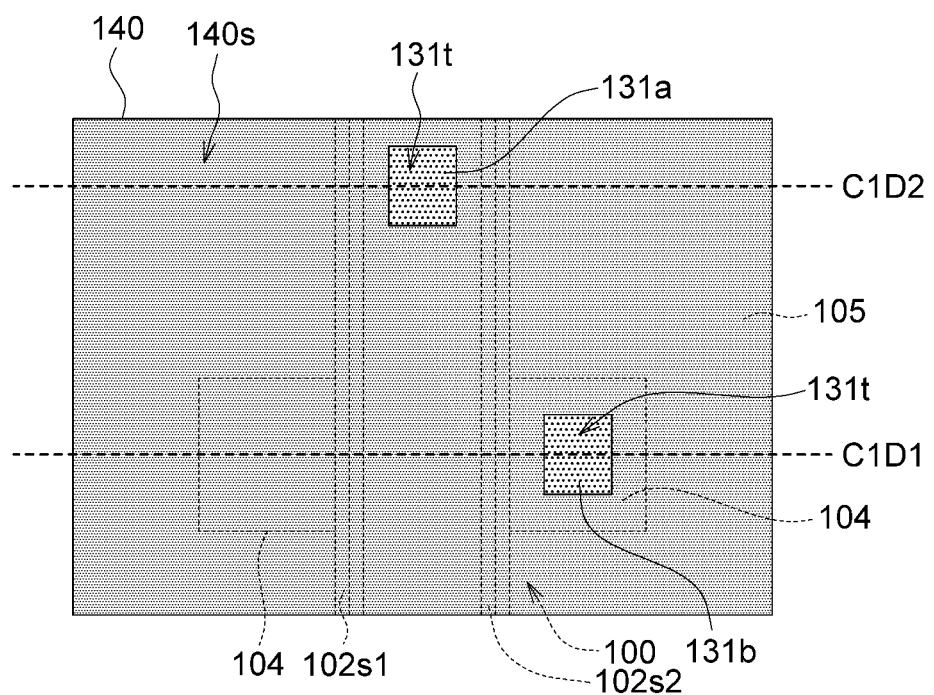
FIG. 1D(1)

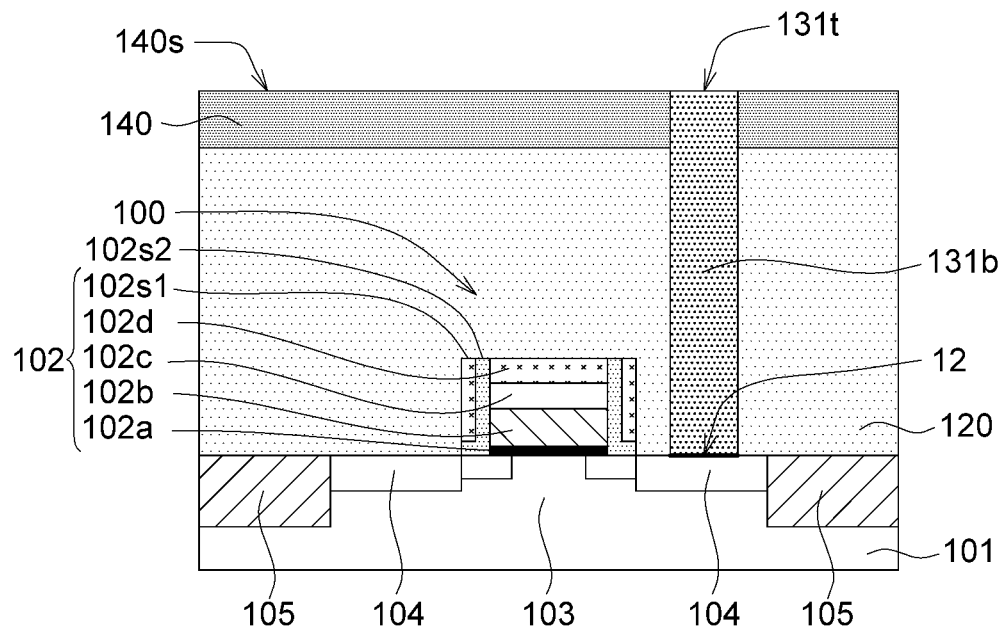
FIG. 1D(2)
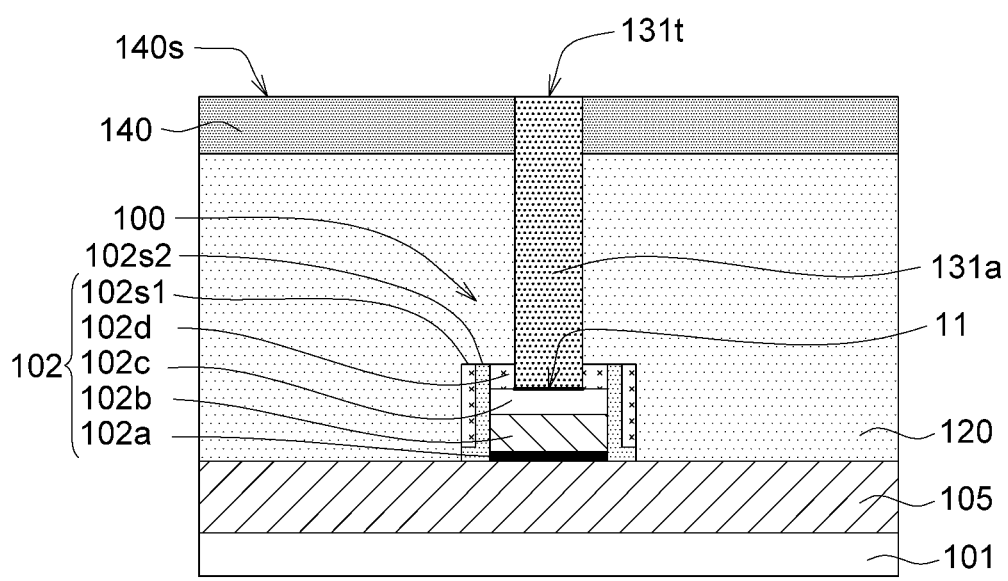
FIG. 1D(3)

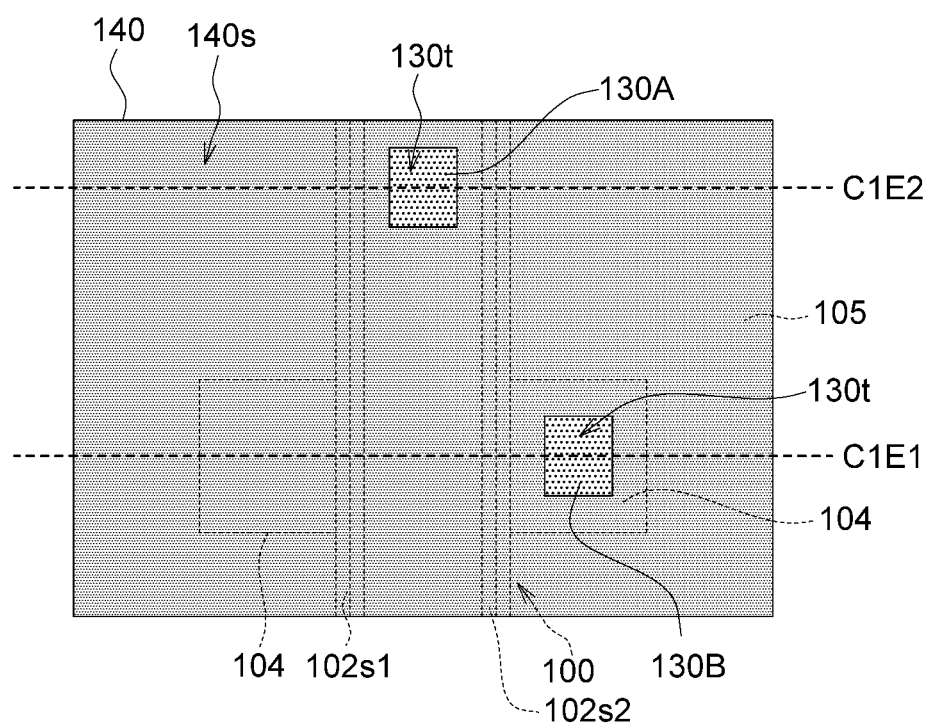
FIG. 1E(1)

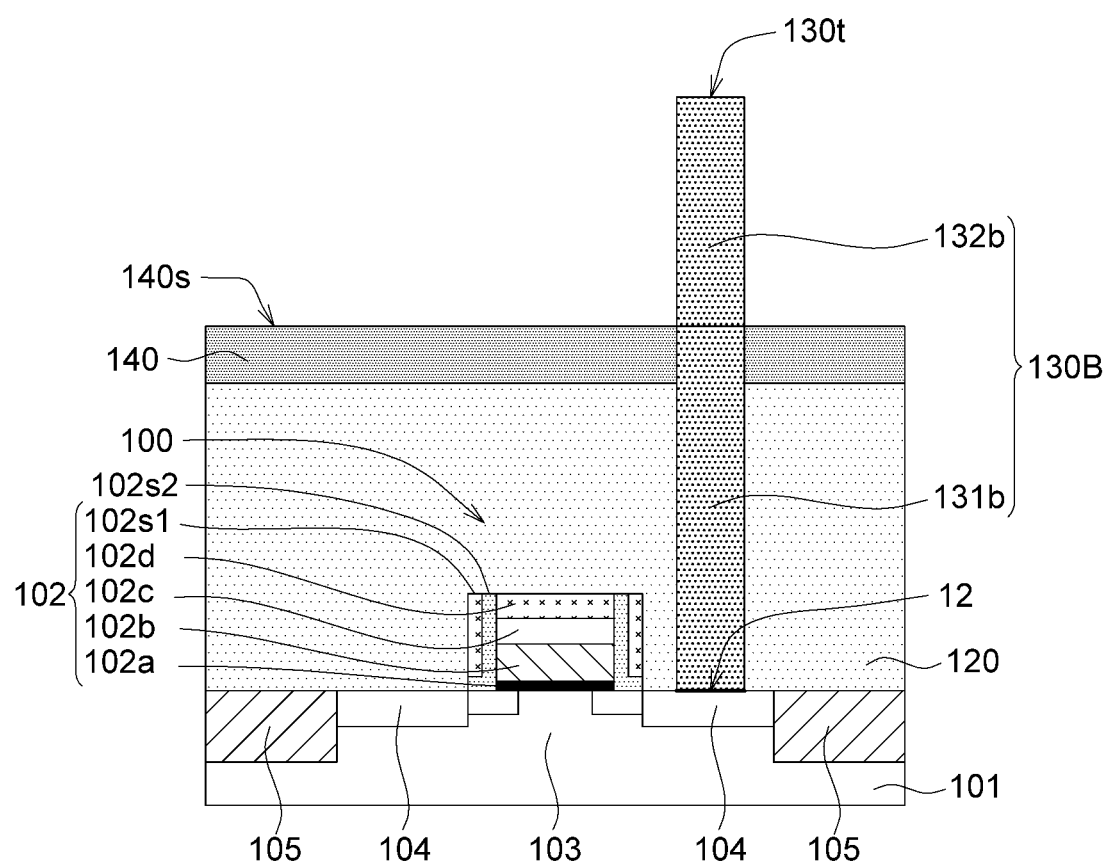
FIG. 1E(2)

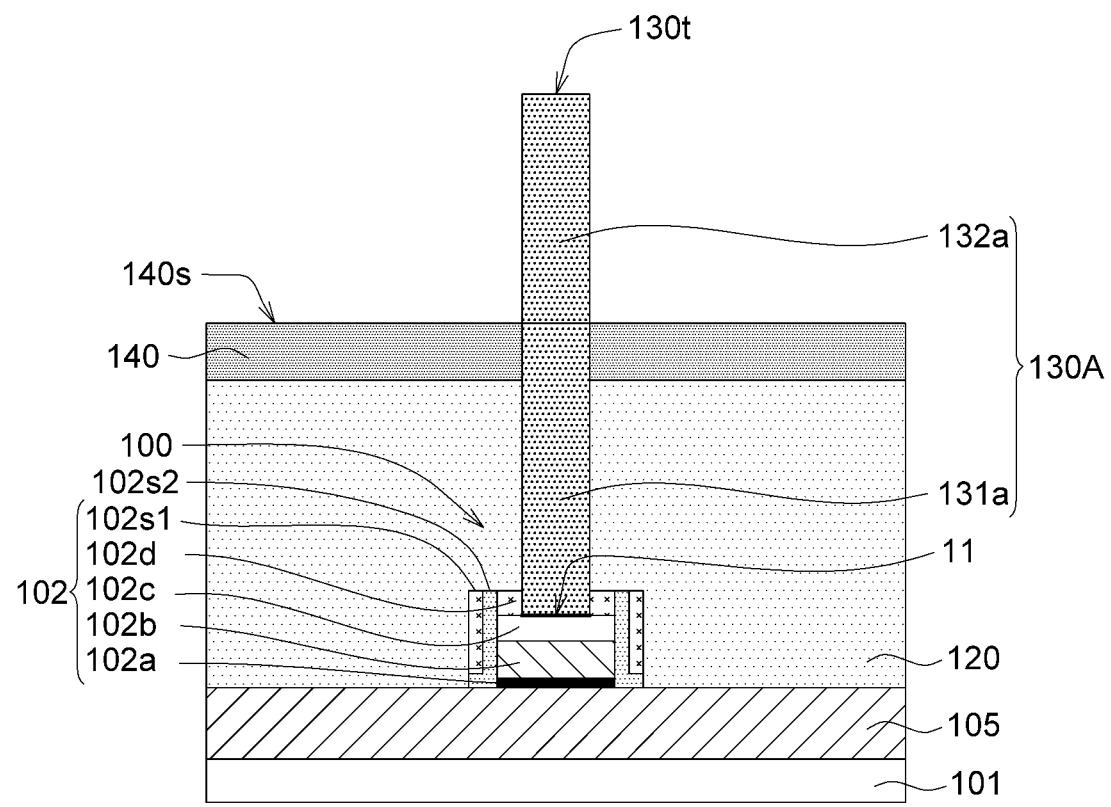
FIG. 1E(3)

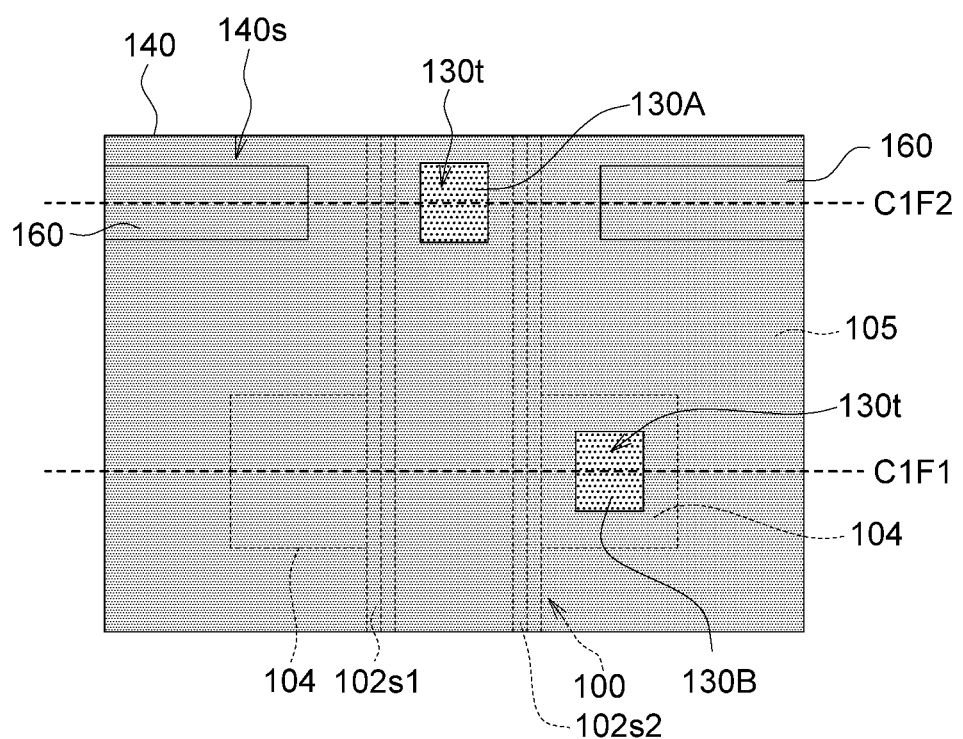
FIG. 1F(1)

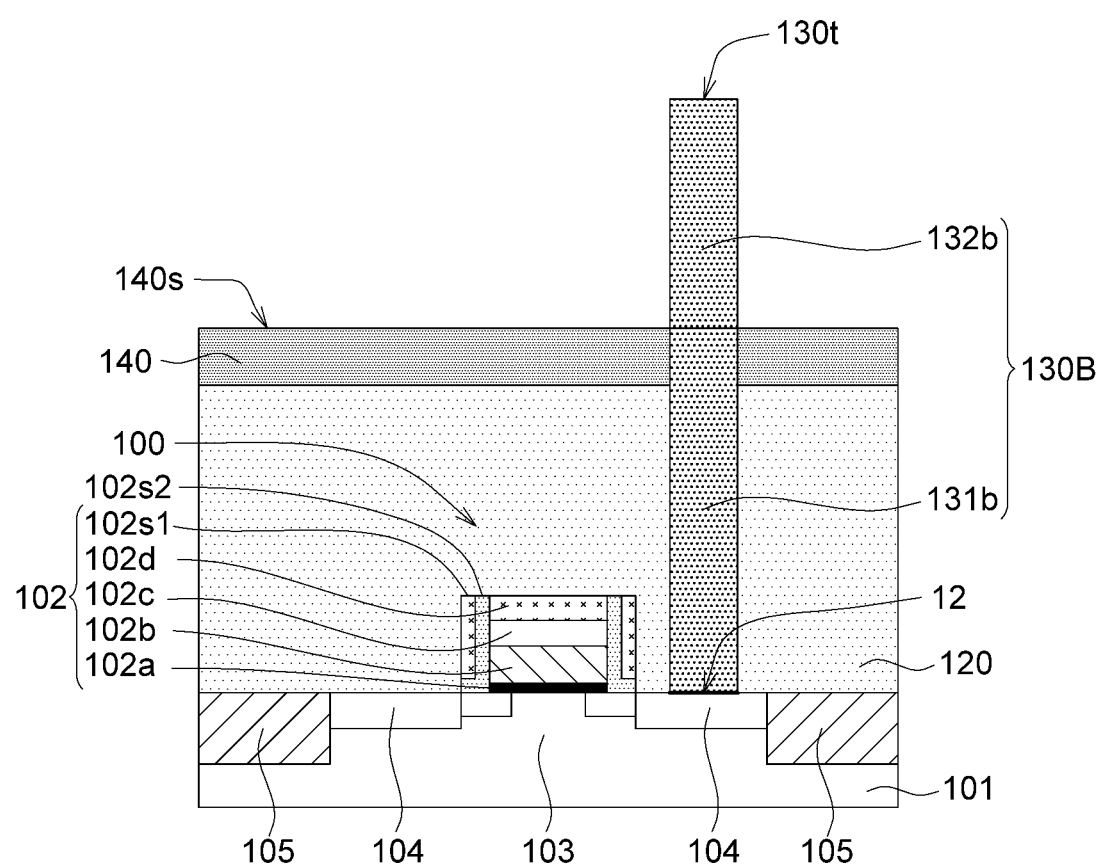
FIG. 1F(2)

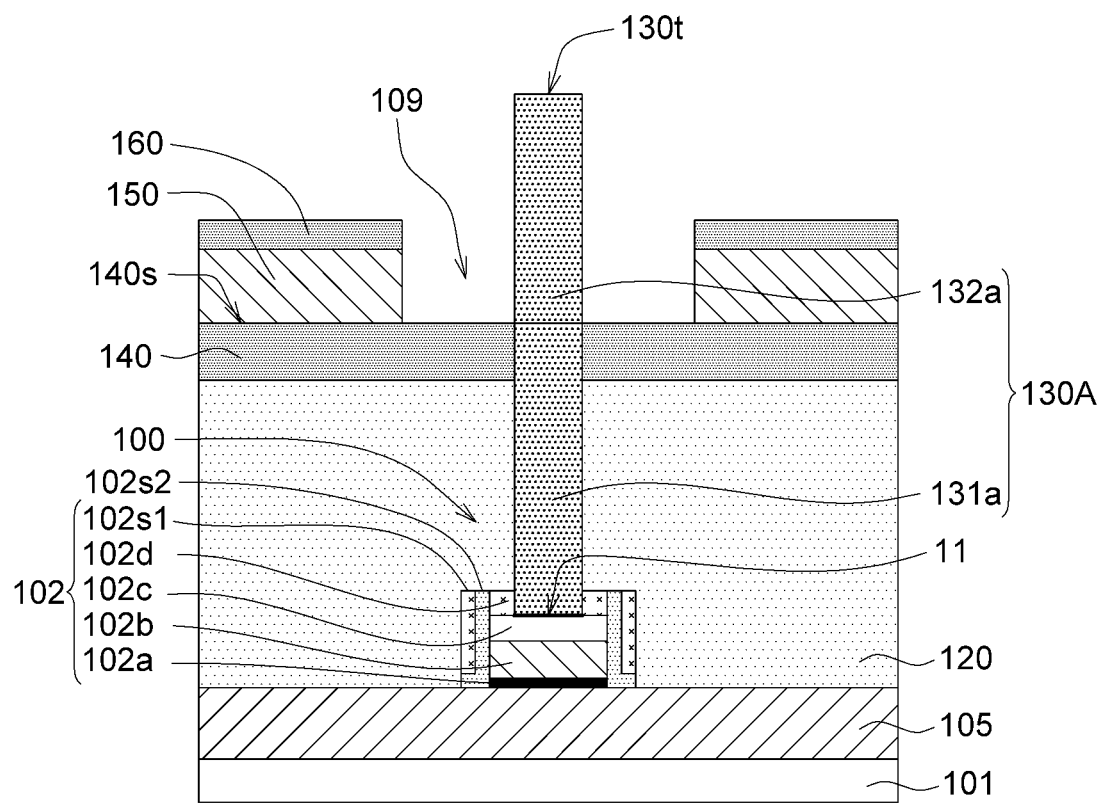
FIG. 1F(3)

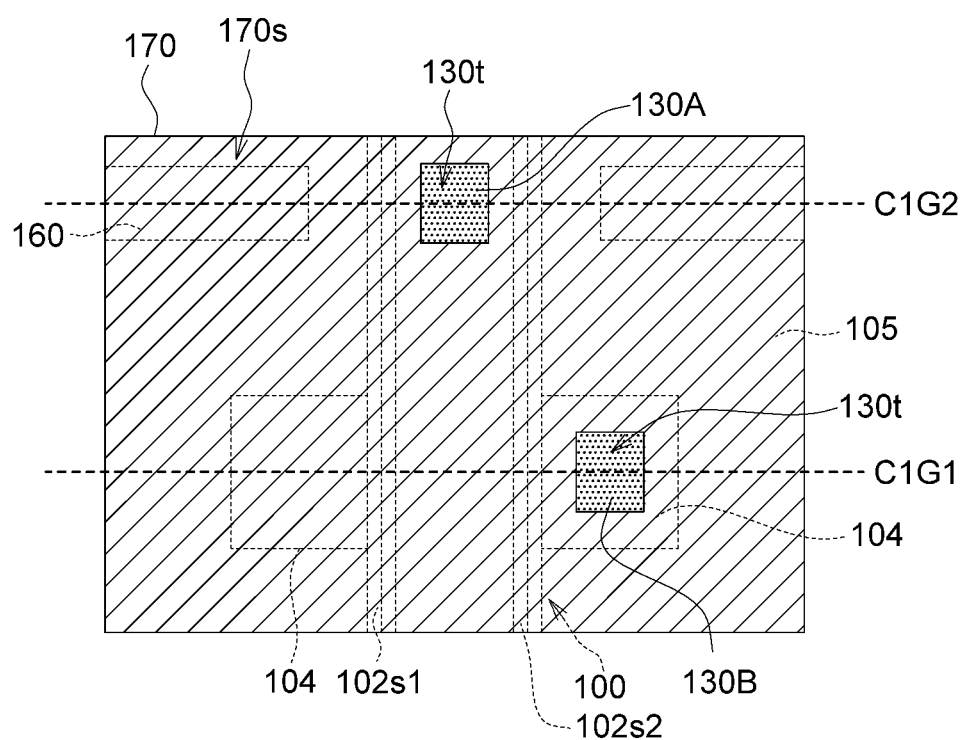
FIG. 1G(1)

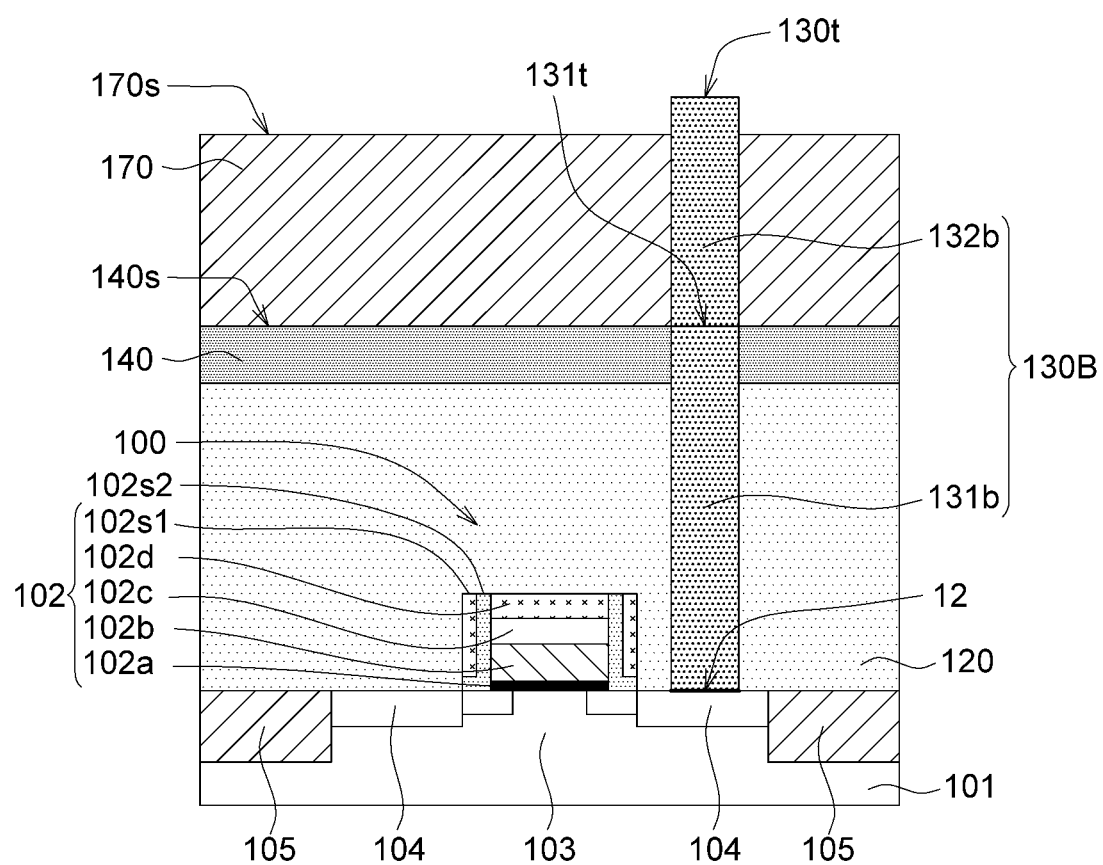
FIG. 1G(2)

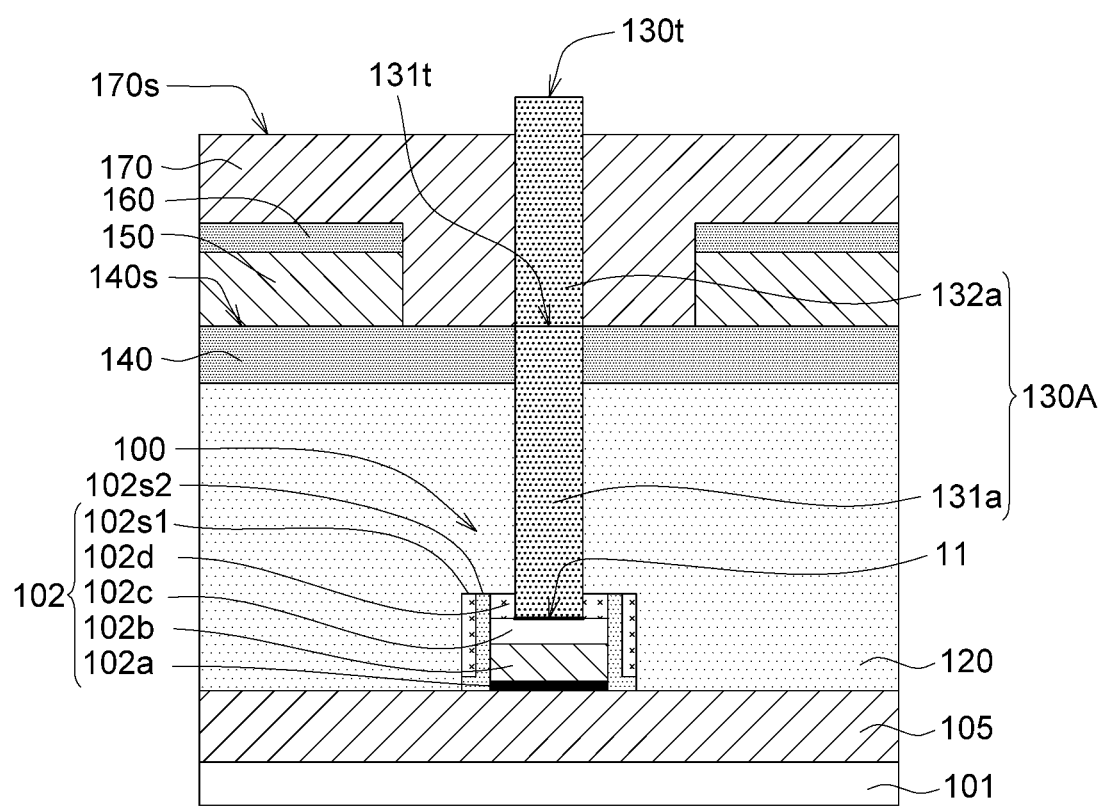
FIG. 1G(3)

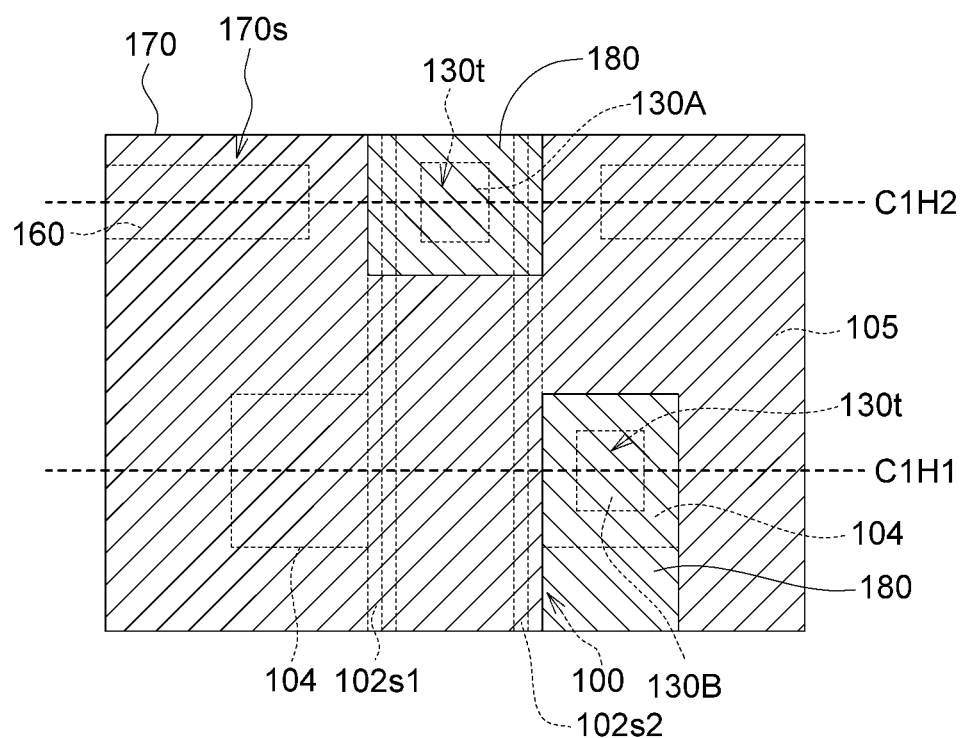
FIG. 1H(1)

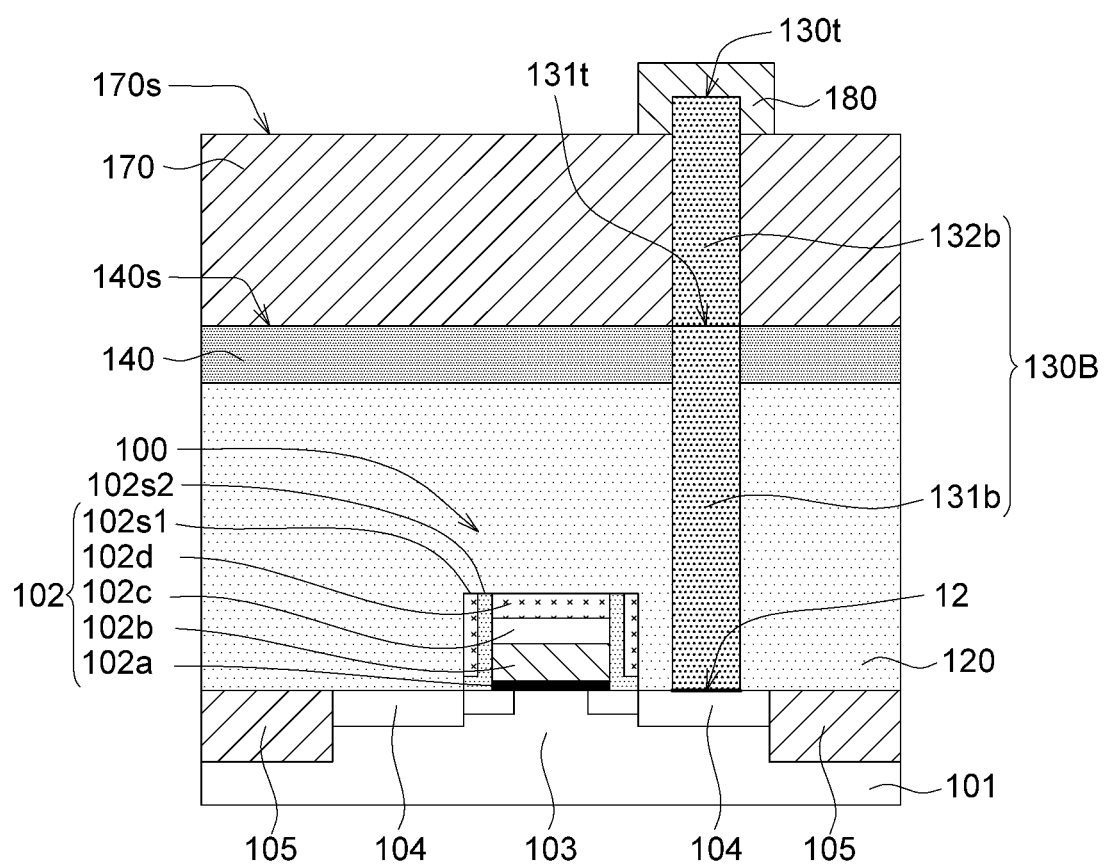
FIG. 1H(2)

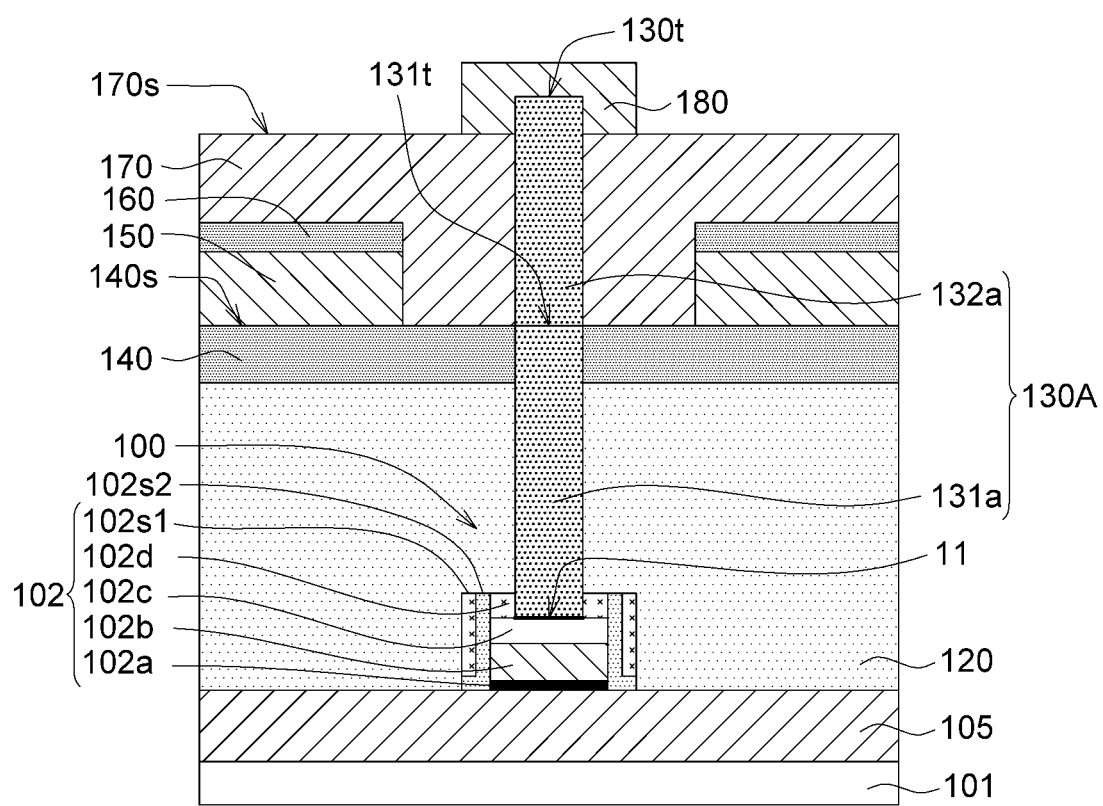
FIG. 1H(3)

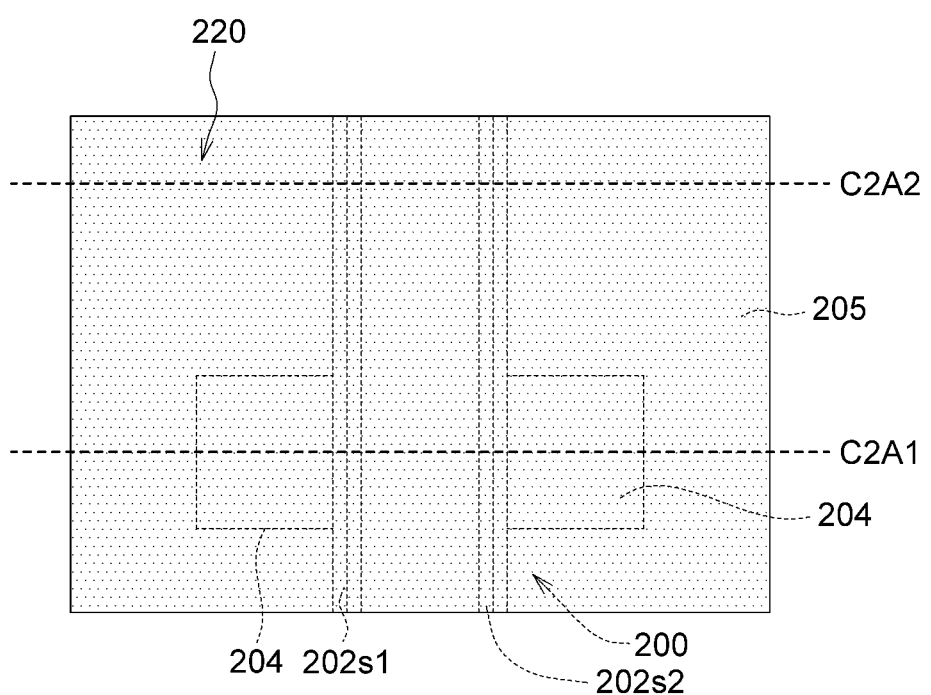
FIG. 2A(1)

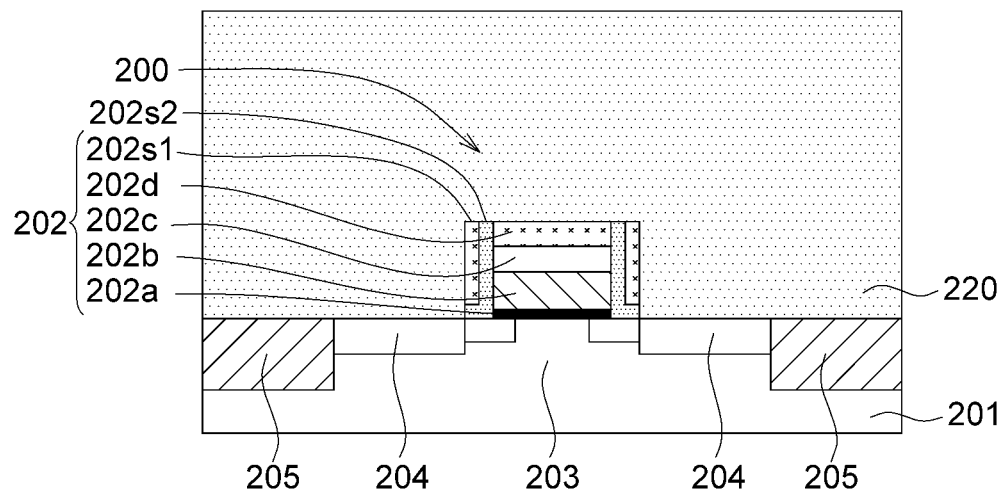
FIG. 2A(2)
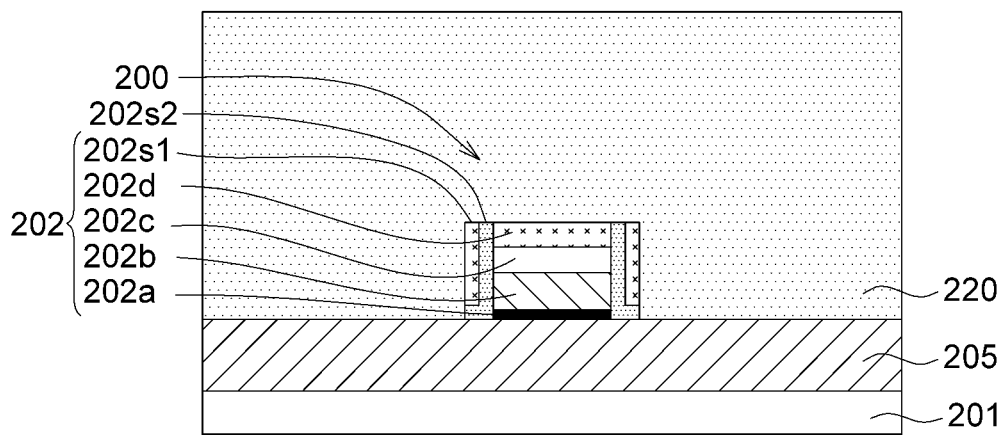
FIG. 2A(3)

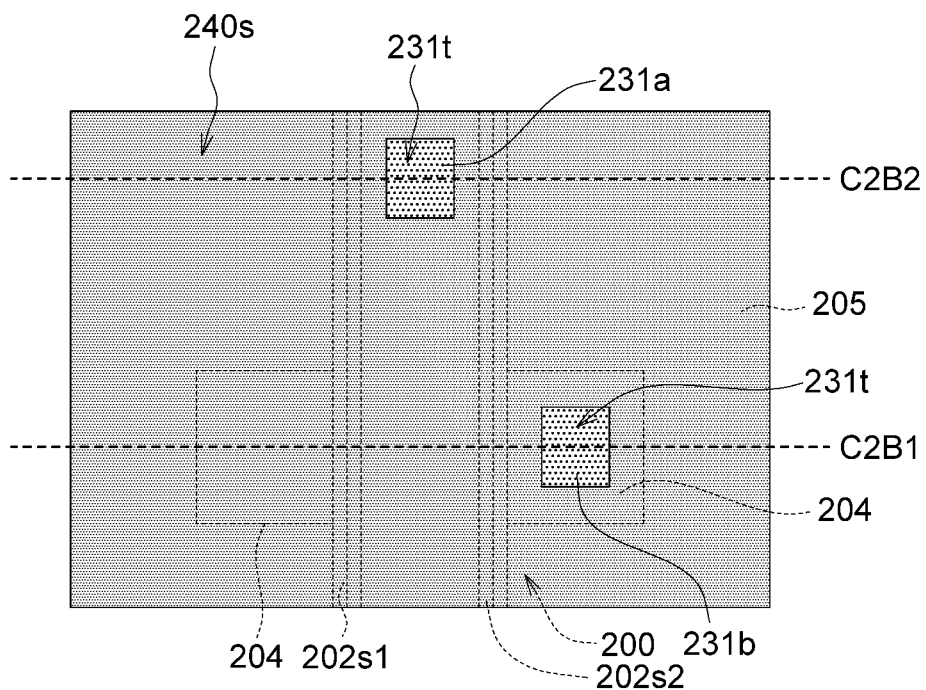
FIG. 2B(1)

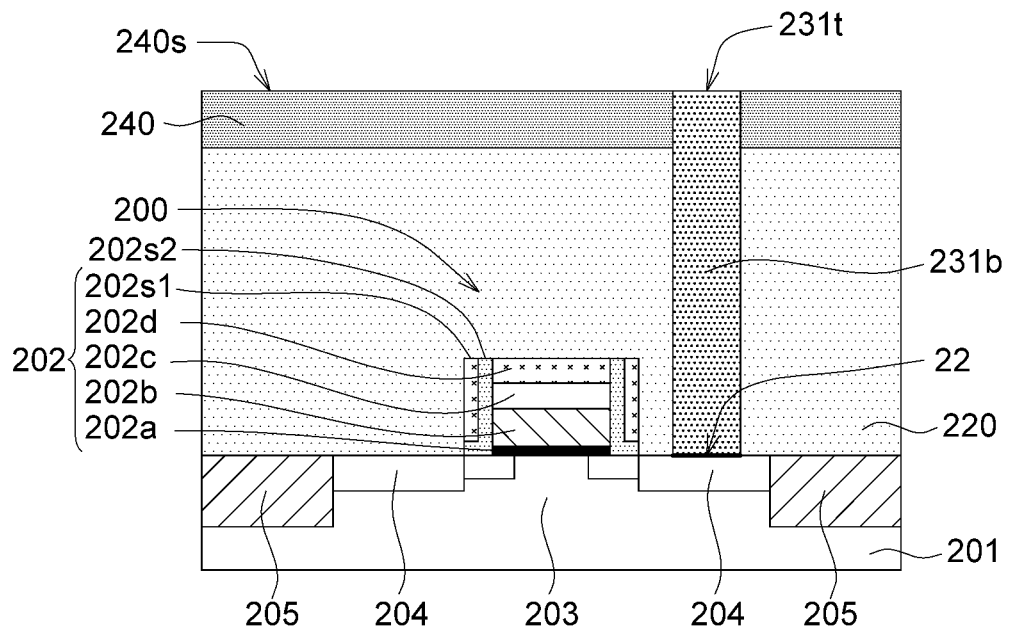
FIG. 2B(2)
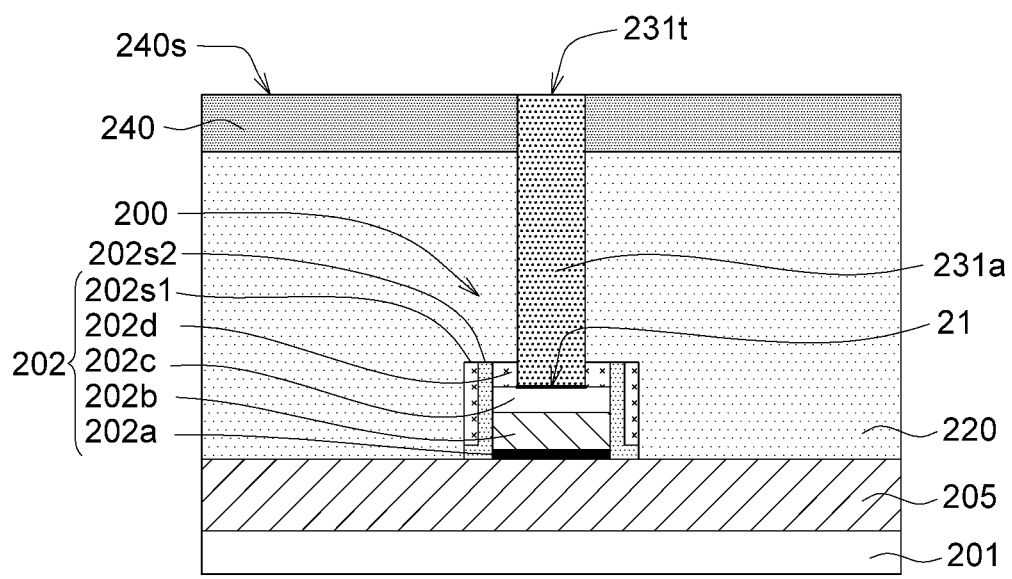
FIG. 2B(3)

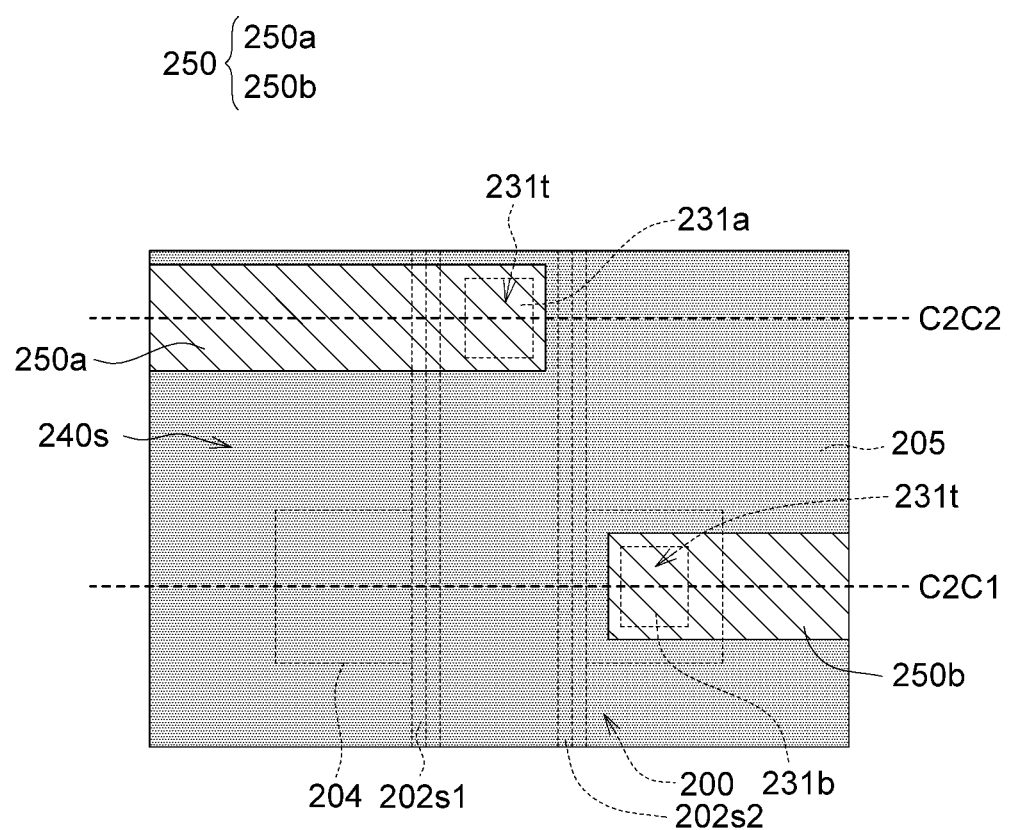
FIG. 2C(1)

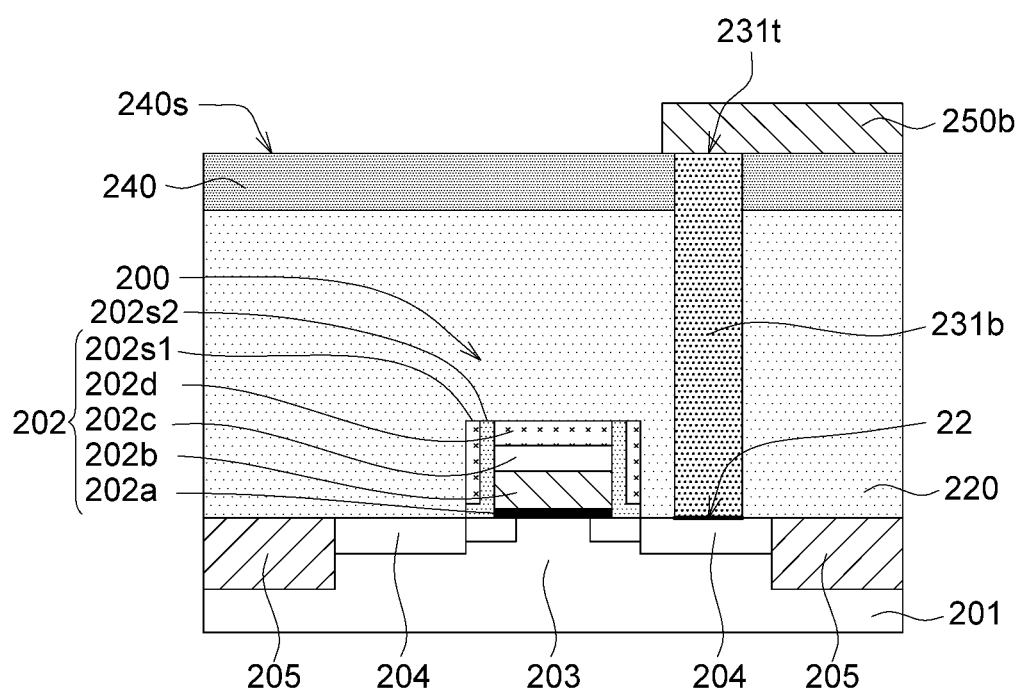
FIG. 2C(2)

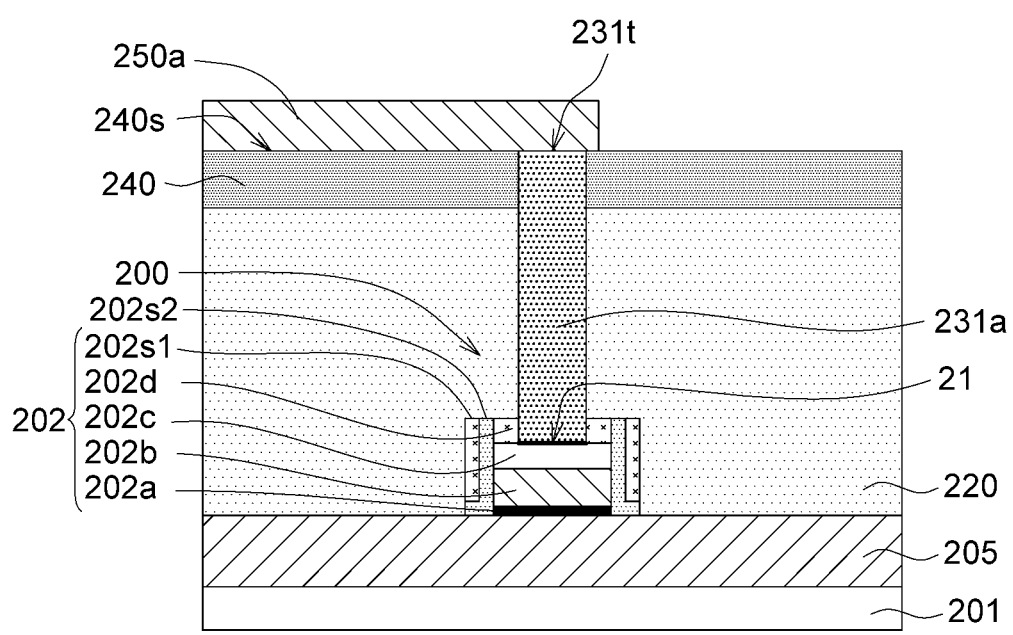
FIG. 2C(3)

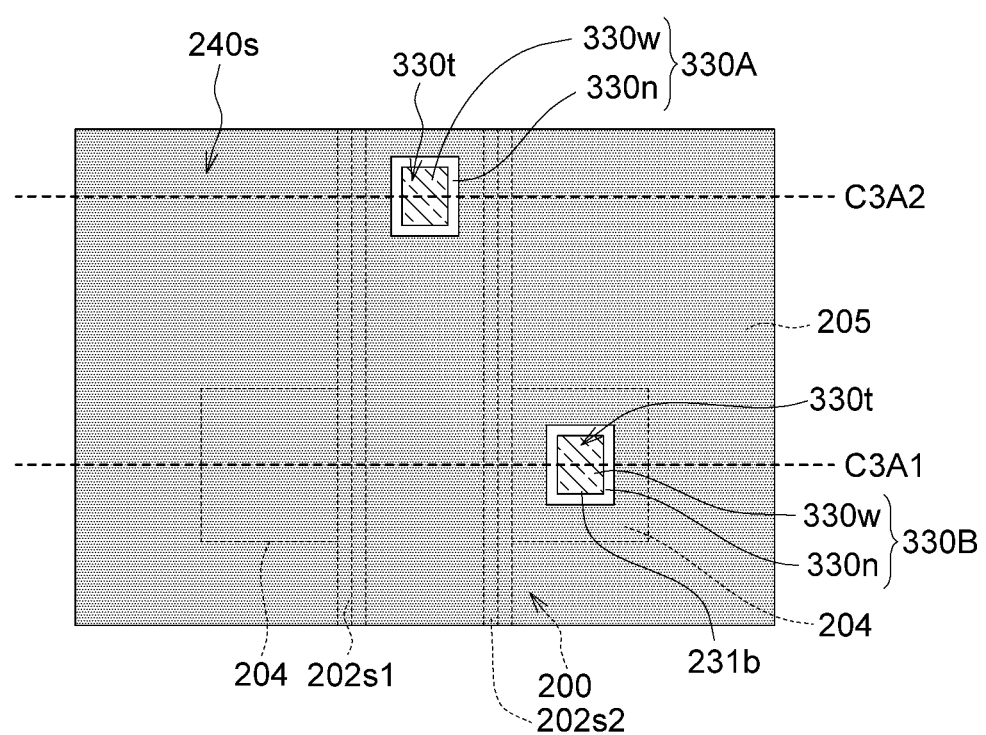
FIG. 3A(1)

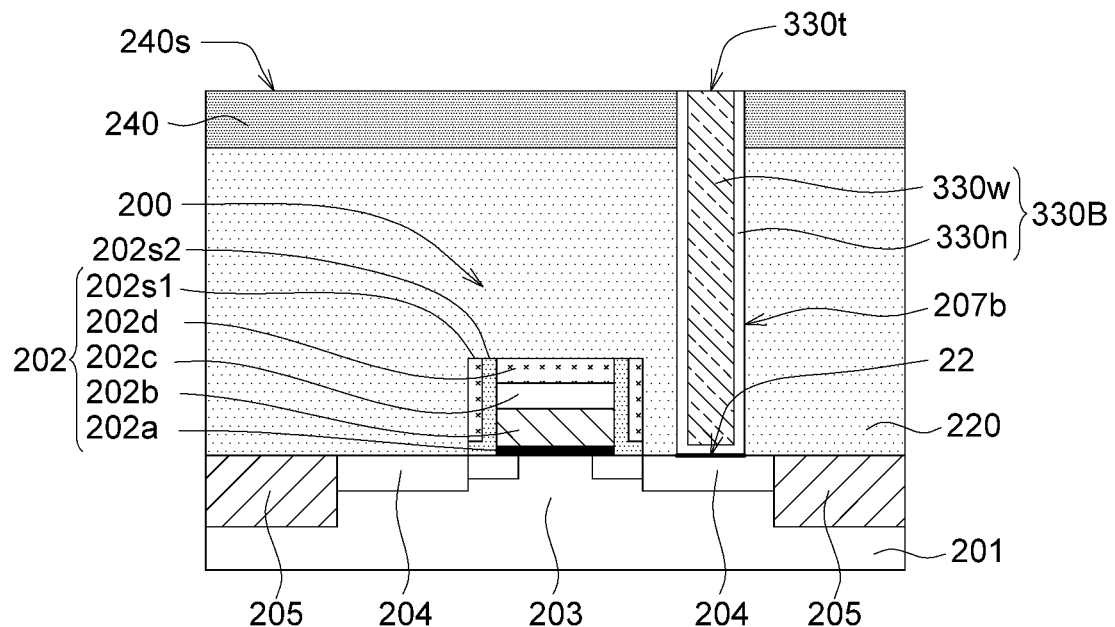
FIG. 3A(2)
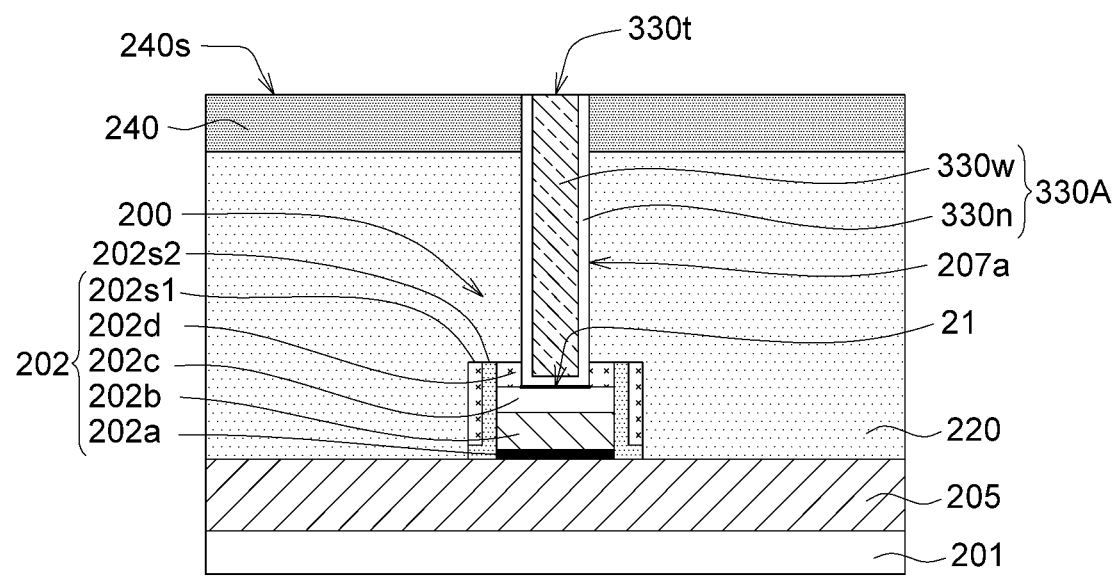
FIG. 3A(3)

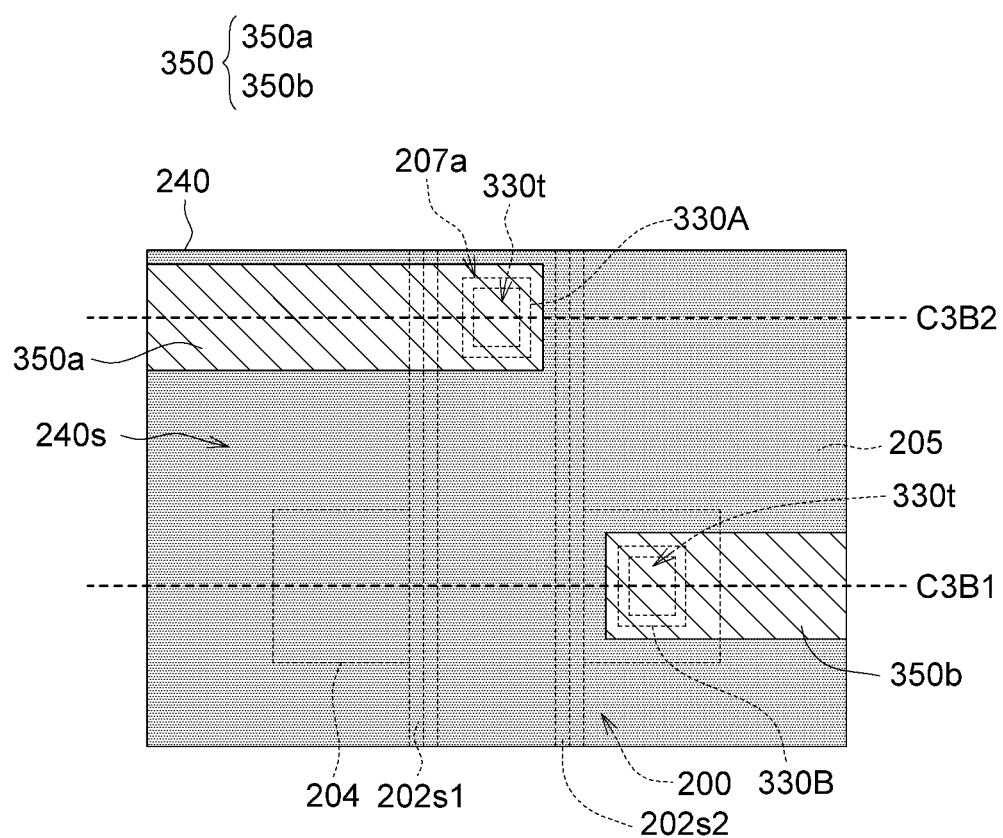
FIG. 3B(1)

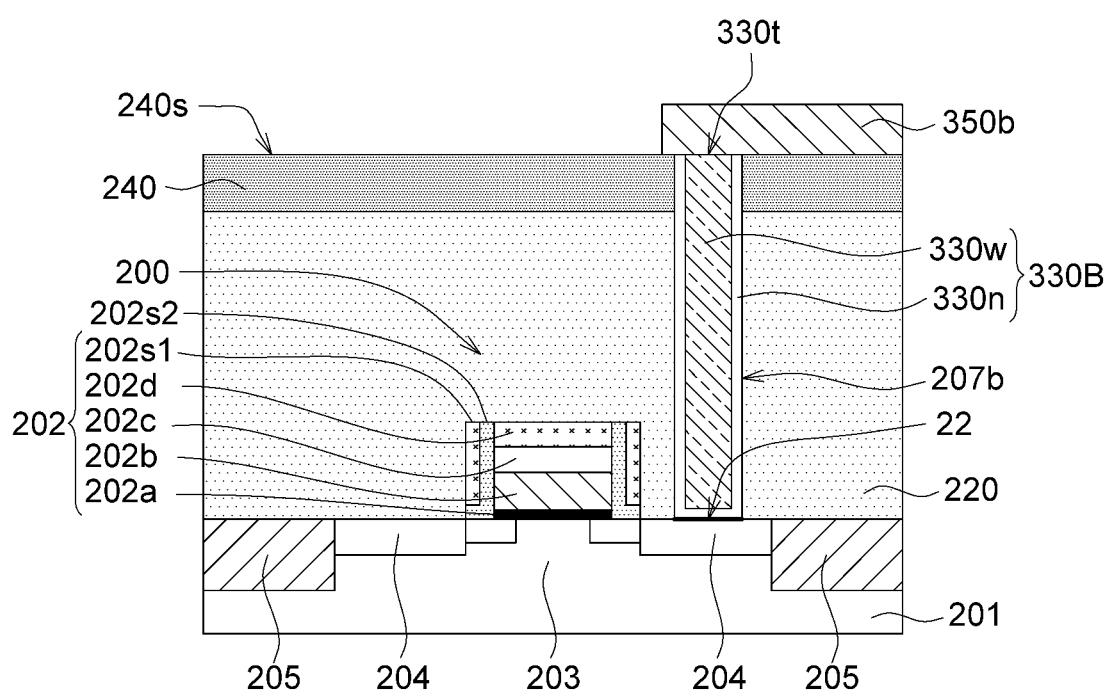
FIG. 3B(2)

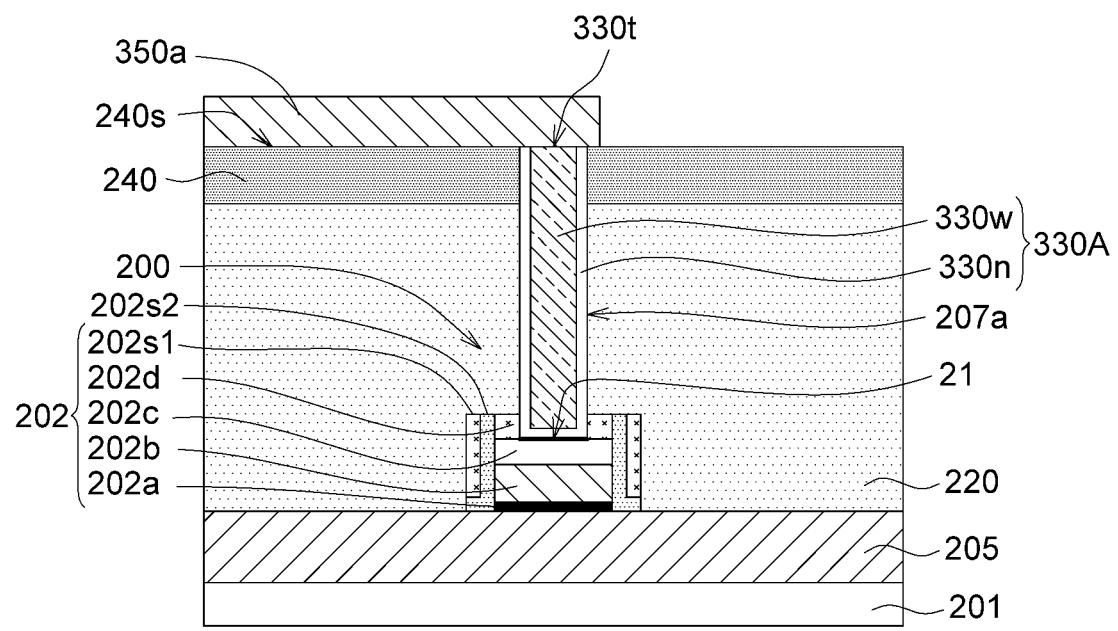
FIG. 3B(3)

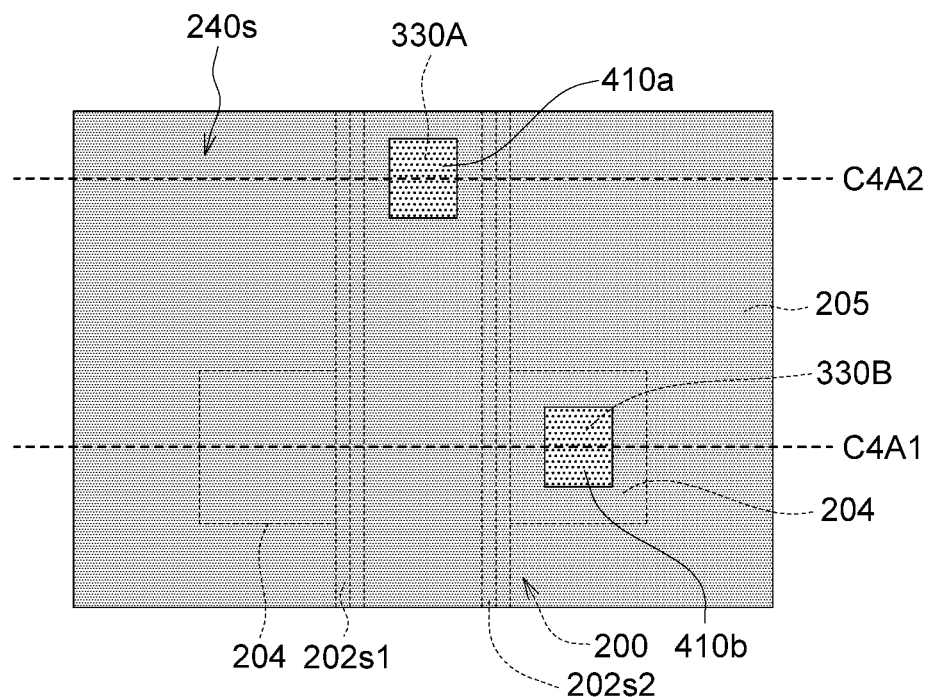
FIG. 4A(1)

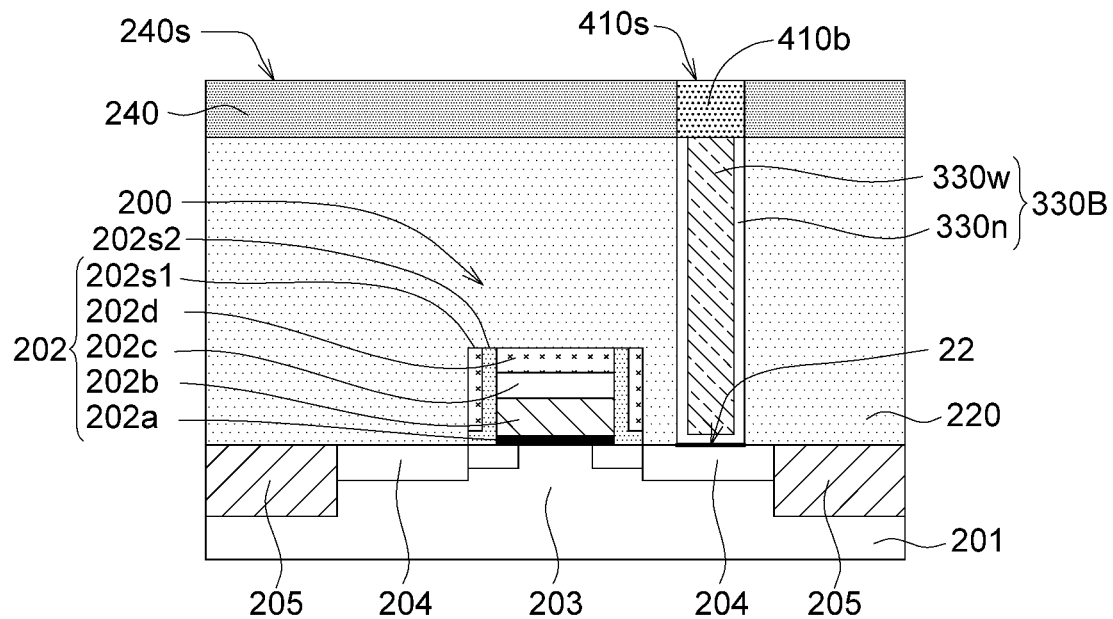
FIG. 4A(2)
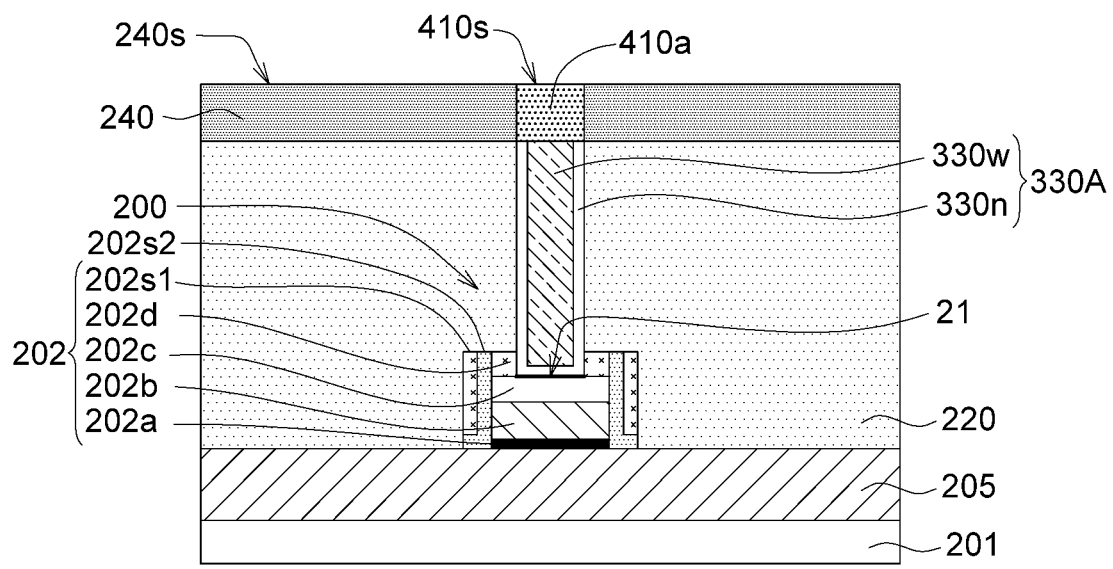
FIG. 4A(3)

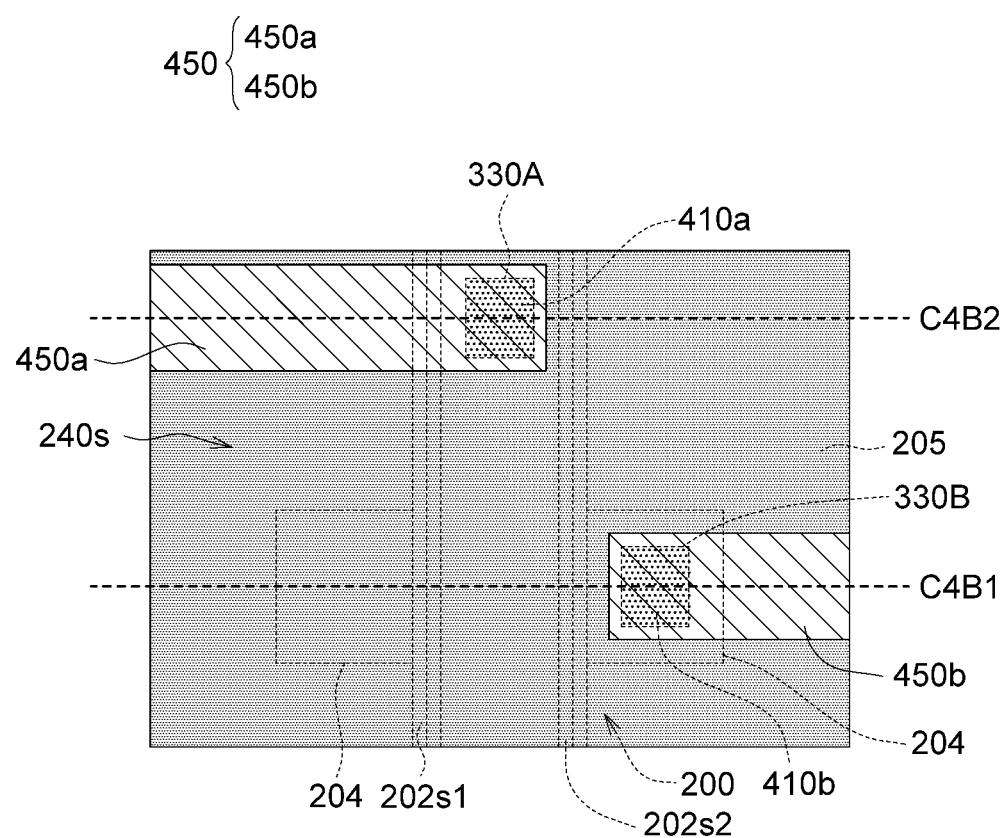
FIG. 4B(1)

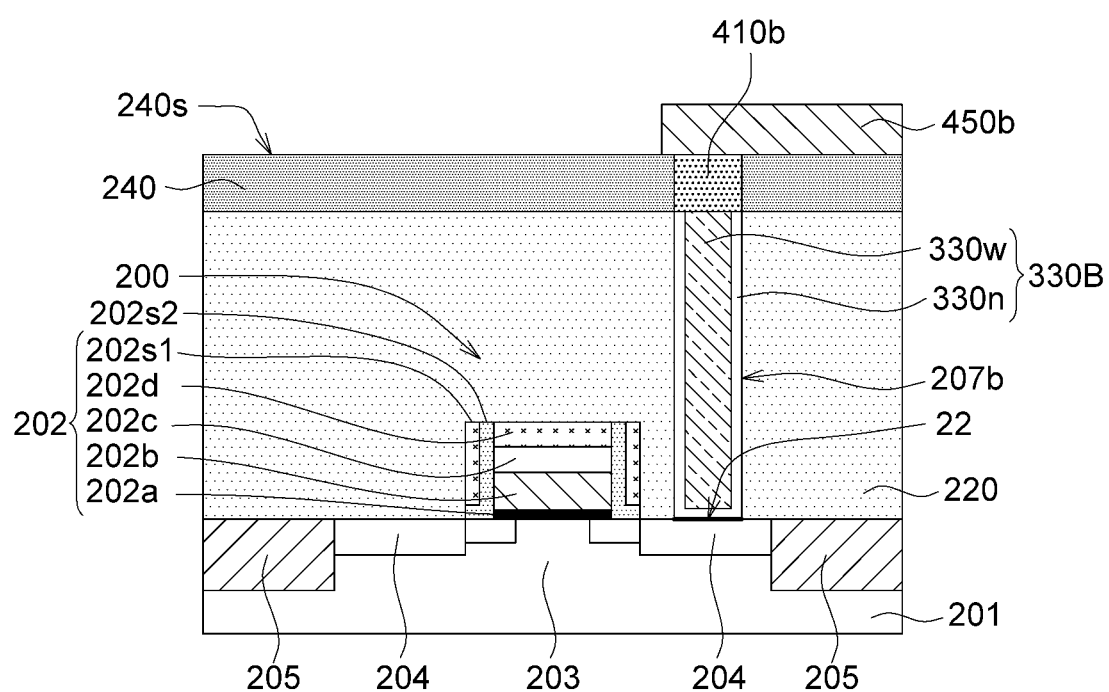
FIG. 4B(2)

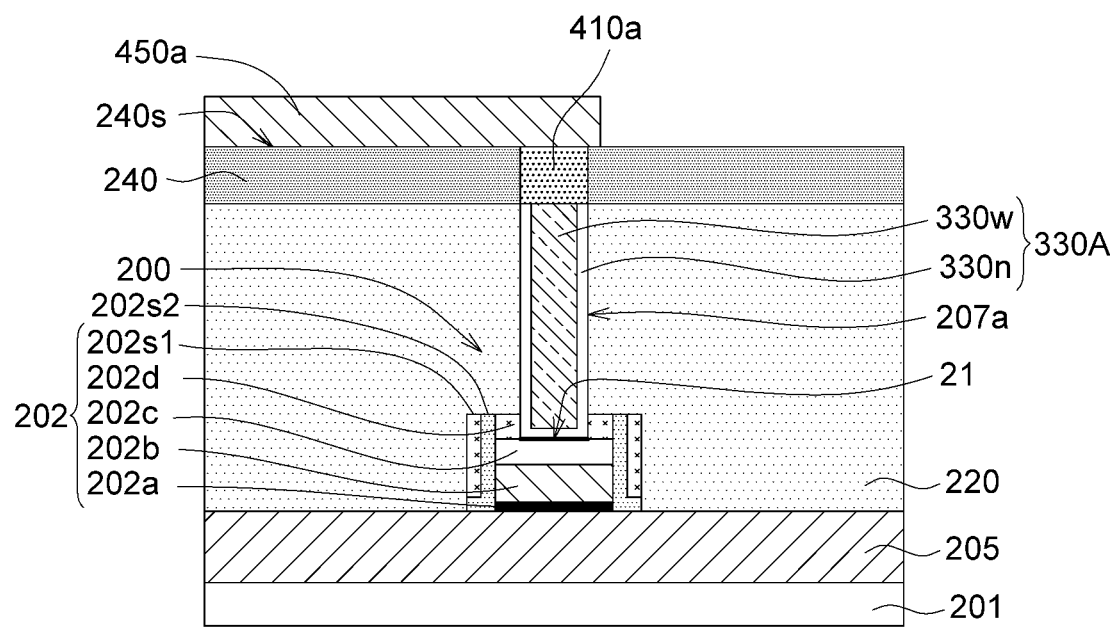
FIG. 4B(3)

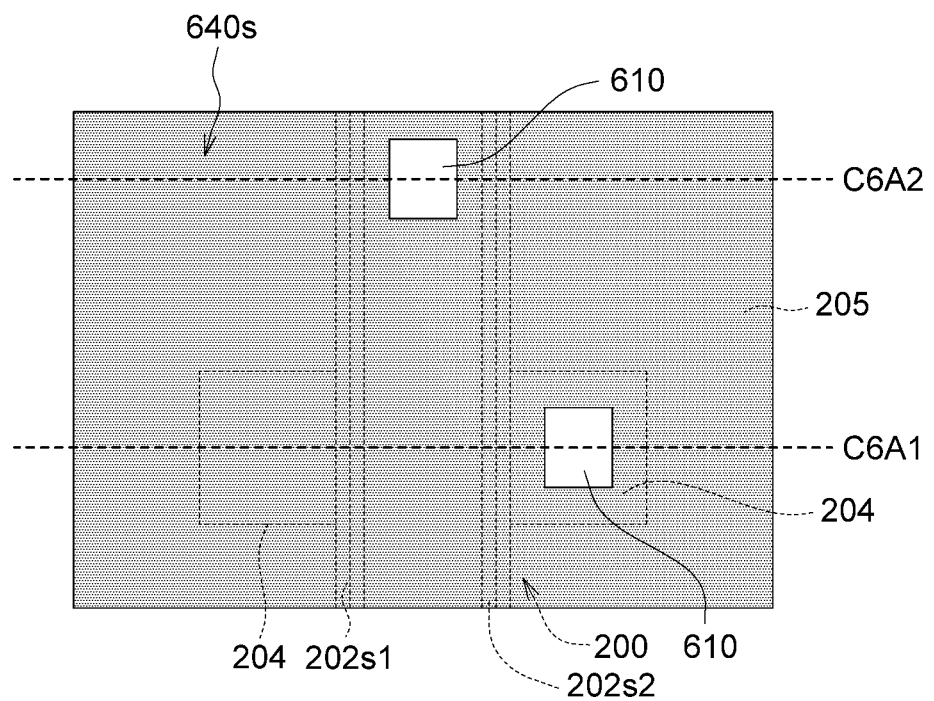
FIG. 6A(1)

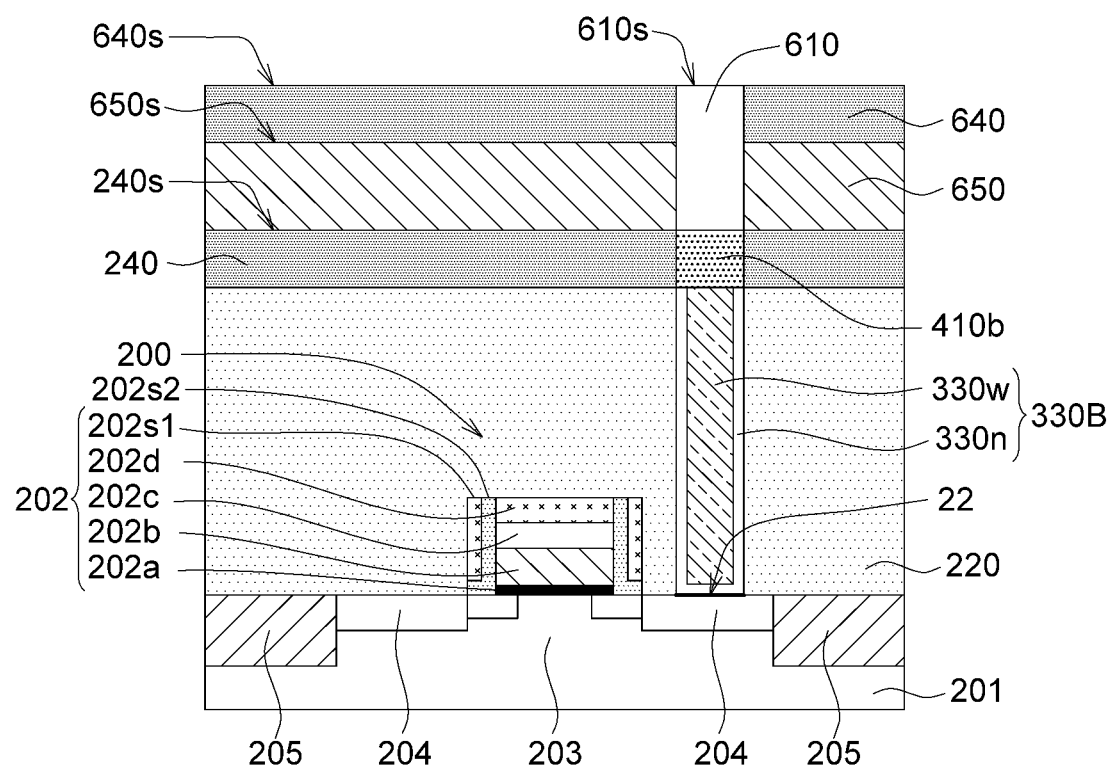
FIG. 6A(2)

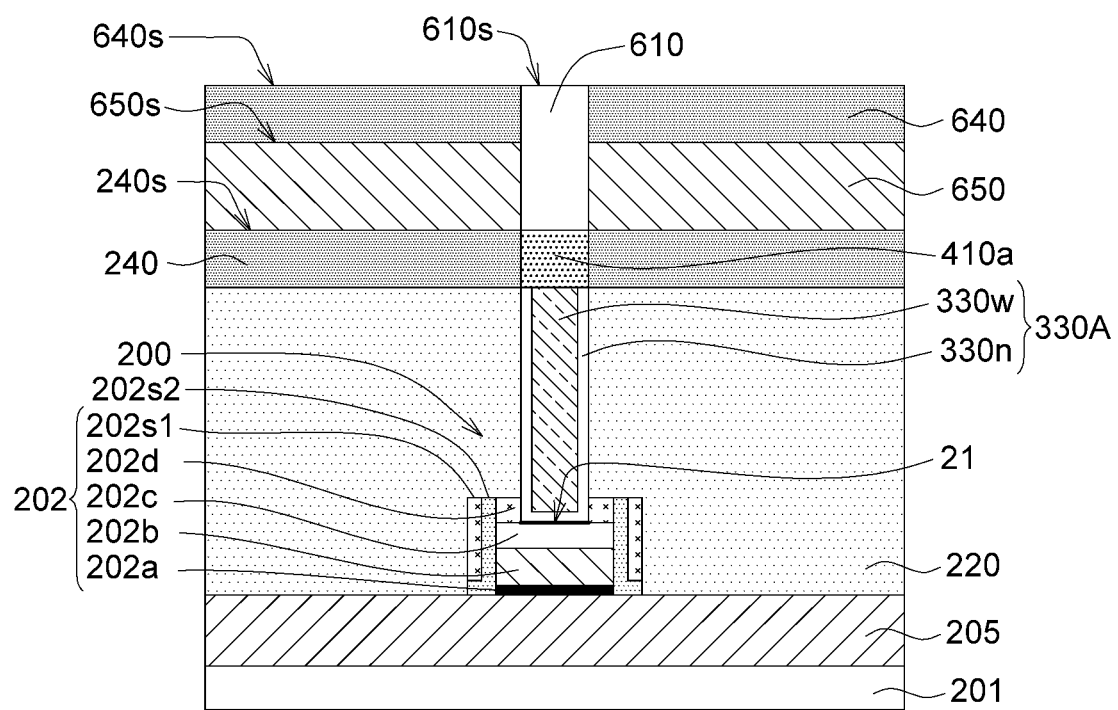
FIG. 6A(3)

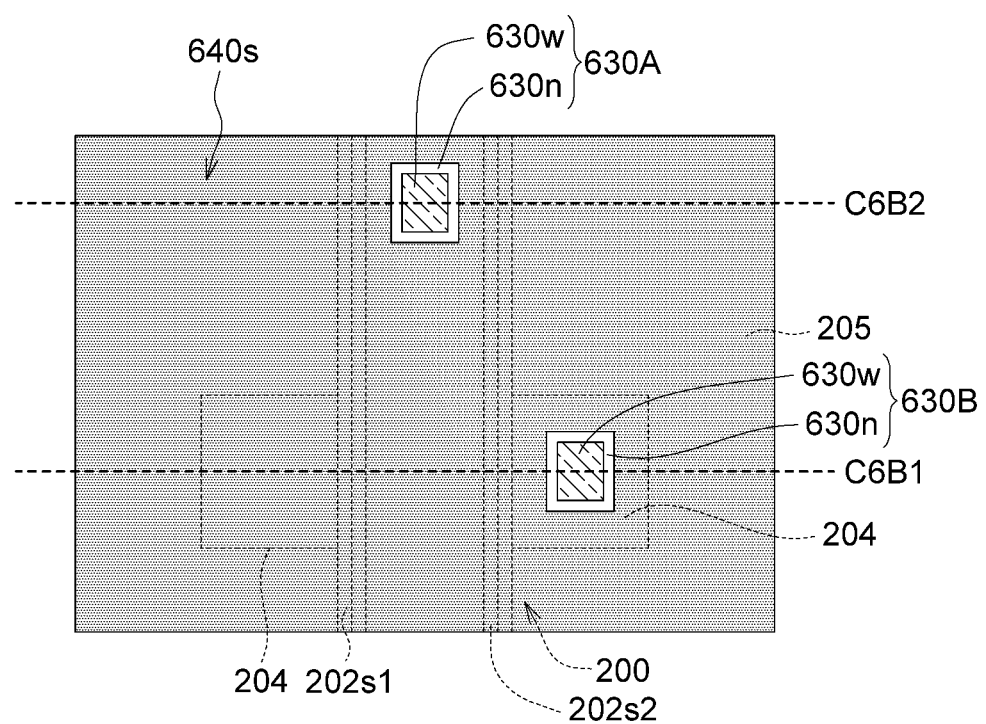
FIG. 6B(1)

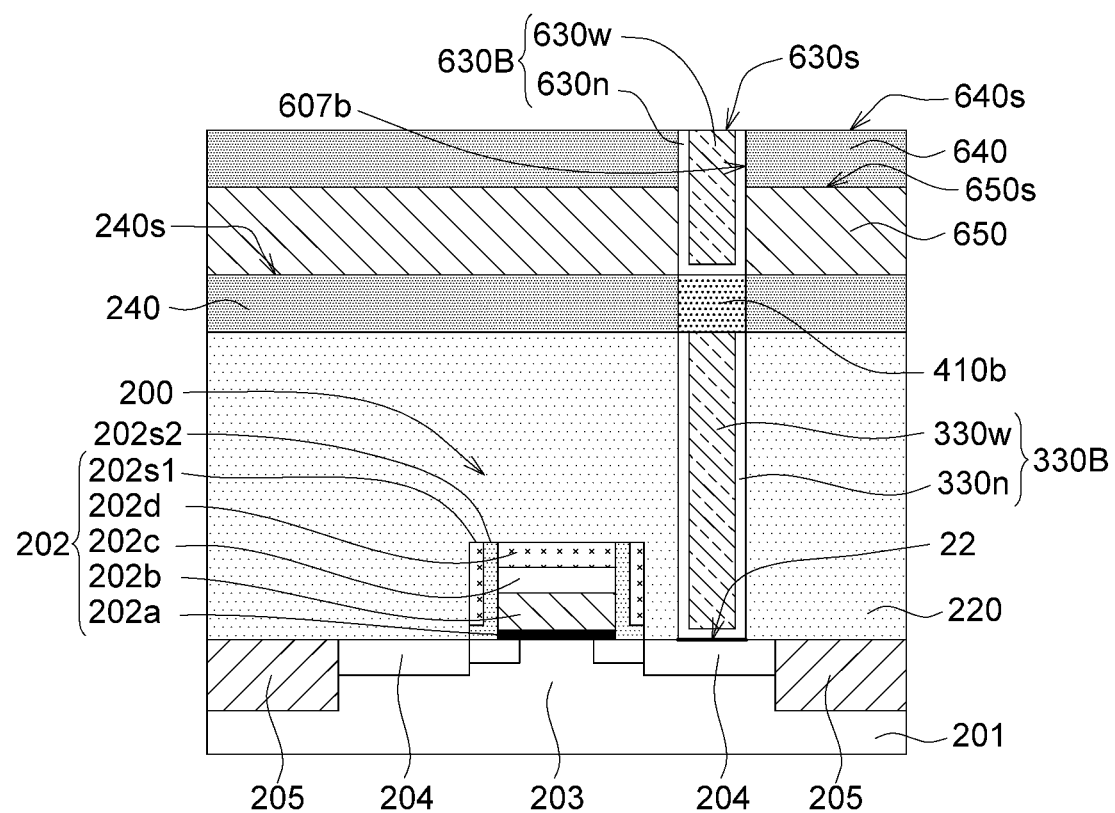
FIG. 6B(2)

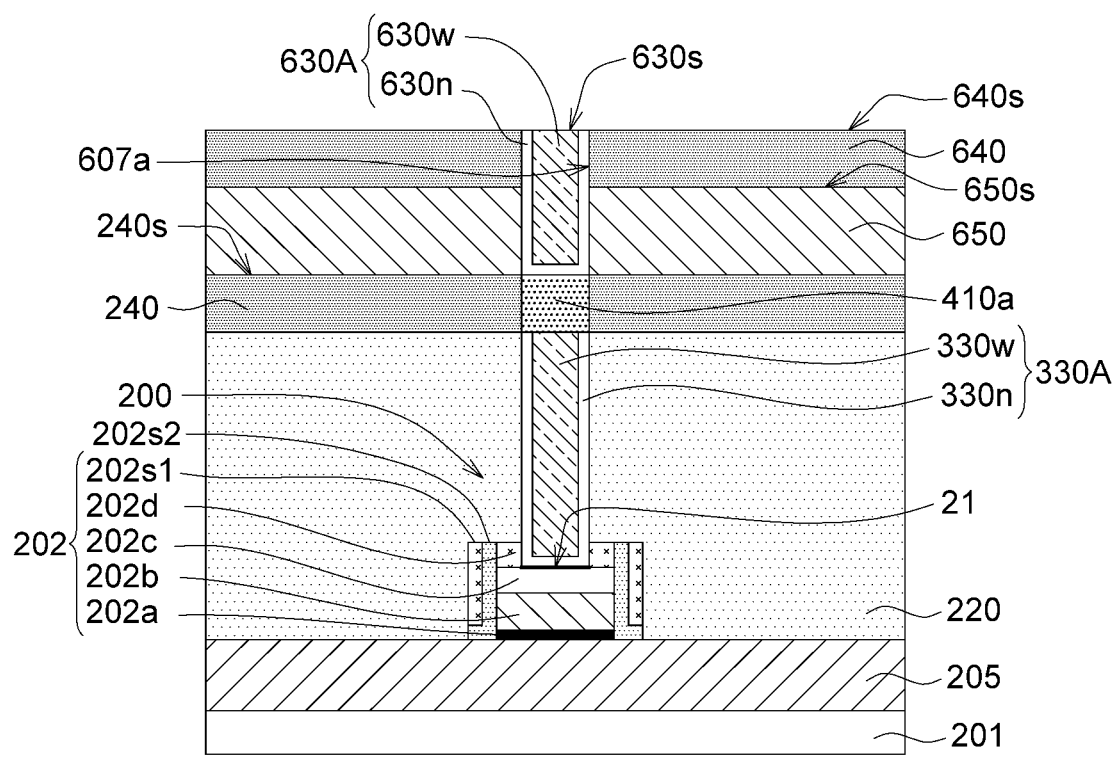
FIG. 6B(3)

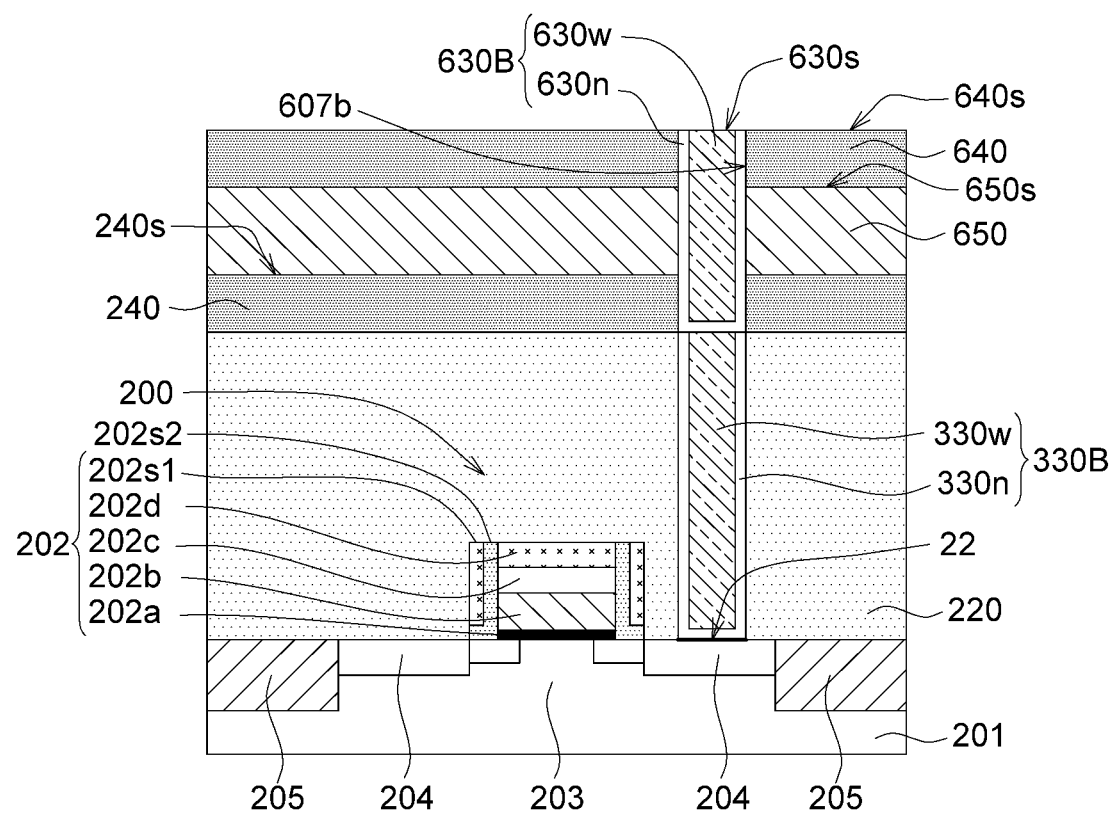
FIG. 6B(4)

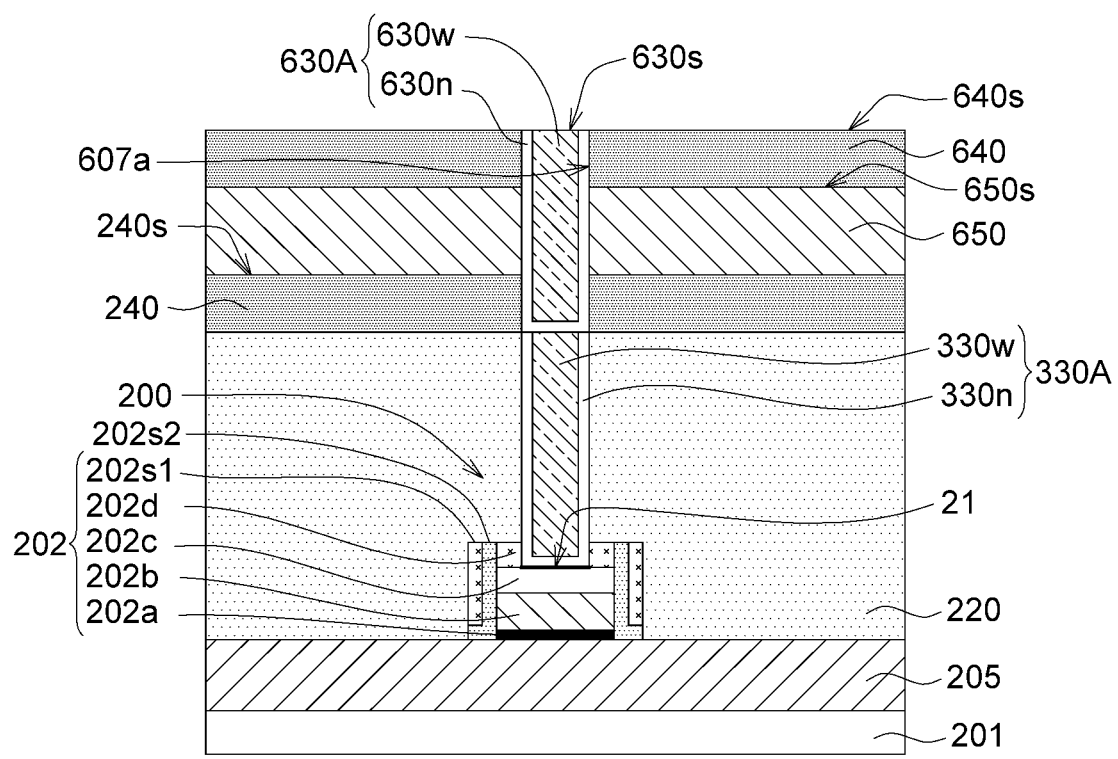
FIG. 6B(5)

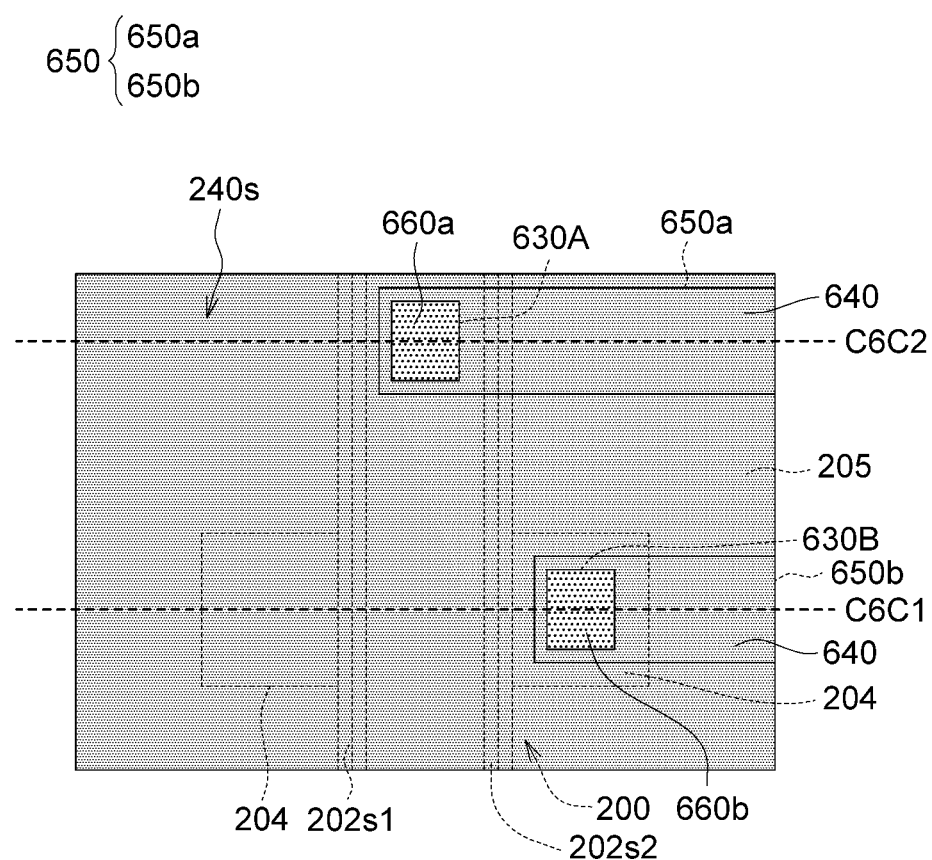
FIG. 6C(1)

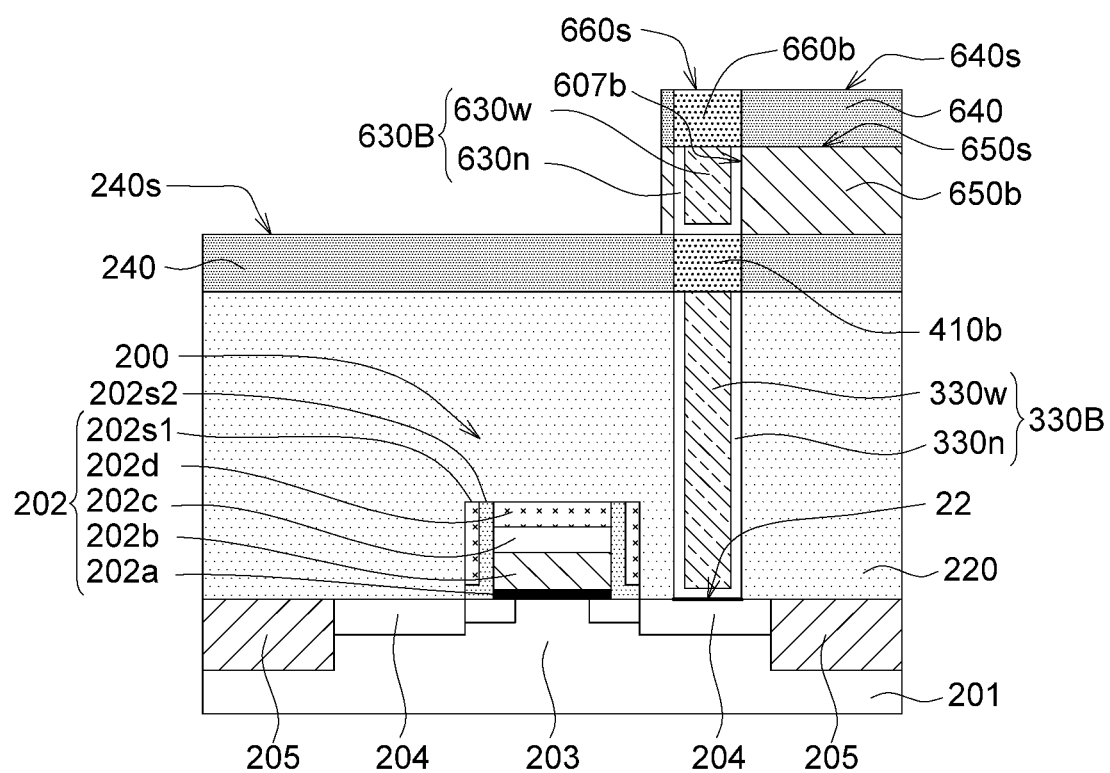
FIG. 6C(2)

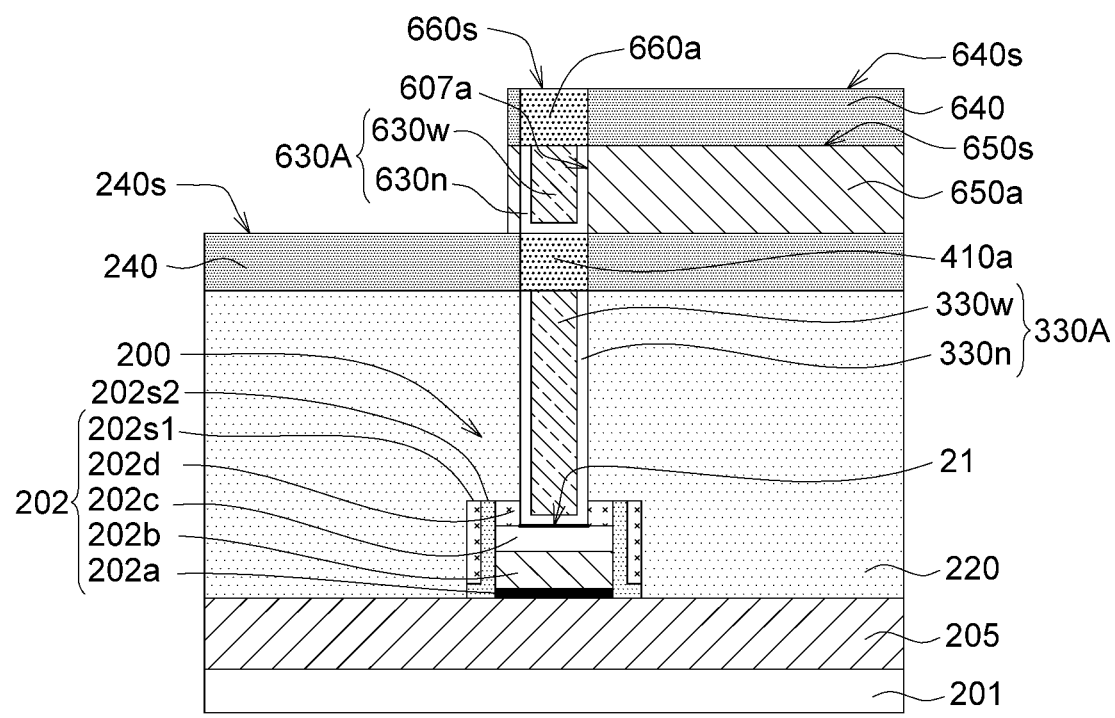
FIG. 6C(3)

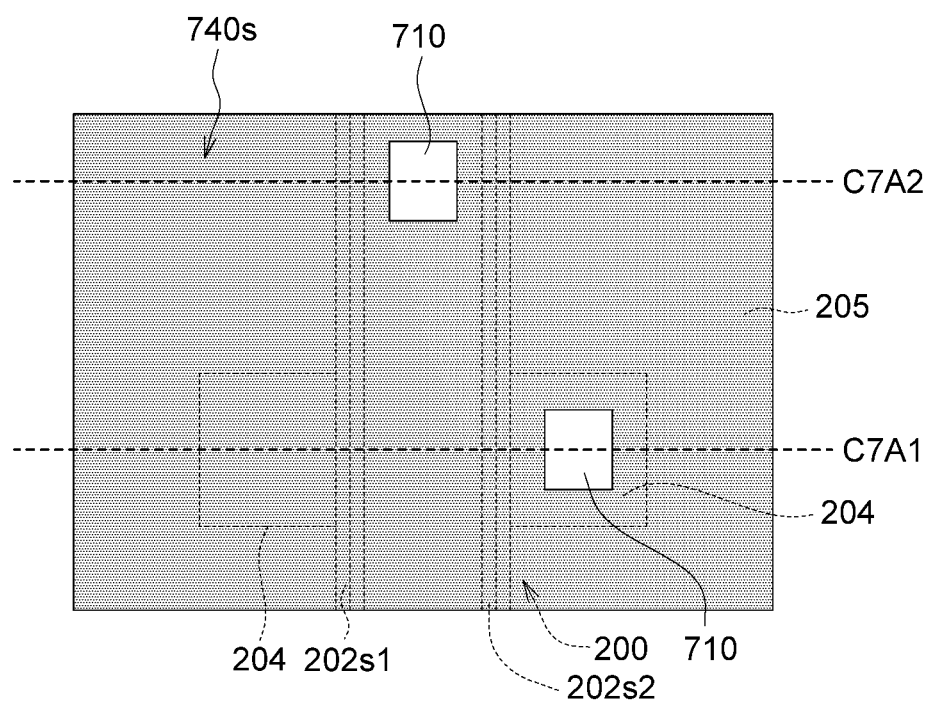
FIG. 7A(1)

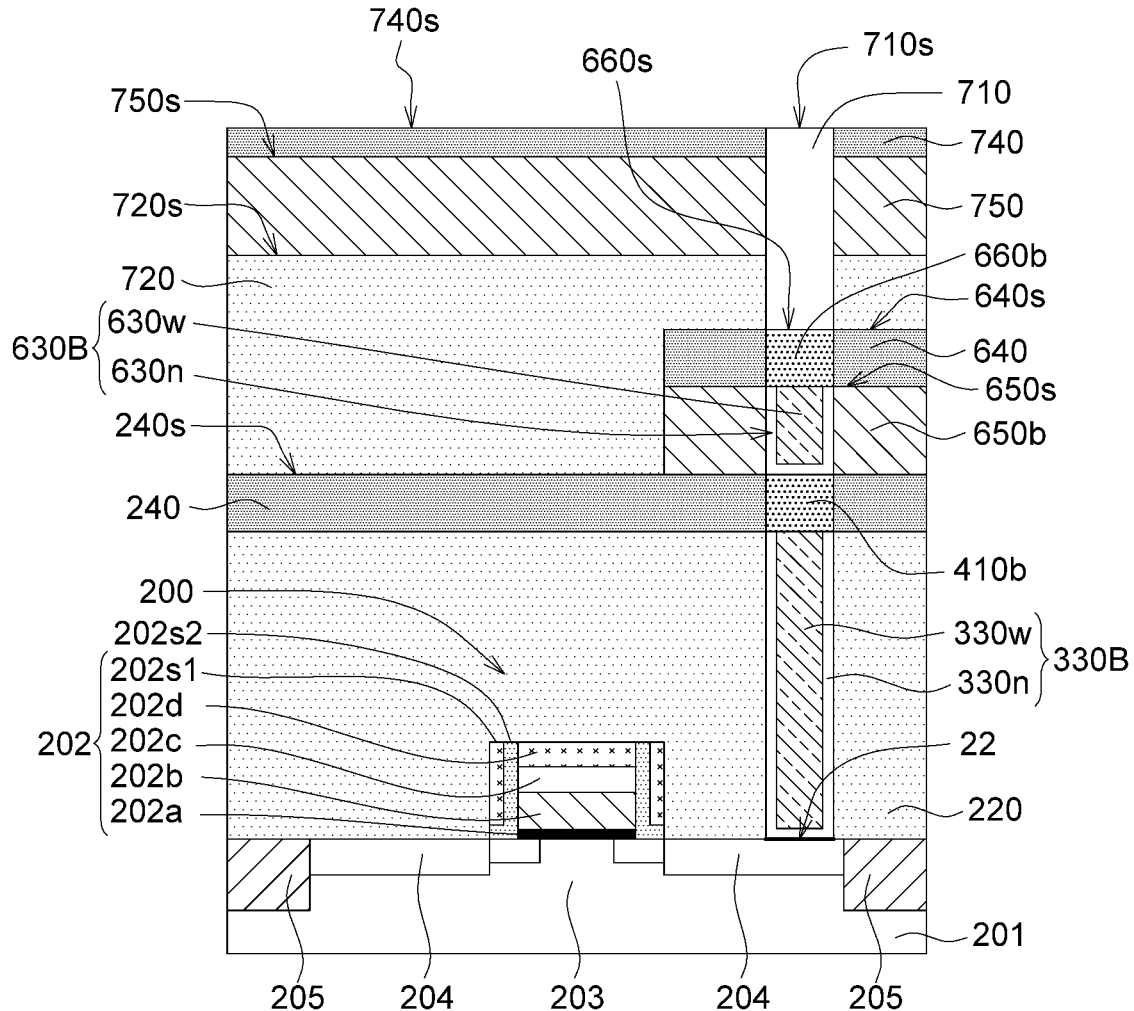
FIG. 7A(2)

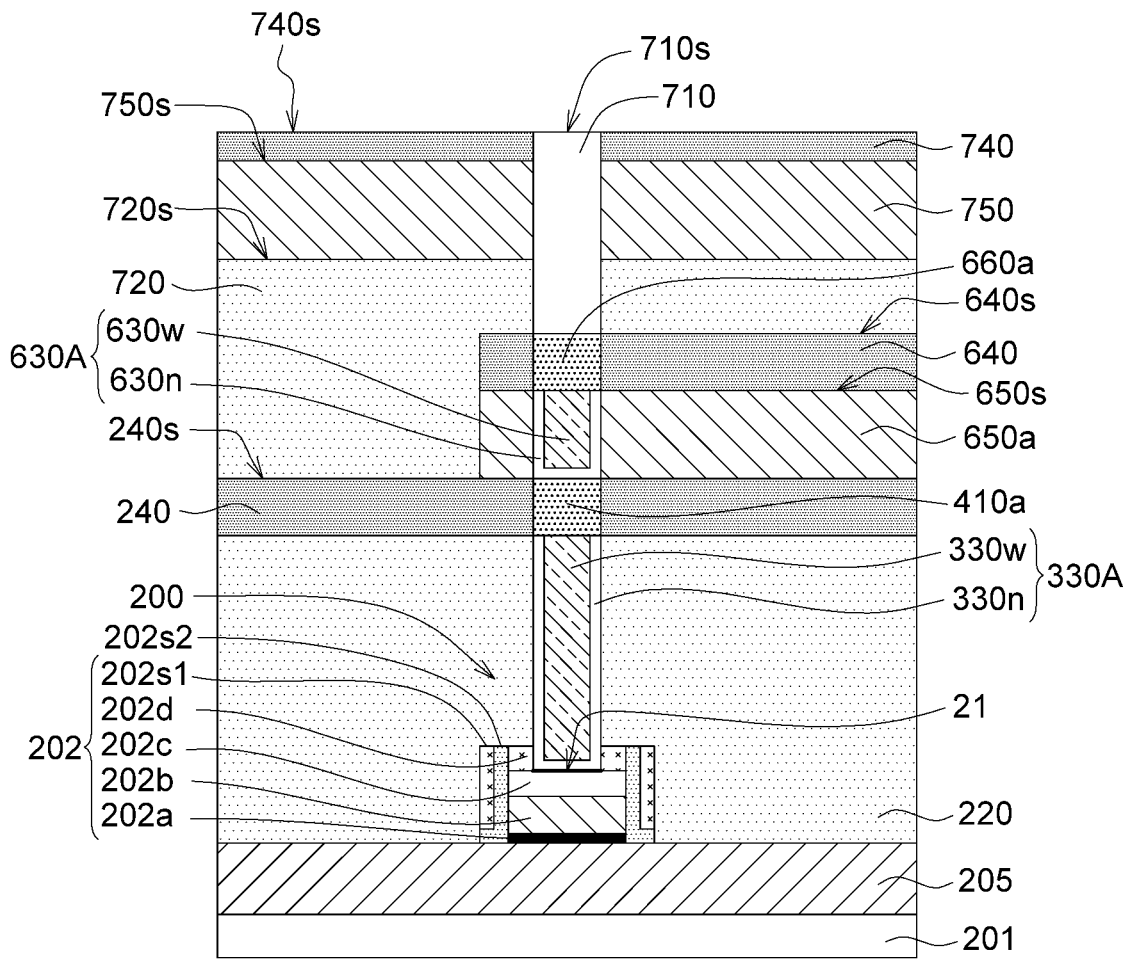
FIG. 7A(3)

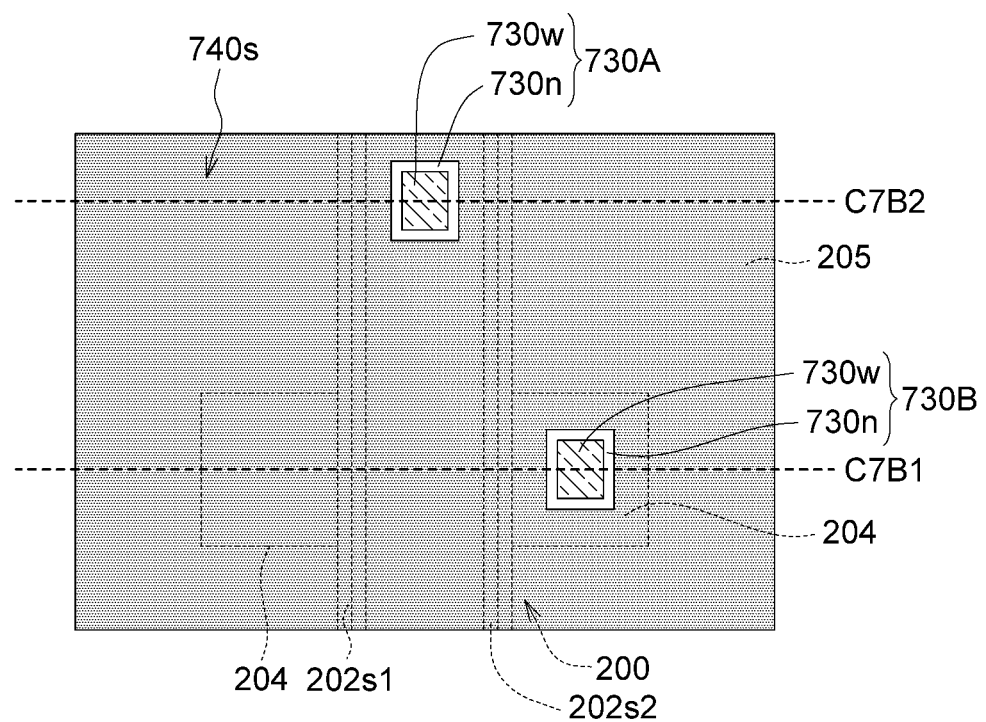
FIG. 7B(1)

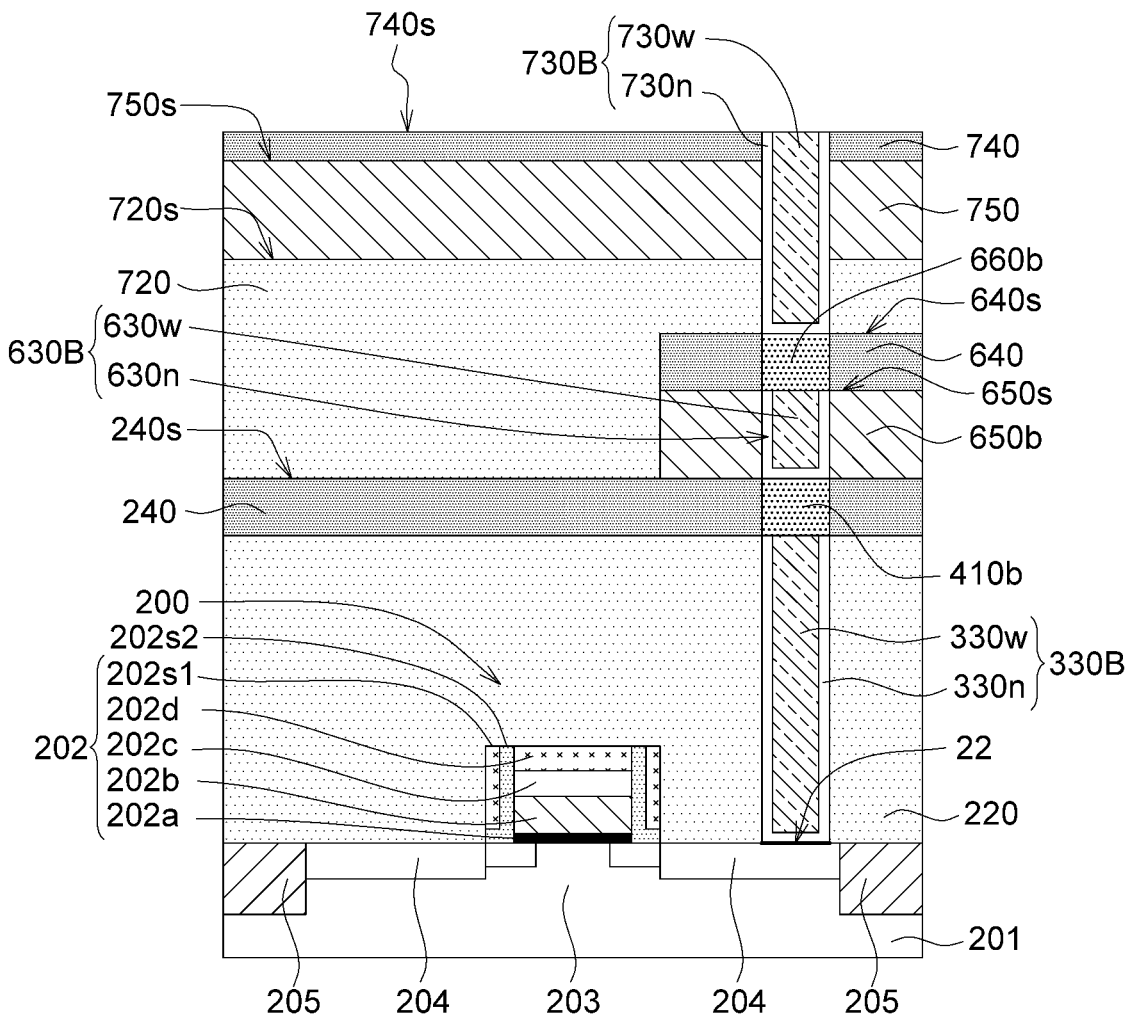
FIG. 7B(2)

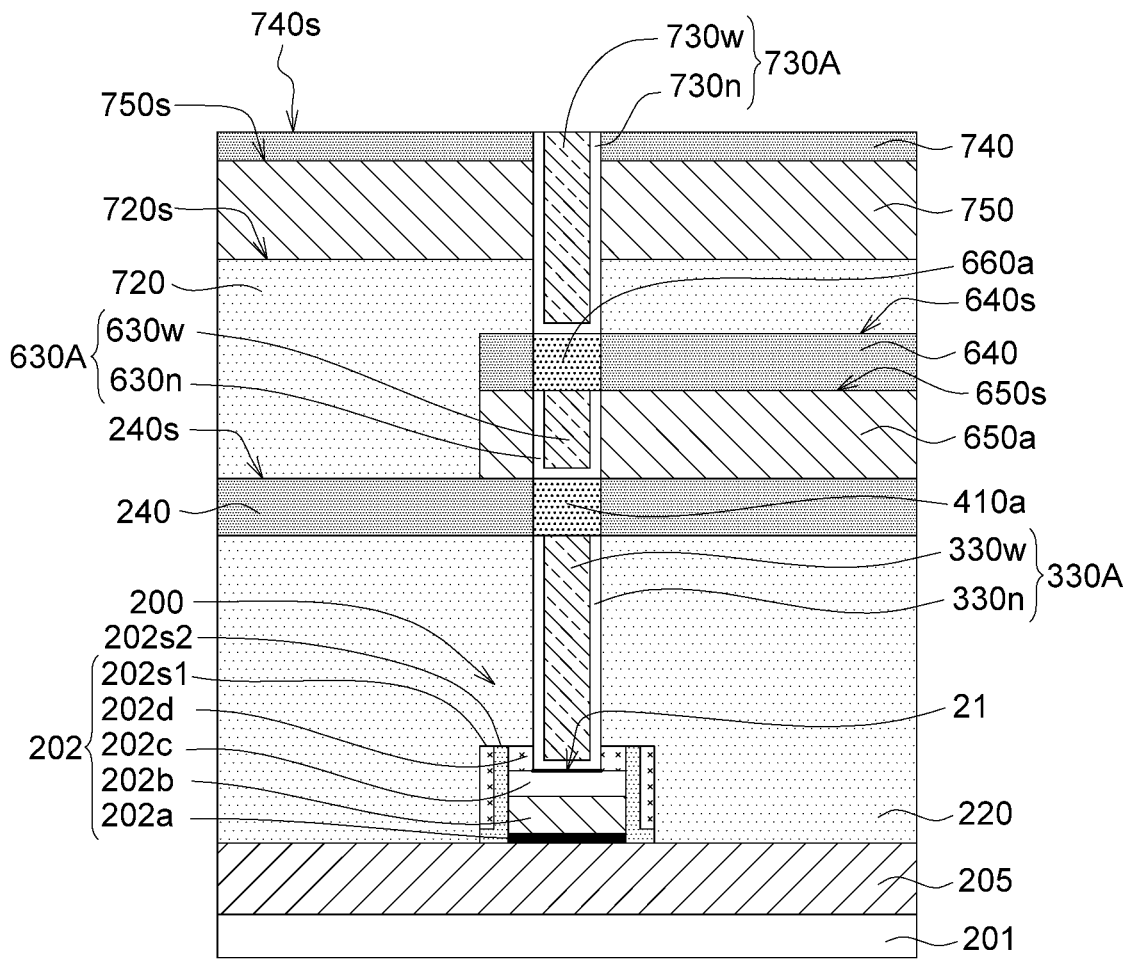
FIG. 7B(3)

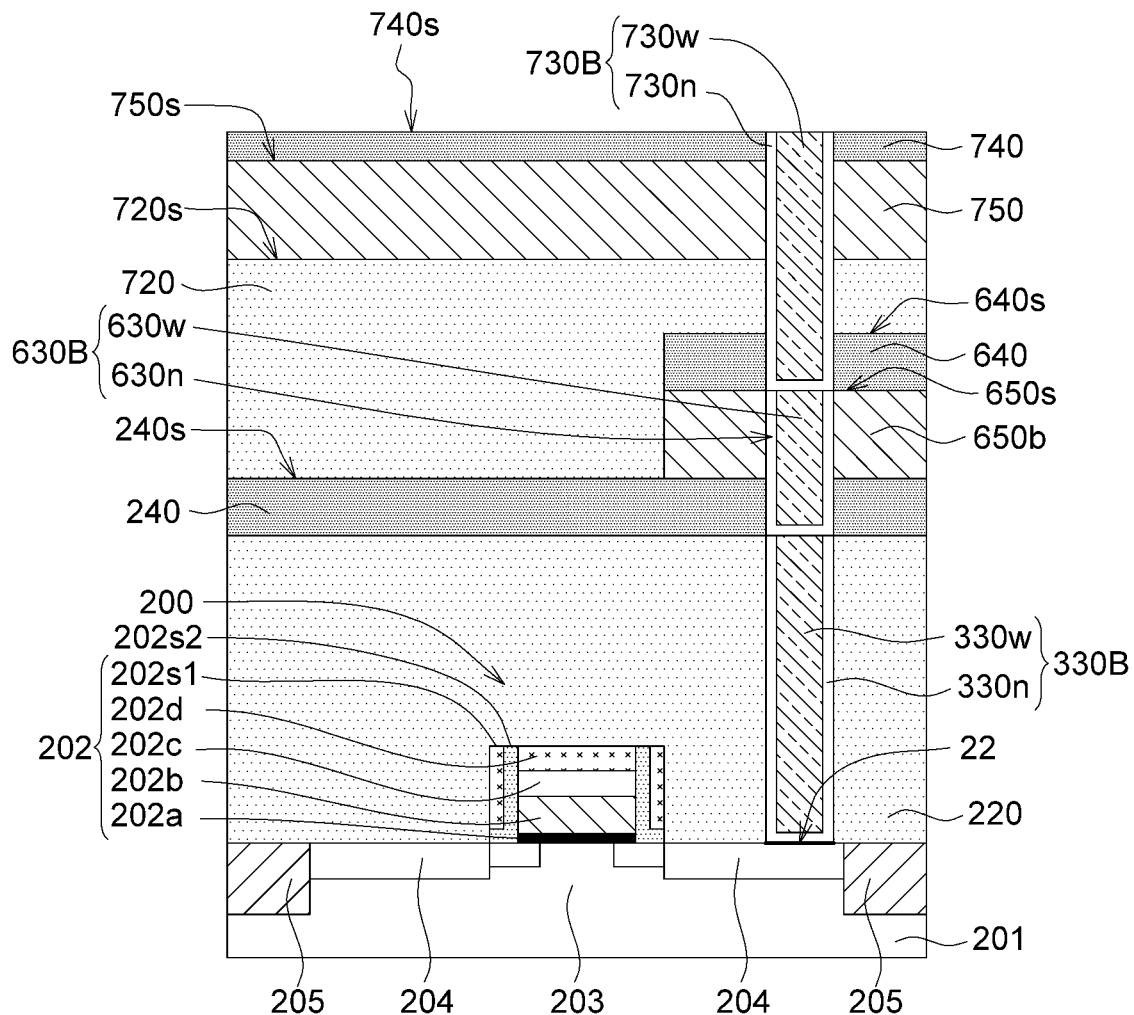
FIG. 7B(4)

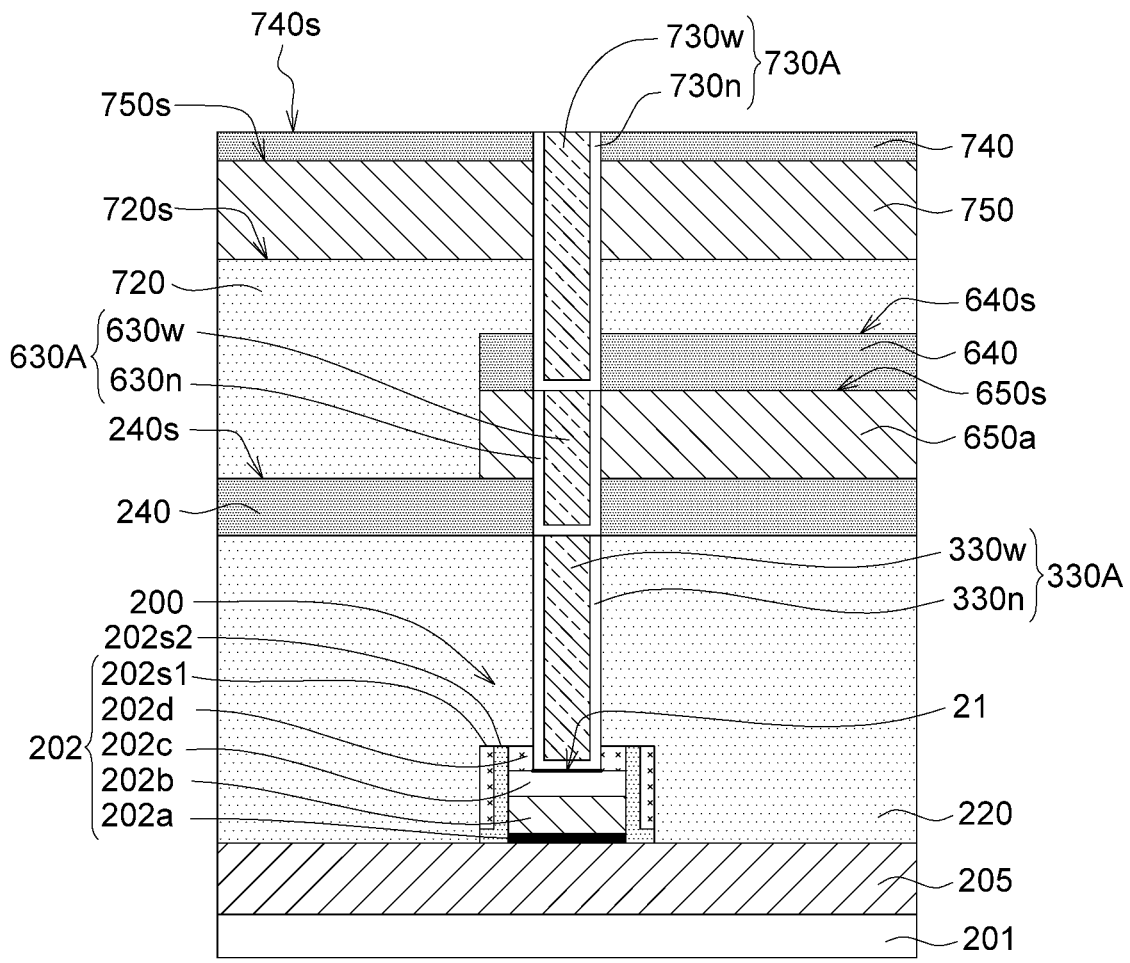
FIG. 7B(5)

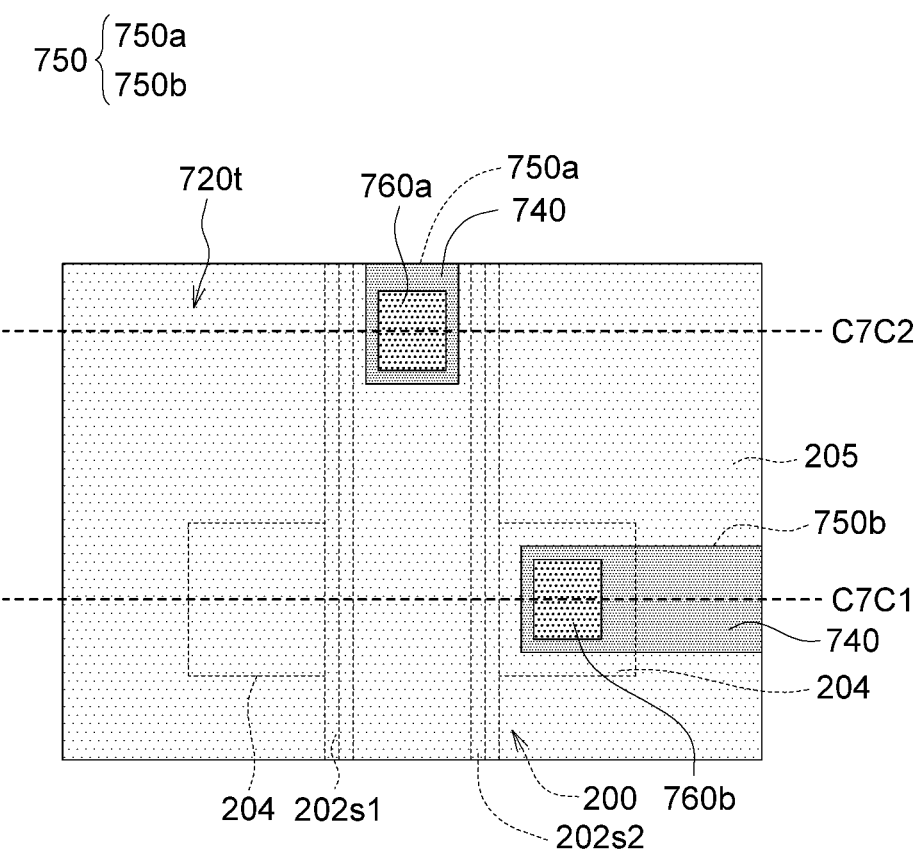
FIG. 7C(1)

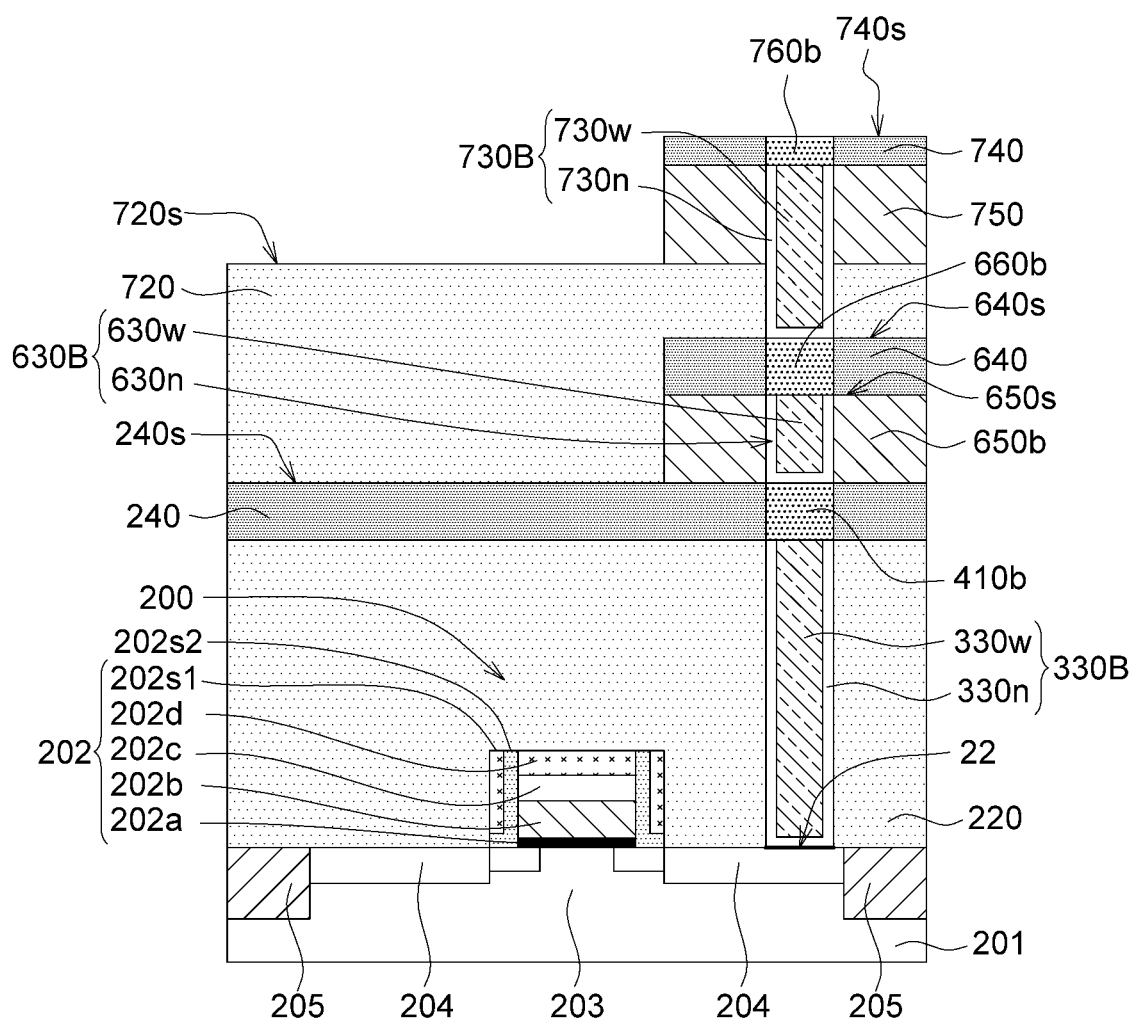
FIG. 7C(2)

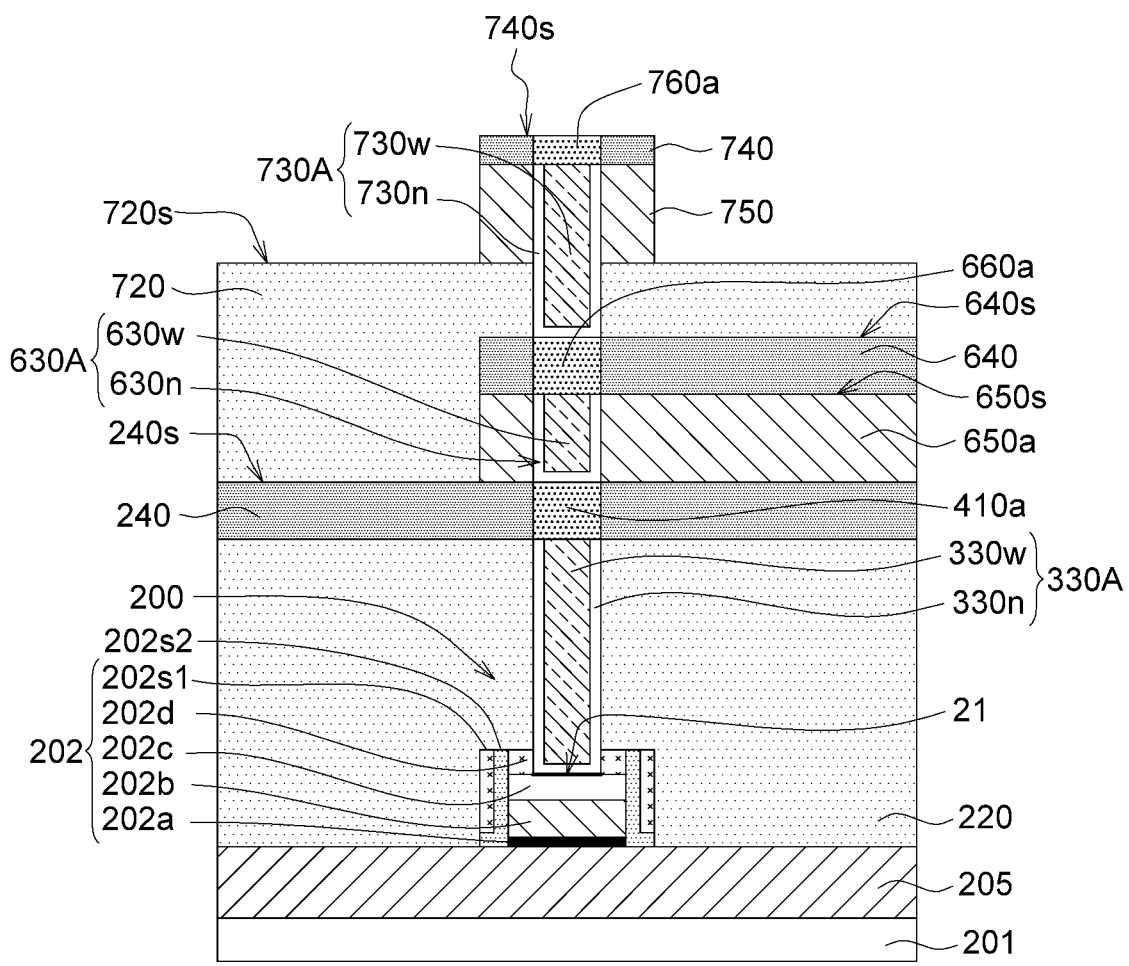
FIG. 7C(3)

INTERCONNECTION STRUCTURE AND MANUFACTURE METHOD THEREOF

This application claims the benefit of U.S. provisional application Ser. No. 63/158,896, filed Mar. 10, 2021, the subject matter of which is incorporated herein by reference.

BACKGROUND OF THE DISCLOSURE

Field of the Disclosure

The disclosure relates in general to a semiconductor structure and the manufacture method thereof, and more particularly to an interconnection structure and the manufacture method thereof.

Description of the Related Art

A current Integrated-circuits chip has many transistors which are connected by a one-die interconnection system of using multiple interconnections, which has its first interconnection layer M1 to connect the gate-level (Gate) and the diffusion-level of the source-region and the drain-region (called generally as Diffusion) of the MOSFET device. When there is a need to increase a second interconnection layer M2 for facilitating signal transmission without enlarging the die size by only using M1, then a structure Via-1, which is composed of some types of the conductive materials, is formed for connecting M2 to M1. Thus, there is a vertical structure which is formed from the diffusion through a contact (Con) connection to M1, i.e. "Diffusion-Con-M1"; similarly another structure to connect the gate through a contact structure to M1 can be formed as "Gate-Con-M1". Additionally, if a connection structure is needed to be formed from an M1 interconnection through a Via1 to connect to an M2 interconnection, then it is named as "M1-Via1-M2". A more complex interconnection structure from the Gate-level to the M2 interconnection can be described as "Gate-Con-M1-Via1-M2". Furthermore, a stacked interconnection system may have an "M1-Via1-M2-Via2-M3-Via4-M4 . . . " structure.

By so far, the state-of-the-art interconnection system may not allow, for example, that the gate directly connect to M2 without bypassing the M1 structure. As results, the necessary space between one M1 interconnection and the other M1 interconnection can increase the die size and in some cases the wiring connections may block some efficient channeling intention of using M2 directly to surpass M1 regions. In addition, there is no method to form a self-alignment structure between Via1 to contact and at the same time both Via1 and contact are connected to their own interconnection systems, respectively.

Therefore, there is a need to provide an advanced interconnection structure and the manufacture method thereof to overcome the drawbacks of the prior art.

SUMMARY OF THE DISCLOSURE

One embodiment of the present disclosure is to provide an interconnection structure, wherein the interconnection structure includes a first dielectric layer, a first conduction layer, a conductor pillar, an upper dielectric layer and an upper conduction layer. The first dielectric layer is disposed over a first terminal of a device. The first conduction layer is disposed over the first dielectric layer. The conductor pillar is connected to the first terminal. The upper dielectric layer is disposed over the first conduction layer. The upper conduction layer is disposed over the upper dielectric layer. The conductor pillar connects to the upper conduction layer but disconnects from the first conduction layer.

In one aspect of the present disclosure, the conductor pillar includes a first conductor pillar portion and a second conductor pillar portion, the first conductor pillar portion is surrounded by the first dielectric layer and the second conductor pillar portion is surrounded by the upper dielectric layer.

In another aspect of the present disclosure, the first conductor pillar portion is formed based on a silicon region of the first terminal, and the second conductor pillar portion is formed based on the first conductor pillar portion.

In another aspect of the present disclosure, the device is a transistor and the first terminal of the device is a gate terminal. The gate terminal includes a gate dielectric layer, a gate conduction layer over the gate dielectric layer, and the silicon region over the gate conduction layer.

In another aspect of the present disclosure, the silicon region is a poly-silicon region or an amorphous silicon region.

In another aspect of the present disclosure, the first conductor pillar portion is formed by a selective epitaxy growth based on the poly-silicon region or the amorphous silicon region, and the second conductor pillar portion is formed by a selective epitaxy growth based on the first conductor pillar portion.

In another aspect of the present disclosure, the device is a transistor and the first terminal of the device is a drain terminal.

In another aspect of the present disclosure, a top surface of the conductor pillar is higher than a top surface of the upper dielectric layer.

Another embodiment of the present disclosure is to provide a manufacture method of an interconnection structure, wherein the manufacture method includes steps as follows: A first dielectric layer is formed over a first terminal of a device. A conductor pillar is formed to be connected to the first terminal. A first conduction layer is formed over the first dielectric layer. An upper dielectric layer is formed over the first conduction layer. An upper conduction layer is formed over the upper dielectric layer. Wherein the conductor pillar connects to the upper conduction layer but disconnects from the first conduction layer.

In one aspect of the present disclosure, the conductor pillar comprises a first conductor pillar portion and a second conductor pillar portion, and the step of forming the conductor pillar includes steps as follows: Firstly, an open hole is formed in the first dielectric layer to reveal a silicon region of the first terminal. Next, the first conductor pillar portion is on the silicon region of the first terminal by a first selective epitaxy growth. The second conductor pillar portion is then formed on the first conductor pillar by a second selective epitaxy growth.

In another aspect of the present disclosure, before the step of forming the second conductor pillar portion, the manufacture method further includes a step of forming a first dielectric sub-layer over the first dielectric layer, wherein a top surface of the first dielectric sub-layer has a level substantially the same as that of the first conductor pillar portion.

In another aspect of the present disclosure, a width of the open hole is equal to a minimum feature size.

In another aspect of the present disclosure, both the first conductor pillar portion and the second conductor pillar portion are highly doped silicon pillars.

In another aspect of the present disclosure, the step of forming the first conduction layer includes steps as follows: Firstly, a first conduction material is deposited over the first dielectric layer. Next, a second dielectric sub-layer is deposited over the first conduction material. The first conduction material and the second dielectric sub-layer are then patterned to form the first conduction layer and to define an opening hollow passing the first conduction layer and the second dielectric sub-layer; wherein the conductor pillar penetrates through the opening hollow.

In another aspect of the present disclosure, the step of forming the upper dielectric layer includes steps as follows: Firstly, an upper dielectric material is disposed to cover the first dielectric sub-layer and fill in the opening hollow; and the upper dielectric material is then etched back; such that, a top surface of the upper dielectric layer is lower than that of the conductor pillar.

In another aspect of the present disclosure, a width of the opening hollow is greater than a minimum feature size.

Yet another embodiment of the present disclosure is to provide an interconnection structure, wherein the interconnection structure includes a first dielectric layer, a first dielectric sub-layer, a conductor pillar and a first conduction layer. The first dielectric layer is disposed over a first terminal of a device. The first dielectric sub-layer is disposed over the first dielectric layer. The conductor pillar is connected to the first terminal. The first conduction layer is disposed over the first dielectric sub-layer and connected to the conductor pillar. The device is a transistor and the first terminal of the device is a gate terminal which includes a gate dielectric layer, a gate conduction layer over the gate dielectric layer, and a silicon region over the gate conduction layer, and the conductor pillar is connected to the silicon region of the gate terminal.

In one aspect of the present disclosure, a top surface of the conductor pillar has a level substantially the same as that of the first dielectric sub-layer.

In another aspect of the present disclosure, the conductor pillar includes a tungsten pillar and a TiN layer surrounding the tungsten pillar.

In another aspect of the present disclosure, a width of the conductor pillar is equal to a minimum feature size.

In another aspect of the present disclosure, the device further includes a second terminal serving as a drain terminal, and the interconnection structure further includes another conductor pillar and another first conduction layer. The another conductor pillar is connected to the drain terminal. The another first conduction layer is disposed over the first dielectric sub-layer and connected to the another conductor pillar.

Yet another embodiment of the present disclosure is to provide a manufacture method of an interconnection structure, wherein the manufacture method includes steps as follows: A first dielectric layer is formed over a first terminal and a second terminal of a device. A first silicon pillar is formed passing through the first dielectric layer and connected to the first terminal, and a second silicon pillar is formed passing through the a first dielectric layer and connected to the second terminal, simultaneously.

In another aspect of the present disclosure, both the first silicon pillar and the second silicon pillar includes highly doped silicon; and the method further includes steps of simultaneously forming a first connection sub-layer connected to the first silicon pillar, and forming a second connection sub-layer connected to the second silicon pillar.

In another aspect of the present disclosure, the manufacture method further includes steps of replacing the first silicon pillar by a first conductor pillar and replacing the second silicon pillar by a second conductor pillar; wherein the first conductor pillar is connected to the first terminal and the second conductor pillar is connected to the second terminal.

In another aspect of the present disclosure, the manufacture method further includes steps of simultaneously forming a first connection sub-layer connected to the first conductor pillar, and forming a second connection sub-layer connected to the second conductor pillar.

In another aspect of the present disclosure, the manufacture method further includes steps of forming a first dielectric sub-layer over the first dielectric layer; and planarizing the first dielectric sub-layer, the first silicon pillar and the second silicon pillar, such that a top surface of the first dielectric sub-layer has a level substantially the same as that of the first silicon pillar and as that of the second silicon pillar.

In another aspect of the present disclosure, the step of forming the first and the second silicon pillars includes steps as follows: Firstly, open holes are formed in the first dielectric layer to reveal a silicon region of the first terminal and a silicon region of the second terminal. The first silicon pillar is then formed on the silicon region of the first terminal and the second silicon pillar is formed on the silicon region of the second terminal simultaneously by a selective epitaxy growth.

Yet another embodiment of the present disclosure is to provide an interconnection structure, wherein the interconnection structure includes a first dielectric layer, a conductor pillar, a first highly doped silicon pillar and first conduction layer. The first dielectric layer is disposed over a first terminal of a device. The conductor pillar is connected to the first terminal. The first highly doped silicon pillar is disposed on the conductor pillar. The first conduction layer is disposed over the first dielectric layer and connected to the highly doped silicon pillar.

In another aspect of the present disclosure, the interconnection structure further includes a first dielectric sub-layer over the first dielectric layer; wherein the first highly doped silicon pillar is surrounded by the first dielectric sub-layer.

In another aspect of the present disclosure, the conductor pillar includes a tungsten pillar and a TiN layer surrounding the tungsten pillar.

In another aspect of the present disclosure, the interconnection structure further includes a highly doped silicon side pillar on the first highly doped silicon pillar and connected to the first metal layer.

Yet another embodiment of the present disclosure is to provide a manufacture method of an interconnection structure, wherein the manufacture method includes steps as follows: A first dielectric layer is formed over a first terminal of a device. Next, a silicon pillar is formed to be connected to the first terminal. The silicon pillar is then replaced by a conductor pillar, wherein the conductor pillar is connected to the first terminal. An upper portion of the conductor pillar is replaced by a first highly doped silicon pillar. Subsequently, a first conduction layer is formed to be connected to the first highly doped silicon pillar.

In another aspect of the present disclosure, before the step of replacing the silicon pillar, the manufacture further includes steps as follows: Firstly, a first dielectric sub-layer is formed over the first dielectric layer. The first dielectric sub-layer and the silicon pillar are then patterned, such that a top surface of the first dielectric sub-layer has a level substantially the same as that of the silicon pillar.

In another aspect of the present disclosure, the step of forming the silicon pillar includes steps of forming an open hole in the first dielectric layer to reveal a silicon region of the first terminal; and forming the silicon pillar on the silicon region of the first terminal by a selective epitaxy growth.

In another aspect of the present disclosure, the conductor pillar includes a tungsten pillar and a TiN layer, and the step of replacing the silicon pillar by the conductor pillar includes steps as follows: Firstly, the silicon pillar is removed to reveal the open hole. Next the TiN layer is formed in the open hole; and the tungsten pillar is then formed to be surrounded by the TiN layer.

In another aspect of the present disclosure, the manufacture method further includes a step of forming a side pillar on the first highly doped silicon pillar and connected to the first metal layer, wherein the side pillar includes a highly doped silicon material.

Yet another embodiment of the present disclosure is to provide an interconnection structure, wherein the interconnection structure includes a first dielectric layer, a first conductor pillar, a first highly doped silicon pillar, a first conduction layer and a second conductor pillar. The first conductor pillar is surrounded by the first dielectric layer. The first highly doped silicon pillar is disposed on the first conductor pillar. The first conduction layer is disposed over the first dielectric layer. The second conductor pillar is disposed on the first highly doped silicon pillar and connected to the first conduction layer.

In another aspect of the present disclosure, the first conductor pillar, the first highly doped silicon pillar and the second conductor pillar are self-aligned in a vertical direction.

In another aspect of the present disclosure, each of the first conductor pillar and the second conductor pillar includes a tungsten pillar and a TiN layer surrounding the tungsten pillar.

In another aspect of the present disclosure, the interconnection structure further includes a first dielectric sub-layer over the first dielectric layer and below the first conduction layer, wherein the first highly doped silicon pillar is surrounded by the first dielectric sub-layer.

In another aspect of the present disclosure, the interconnection structure further includes a second highly doped silicon pillar on the second conductor pillar.

In another aspect of the present disclosure, the interconnection structure further includes a second dielectric sub-layer over the first conduction layer, wherein the second highly doped silicon pillar is surrounded by the second dielectric sub-layer.

Yet another embodiment of the present disclosure is to provide an interconnection structure, wherein the interconnection structure includes a lower conduction layer, a first conductor pillar, a first highly doped silicon pillar, a lower dielectric layer, an upper conduction layer and a second conductor pillar. The first conductor pillar is surrounded by and connected to the lower conduction layer. The first highly doped silicon pillar is disposed on the first conductor pillar. The lower dielectric layer is disposed over the lower connection layer. The upper conduction layer is disposed over the lower dielectric layer. The second conductor pillar is disposed on the first highly doped silicon pillar and surrounded by the upper conduction layer. The second conductor pillar is connected to the upper conduction layer.

In another aspect of the present disclosure, the first conductor pillar, the first highly doped silicon pillar and the second conductor pillar are self-aligned in a vertical direction.

In another aspect of the present disclosure, the interconnection structure further includes a lower dielectric sub-layer between the lower dielectric layer and the lower conduction layer, wherein the first highly doped silicon pillar is surrounded by the lower dielectric sub-layer.

In another aspect of the present disclosure, the interconnection structure further includes a second highly doped silicon pillar on the second conductor pillar.

In another aspect of the present disclosure, the interconnection structure further includes an upper dielectric sub-layer over the upper conduction layer, wherein the second highly doped silicon pillar is surrounded by the upper dielectric sub-layer.

Yet another embodiment of the present disclosure is to provide an interconnection structure, wherein the interconnection structure includes a first dielectric layer over a first conductive terminal; a first conduction layer over the first dielectric layer; a conductor pillar penetrating through the first dielectric layer and connected to the first conductive terminal; an upper dielectric layer over the first conduction layer; and an upper conduction layer over the upper dielectric layer. Wherein the conductor pillar penetrates through the upper dielectric layer and connects to the upper conduction layer, but the conductor pillar does not electrically connect the first conduction layer.

In another aspect of the present disclosure, the interconnection structure further comprises a plurality of middle conduction layers between the first conduction layer and the upper conduction layer, wherein each middle conduction layer vertically shifts with each other, and the conductor pillar does not electrically connect the plurality of middle conduction layers.

In another aspect of the present disclosure, the conductor pillar comprises a first conductor pillar portion and a second conductor pillar portion, the first conductor pillar portion is surrounded by the first dielectric layer and the second conductor pillar portion is surrounded by the upper dielectric layer.

In another aspect of the present disclosure, the first conductor pillar portion is formed based on a seed region of the first conductive terminal, and the second conductor pillar portion is formed based on a seed region of the first conductor pillar portion.

In another aspect of the present disclosure, the seed region of the first conductive terminal is made of a poly-silicon or an amorphous silicon.

In another aspect of the present disclosure, the first conductor pillar portion is formed by a selective epitaxy growth based on the poly-silicon or the amorphous silicon of the first conductive terminal.

In another aspect of the present disclosure, the first conductive terminal is a gate terminal of a semiconductor transistor of a semiconductor substrate; wherein the gate terminal comprises a gate dielectric layer, a gate metal layer over the gate dielectric layer, and a silicon region over the gate metal layer.

In another aspect of the present disclosure, the first conductive terminal is a gate terminal of a semiconductor transistor of a semiconductor substrate; wherein the gate terminal comprises a gate dielectric layer, and a gate poly-silicon layer over the gate dielectric layer.

In another aspect of the present disclosure, wherein the first conductive terminal is a drain terminal or a source terminal of a semiconductor transistor.

In another aspect of the present disclosure, the first conductive terminal is a lower conduction layer over a semiconductor transistor of a semiconductor substrate, the lower conduction layer comprises a metal region and a seed region electrically coupled to the metal region.

In another aspect of the present disclosure, wherein the seed region of the lower conduction layer is made of highly doped silicon.

Yet another embodiment of the present disclosure is to provide an interconnection structure, wherein the interconnection structure includes a semiconductor transistor formed based on a semiconductor substrate, the semiconductor transistor having a gate terminal and a drain terminal; a first conductor pillar over the semiconductor transistor and extending upward; a seed pillar on the first conductor pillar and electrically conducted to the first conductor pillar; a second conductor pillar on the seed pillar and extending upward; and an upper conduction layer over the second conductor pillar and being electrically connected to the second conductor pillar. Wherein the seed pillar is clipped by the first conductor pillar and the second conductor pillar.

In another aspect of the present disclosure, the seed pillar is made of a highly doped silicon.

In another aspect of the present disclosure, the first conductor pillar is electrically connected to the gate terminal or the drain terminal of the transistor.

In another aspect of the present disclosure, the interconnection structure further comprises a lower conduction layer above the semiconductor transistor and under the upper conduction layer; wherein the lower conduction layer is electrically isolated from the first conductor pillar and the second conductor pillar.

In another aspect of the present disclosure, the interconnection structure further comprises a lower conduction layer above the semiconductor transistor and under the upper conduction layer; wherein the lower conduction layer is electrically connected to the first conductor pillar.

In another aspect of the present disclosure, the interconnection structure further comprises a middle conduction layer between the lower conduction layer and the upper conduction layer; wherein the middle conduction layer is electrically isolated from the first conductor pillar and the second conductor pillar.

Yet another embodiment of the present disclosure is to provide an interconnection structure, wherein the interconnection structure includes a first dielectric layer over a first conductive terminal; a conductor pillar penetrating through the first dielectric layer and connected to the first conductive terminal; a seed pillar being on and electrically connected to the conductor pillar; and a first conduction layer over the first dielectric layer and electrically connected to the seed pillar.

In another aspect of the present disclosure, the interconnection structure further comprises a side pillar being on the seed pillar and electrically connected to the first conduction layer.

In another aspect of the present disclosure, the seed pillar or the side pillar is made of highly doped silicon, the side pillar is selectively grown based on the seed pillar, and the first conduction layer is made of metal.

In another aspect of the present disclosure, the first dielectric layer comprising a dielectric sub-layer; wherein the seed pillar is surrounded by the dielectric sub-layer, a top surface of the seed pillar is aligned with a top surface of the dielectric sub-layer, and a top surface of the side pillar is higher than the top surface of the dielectric sub-layer.

In another aspect of the present disclosure, wherein the first conductive terminal is a lower conduction layer over a semiconductor transistor of a semiconductor substrate, the lower conduction layer comprises a metal region and a seed region electrically coupled to the metal region.

In another aspect of the present disclosure, wherein the seed region of the lower conduction layer is made of highly doped silicon.

In another aspect of the present disclosure, wherein the first conductive terminal is a gate terminal of a semiconductor transistor of a semiconductor substrate; wherein the gate terminal comprises a gate dielectric layer, a gate metal layer over the gate dielectric layer, and a seed region over the gate metal layer.

In another aspect of the present disclosure, the seed region of the gate terminal is made of highly doped silicon.

Yet another embodiment of the present disclosure is to provide an interconnection structure, wherein the interconnection structure includes a first dielectric layer over a gate terminal of a semiconductor transistor formed on a semiconductor substrate; a conductor pillar penetrating through the first dielectric layer and connected to the gate terminal; and a first conduction layer over the first dielectric layer and electrically connected to the conductor pillar; wherein the gate terminal comprises a gate dielectric layer and a seed region over the gate dielectric layer.

In another aspect of the present disclosure, the conductor pillar is selectively grown based on the seed region of the gate terminal.

In another aspect of the present disclosure, the conductor pillar is made of highly doped silicon.

In another aspect of the present disclosure, the gate terminal further comprises a gate metal layer between the gate dielectric layer and the seed region.

In another aspect of the present disclosure, the interconnection structure further comprises a seed pillar being on the conductor pillar, wherein the seed pillar is electrically connected to the conductor pillar and the first conduction layer.

In another aspect of the present disclosure, the conductor pillar comprises a tungsten pillar and a TiN layer surrounding the tungsten pillar.

Yet another embodiment of the present disclosure is to provide an interconnection structure, wherein the interconnection structure includes a semiconductor transistor formed based on a semiconductor substrate, the semiconductor transistor having a gate terminal and a drain terminal; a first conductor pillar over the semiconductor transistor and extending in an upward direction, wherein the first conductor pillar comprises a first seed region; and a second conductor pillar on the first conductor pillar and extending in the upward direction, wherein the second conductor pillar comprises a second seed region; wherein a bottom surface of the second conductor pillar is self-aligned with a top surface of the first conductor pillar.

In another aspect of the present disclosure, the first conductor pillar is made of a highly doped silicon, and the first seed region is a top region of highly doped silicon.

In another aspect of the present disclosure, the first conductor pillar further comprises a first tungsten pillar and a first TiN layer surrounding the first tungsten pillar, and the first seed region is made of highly doped silicon and is on the first tungsten pillar.

In another aspect of the present disclosure, wherein the bottom surface of the second conductor pillar is self-aligned with a top surface of the first seed region.

In another aspect of the present disclosure, the interconnection structure further comprises a third conductor pillar on the second conductor pillar and extending in the upward direction, the third conductor pillar comprising a third seed region; wherein the second conductor pillar further comprises a second tungsten pillar and a second TiN layer surrounding the second tungsten pillar, and the second seed region is made of highly doped silicon and is on the second tungsten pillar; wherein a bottom surface of the third conductor pillar is self-aligned with a top surface of the second seed region.

In another aspect of the present disclosure, the interconnection structure further comprises a lower conduction layer over the semiconductor transistor and an upper conduction layer over the lower conduction layer; wherein the first conductor pillar is electrically connected to the gate terminal or the drain terminal of the semiconductor transistor, the third conductor pillar is electrically connected to the upper conduction layer, and the lower conduction layer is electrically isolated from the first conductor pillar, the second conductor pillar, and the third conductor pillar.

In another aspect of the present disclosure, the interconnection structure further comprises a lower conduction layer over the semiconductor transistor, an upper conduction layer over the lower conduction layer, and a middle conduction layer between the lower conduction layer and the upper conduction layer; wherein the first conductor pillar is electrically connected to the lower conduction layer, the third conductor pillar is electrically connected to the upper conduction layer, and the middle conduction layer is electrically isolated from the first conductor pillar, the second conductor pillar, and the third conductor pillar.

According to the above, exemplified embodiments which significantly improve the connection structures between devices and interconnections to form an efficient wiring system on a die for completion of integrated circuits. The first exemplified embodiment allows either Gate or Diffusion (source/drain) areas to be directly connected to the M2 interconnection layer (without a transitional layer M1) in a self-alignment way through one vertical conductive plug being composed of contact-A and Via1-A which are respectively formed during the construction phases of making contact and Via1 in the other locations on the same die. This embodiment could also be applied to allows M1 interconnection or conduction layer to be directly connected to the MX interconnection layer (without a transitional conduction layers M2, M3, . . . MX−1) in a self-alignment way through one vertical conductive or conductor plug.

Another exemplified embodiment is that a landing pad created by a vertical conductor pillar which connects either gate or diffusion region, respectively, to a planar surface which is effectively created for landing the metal M1 interconnection layer. This avoids making the contact connection material to go through a very rough surface topography inside the contact hole regions with a high aspect ratio of the depth to the opening-hole.

Another exemplified embodiment is that the M1 can be connected to the contact in a self-alignment way with no need in mask or design to reserve an extra M1 border area between the M1 width and the contact width.

Another exemplified embodiment is to make the Via1 exactly on top of the contact in a self-alignment way (similarly for Via2 on top of Via1 which can also be exactly self aligned mutually, and then similarly for Via3 on top of Via2, etc.), but all layers of M1, M2, etc. reserve their respective connection function so as to complete their individual interconnections but with the smallest footprint areas under Via1 and contact and the advantages are extendible for all via layers from the top to the bottom. This invention discloses a method to make self-alignments from the bottom interconnection layer to the upper interconnection layer to achieve vertical connections between them, which is different from the conventional alignment method from the upper interconnection layer to the bottom interconnection layer.

BRIEF DESCRIPTION OF THE DRAWINGS

The above and other aspects of the disclosure will become better understood with regard to the following detailed description of the preferred but non-limiting embodiment(s). The following description is made with reference to the accompanying drawings:

FIGS. 1A(1) to 1H(3) are a series top views and cross-sectional views illustrating the manufacture method for forming a device having a transistor structure according to one embodiment of the present disclosure.

FIGS. 2A(1) to 2C(3) are a series top views and cross-sectional views illustrating the manufacture method for forming a device having a transistor structure according to another embodiment of the present disclosure.

FIGS. 3A(1) to 3B(3) are a series top views and cross-sectional views illustrating the manufacture method for forming another device having a transistor structure according to yet another embodiment of the present disclosure.

FIGS. 4A(1) to 4B(3) are a series top views and cross-sectional views illustrating the manufacture method for forming another device having a transistor structure according to yet another embodiment of the present disclosure.

FIGS. 6A(1) to 6C(3) are a series top views and cross-sectional views illustrating the manufacture method for forming another device having a transistor structure according to yet another embodiment of the present disclosure.

FIGS. 7A(1) to 7C(3) are a series top views and cross-sectional views illustrating the manufacture method for forming another device having a transistor structure according to yet another embodiment of the present disclosure.

DETAILED DESCRIPTION OF THE DISCLOSURE

Figure 5:
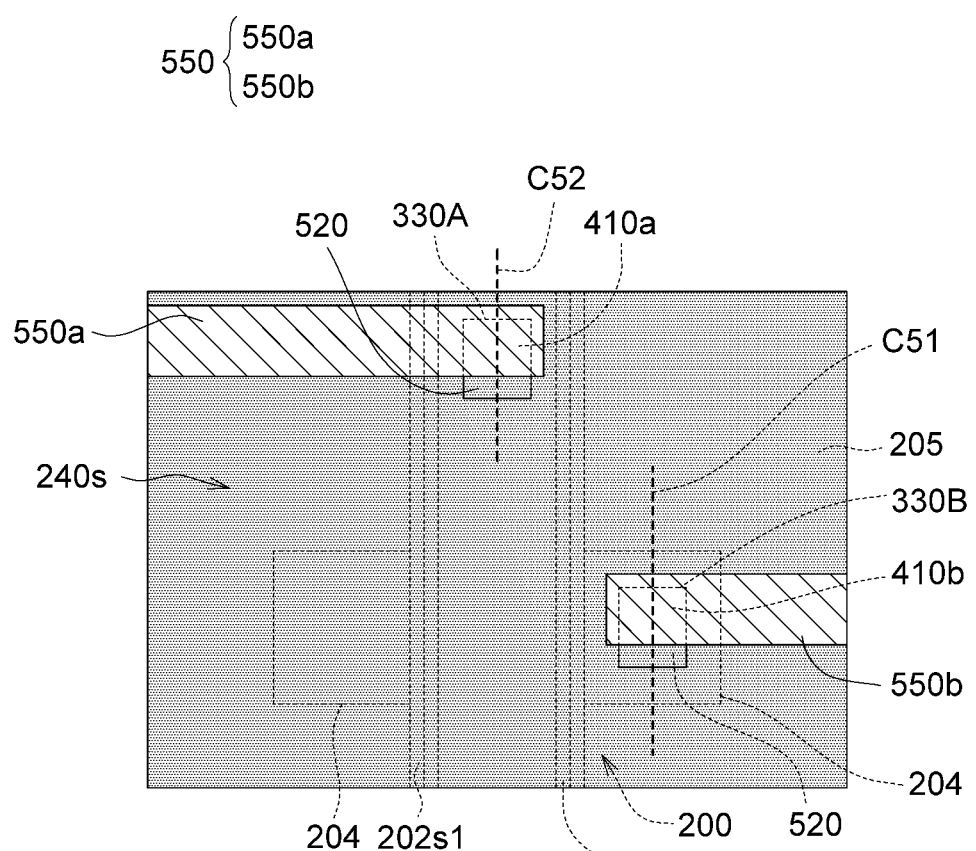
FIGS. 5(1) to 5(3) are a top view and cross-sectional views illustrating the manufacture method for forming another device having a transistor structure according to yet another embodiment of the present disclosure.
Figure 5:
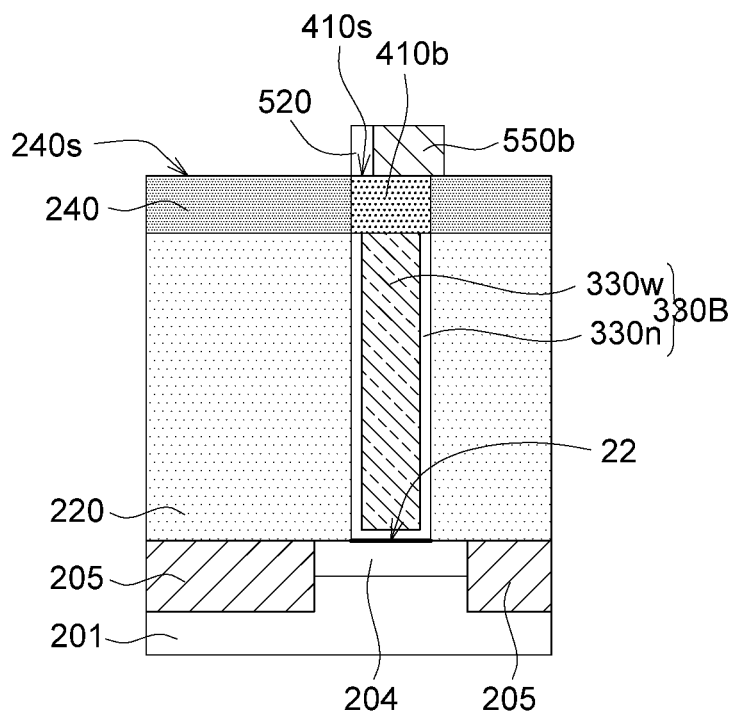
Figure 5:
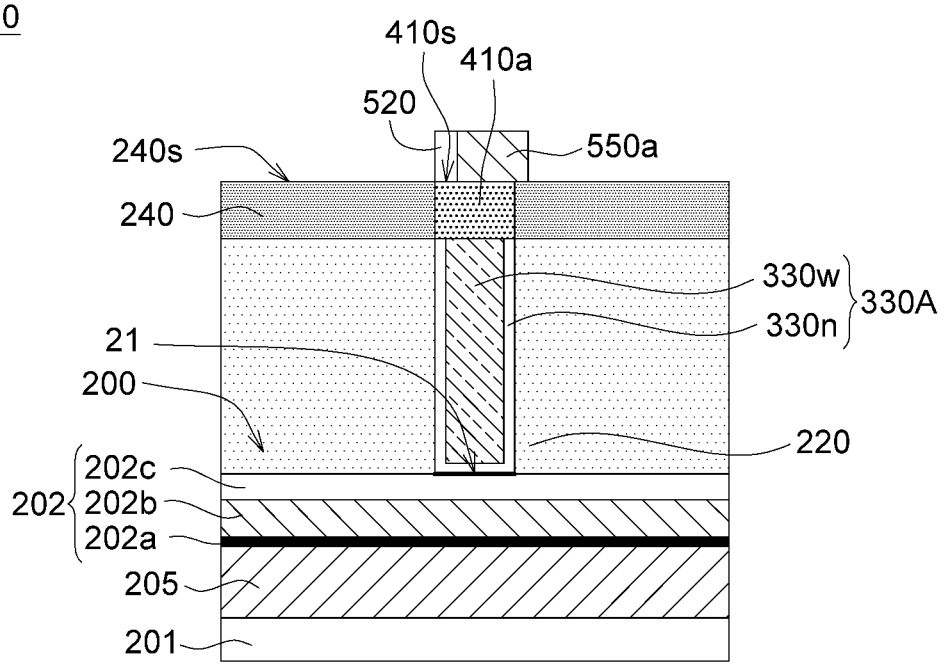

The present disclosure provides an interconnection structure and the manufacture method thereof. The above and other aspects of the disclosure will become better understood by the following detailed description of the preferred but non-limiting embodiment(s). The following description is made with reference to the accompanying drawings:

Several embodiments of the present disclosure are disclosed below with reference to accompanying drawings. However, the structure and contents disclosed in the embodiments are for exemplary and explanatory purposes only, and the scope of protection of the present disclosure is not limited to the embodiments. It should be noted that the present disclosure does not illustrate all possible embodiments, and anyone skilled in the technology field of the disclosure will be able to make suitable modifications or changes based on the specification disclosed below to meet actual needs without breaching the spirit of the disclosure. The present disclosure is applicable to other implementations not disclosed in the specification.

The following embodiments are described by forming an interconnection structure for a device 10. In some embodiments of the present disclosure, the transistor structure 100 adopted as an example can be an NMOS transistor; a structure for a PMOS transistor can be derived similarly except which has oppositely doped or formed materials in contrast to those of the NMOS transistor.

Embodiment 1

According to one embodiment of the present disclosure, the method for forming a device 10 having a transistor structure 100 includes steps as follows:

Step S11: forming a first dielectric layer over a first terminal of a device.

Step S12: forming a conductor pillar connected to the first terminal.

Step S121: forming an open hole in the first dielectric layer to reveal a silicon region of the first terminal.

Step S122: forming a first conductor pillar portion on the silicon region of the first terminal by a first selective epitaxy growth.

Step S123: forming a first dielectric sub-layer over the first dielectric layer, wherein a top surface of the first dielectric sub-layer has a level substantially the same as that of the first conductor pillar portion (such as planarized by CMP process or etching process).

Step S124: forming a second conductor pillar portion on the first conductor pillar by a second selective epitaxy growth.

Step S13: forming a first conduction layer over the first dielectric layer.

Step S131: depositing a first conduction material over the first dielectric layer.

Step S132: depositing a second dielectric sub-layer over the first conduction material.

Step S132: patterning the first conduction material and the second dielectric sub-layer to form the first conduction layer and to define an opening hollow passing the first conduction layer and the second dielectric sub-layer, wherein the conductor pillar penetrates through the opening hollow.

Step S14: forming at least one upper dielectric layer over the first conduction layer.

Step S141: depositing an upper dielectric material to cover the first dielectric sub-layer and fill in the opening hollow.

Step S142: etching back the upper dielectric material, such that a top surface of the upper dielectric layer is lower than that of the conductor pillar.

Step S15: forming an upper conduction layer over the upper dielectric layer; wherein the conductor pillar connects to the upper conduction layer but disconnects from the first conduction layer.

Referring to Step S11: forming a first dielectric layer 120 over a first conductive terminal (Gate, Drain, or Source) of a device 10. FIG. 1A(1) is a top view illustrating a structure after a first dielectric layer 120 is formed over a transistor structure 100 previously formed in a semiconductor substrate 101, according to one embodiment of the present disclosure. FIG. 1A(2) is a cross-sectional view taken along the cutting line C1A1 as depicted in FIG. 1A(1). FIG. 1A(3) is a cross-sectional view taken along the cutting line C1A2 as depicted in FIG. 1A(1).

In the present embodiment, the semiconductor substrate 101 includes a silicon layer, such as a poly-silicon layer or an amorphous silicon layer. As shown in FIGS. 1A(1) to 1A(3), the transistor structure 100 is formed in an active area of the silicon layer defined by a shallow trench isolator (STI) 105. The transistor structure 100 has a gate terminal 102 formed on the active area, a transistor channel region 103 formed in the active area beneath the gate terminal 102 and source/drain regions 104 formed in the active area and adjacent to the transistor channel region 103.

The gate terminal 102 comprises a gate dielectric layer 102a, a gate conduction layer 102b formed over the gate dielectric layer 102a and a silicon region 102c formed over the gate conduction layer 102b. In some embodiments of the present disclosure, the gate dielectric layer 102a can be made of oxide or low-k dielectric; the gate conduction layer 102b can be made of metal (not limited to this regard); and the silicon region 102c can be made of polysilicon or amorphous silicon. In some embodiment the gate terminal 102 further includes a capping layer (e.g. a nitride layer) over the top of the silicon region 102c and further includes at least one spacer (e.g, including a nitride spacer 102s1 and a thermal oxide spacer 102s2) over the sidewalls of the gate dielectric layer 102a, the gate conduction layer 102b and the silicon region 102c. The top portion of the silicon region 102c can serve as the revealed top portion 11; and the revealed top portion 12 can be the drain terminal of the source/drain regions 104.

The first dielectric layer 120 is formed on the semiconductor substrate 101 at least covering the active area of the transistor structure 100 including the gate terminal 102 and the source/drain regions 104 as well as the STI 105. In some embodiments of the present disclosure, the first dielectric layer 120 is made of made of oxide or low-k dielectric.

Referring to Step S12: forming a conductor pillar (such as, a first conductor pillar 130A) connected to the revealed top portion 11. In the present embodiment, the forming of the conductor pillar (e.g. the first conductor pillar 130A) includes steps as follows: Firstly, a plurality of open holes (such as the open holes 107a and 107b are formed in the first dielectric layer 120 to reveal the top portion of the silicon 102c region (referring to Step S121).

FIG. 1B(1) is a top view illustrating a structure after the open holes 107a and 107b are formed in the first dielectric layer 120 according to one embodiment of the present disclosure. FIG. 1B(2) is a cross-sectional view taken along the cutting line C1B1 as depicted in FIG. 1B(1). FIG. 1B(2) is a cross-sectional view taken along the cutting line C1B2 as depicted in FIG. 1B(1).

In some embodiments, the open holes 107a and 107b are formed by a photolithography process to remove portions of the first dielectric layer 120 to expose the portion the silicon region 102c (serving as the revealed top portion or first terminal 11) and expose the silicon region of the drain terminal of the source/drain regions 104 (serving as the revealed top portion or second terminal 12). In one embodiment, the first terminal 11 and a second terminal 12 are the top region of the gate terminal and source/drain terminal, respectively. In one example, each of the open holes 107a and 107b could be a size equal to a minimum feature size (e.g. a critical size of the transistor structure 100 of the device 10). Of course, the size of the open holes 107a and 107b could be larger than the minimum feature size.

As shown in FIGS. 1B(1) to 1B(3) the gate (i.e. the gate terminal 102) and the diffusion regions (i.e. the source/drain regions 104) of the transistor structure 100 (e.g. MOSFET) are respectively exposed from the open holes 107a and 107b surrounded by the insulators (eg. the first dielectric layer 120). The bottoms of the open holes 107a and 107b (i.e. the revealed top portion 11 and the revealed top portion 12) are made of materials with either polycrystalline/amorphous silicon or crystalline silicon with heavily doped concentrations having high conductivity, respectively.

How to form the plurality open holes 107a and 107b on top of the gate (i.e. the gate terminal 102) and diffusion (i.e. the source/drain regions 104) regions is already disclosed in U.S. application Ser. No. 17/468,683 filed on Sep. 8, 2021 (Title: TRANSISTOR STRUCTURE WITH METAL INTERCONNECTION DIRECTLY CONNECTING GATE AND DRAIN/SOURCE REGIONS) by the same inventor in the present invention. All contents of the aforesaid US application are incorporated by reference herein.

Referring to Step S122: a first conductor pillar portion (or a first sub conductor pillar) 131a is formed on the silicon region 102c of the revealed top portion 11 (that is exposed from the open hole 107a) by a selective epitaxy growth technique (SEG), and a third conductor pillar portion (or a third sub conductor pillar) 131b is formed on the silicon region of the revealed top portion 12 (the drain terminal of the source/drain regions 104 that is exposed from the open hole 107b by the same SEG, simultaneously. FIG. 1C(1) is a top view illustrating a structure after the first conductor pillar portion 131a and the third conductor pillar portion 131b are respectively formed in the open holes 107a and 107b according to one embodiment of the present disclosure. FIG. 1C(2) is a cross-sectional view taken along the cutting line C1C1 as depicted in FIG. 1C(1). FIG. 1C(2) is a cross-sectional view taken along the cutting line C1C2 as depicted in FIG. 1C(1). The exposed silicon region 102c of the gate terminal and the exposed silicon region of the source/drain terminal are seed regions for the selective epitaxy growth technique (SEG) to grow pillars based on the seed regions.

In the present embodiment, a SEG (or selective atomic layer deposition technique) is used to grow heavily doped conductive silicon plugs (or the conductor pillars) based on the revealed top portion 11 and the revealed top portion 12, to form the first conductor pillar portion 131a and the third conductor pillar portion 131b. Wherein each of the first conductor pillar portion 131a and the third conductor pillar portion 131b has a top 131t higher than that of the first dielectric layer 120.

A first dielectric sub-layer 140 is then formed over the first dielectric layer 120 to make the top surface 140s of the first dielectric sub-layer 140 substantially coplanaring with the top 131t of the first conductor pillar portions 131a and the third conductor pillar portion 131b (referring to Step S123). FIG. 1D(1) is a top view illustrating a structure after the first dielectric sub-layer 140 is formed over the first dielectric layer 120 according to one embodiment of the present disclosure. FIG. 1D(2) is a cross-sectional view taken along the cutting line C1D1 as depicted in FIG. 1D(1). FIG. 1D(3) is a cross-sectional view taken along the cutting line C1D2 as depicted in FIG. 1C(1). Wherein, the top surface 140s of the formed first dielectric sub-layer 140 has a level substantially the same as that of the top 131t of the first conductor pillar portions 131a and the third conductor pillar portion 131b.

In some embodiments, the forming of the first dielectric sub-layer 140 can includes steps as follows: A dielectric material (not shown), such as silicon oxide, silicon nitride, low-k dielectric or other suitable material is depositing a on the first dielectric layer 120 and covering the top surface 131t of the first conductor pillar portion 131a and the third conductor pillar portion 131b. A planarizing process, such as a chemical mechanical polishing (CMP) process or an etch back process, using the top surface 131t of the first conductor pillar portions 131a and the third conductor pillar portion 131b as a stop layer is performed to remove a portion of the dielectric material, so as to expose the tops surface 131t of the first conductor pillar portion 131a and the third conductor pillar portion 131b. Those "Exposed Heads" (the expose top surfaces 131t of the first conductor pillar portion 131a and the third conductor pillar portion 131b) of the first conductor pillar portions 131a and the third conductor pillar portion 131b can be used as landing pads for the subsequent process for forming the interconnection structure. Furthermore, each of the first conductor pillar portions 131a and the third conductor pillar portion 131b has a seed region or seed pillar in the upper portion thereof, and such seed region or seed pillar could be used for the following selective epitaxy growth.

Subsequently, a second conductor pillar portion (or a second sub conductor pillar) 132a is formed on the first conductor pillar 131a by a second selective epitaxy growth (referring to Step S123); and a fourth conductor pillar portion (or a fourth sub conductor pillar) 132b is formed on the third conductor pillar portion 131b, simultaneously. FIG. 1E(1) is a top view illustrating a structure after the second conductor pillar portion 132a and the fourth conductor pillar portion 132b are formed on the first conductor pillar portions 131a and the third conductor pillar portion 131b, according to one embodiment of the present disclosure. FIG. 1E(2) is a cross-sectional view taken along the cutting line C1E1 as depicted in FIG. 1E(1). FIG. 1E(3) is a cross-sectional view taken along the cutting line C1E2 as depicted in FIG. 1E(1).

In some embodiments of the present disclosure, the process for forming the second conductor pillar portion 132a and the fourth conductor pillar portion 132b can be (but not limited to) identical to that for forming the first conductor pillar portion 131a and the third conductor pillar portion 131b. In the present embodiment, the second conductor pillar portion 132a and the fourth conductor pillar portion 132b can be heavily doped conductive silicon plugs respectively growth from the top surface 131t of the first conductor pillar portions 131a and the third conductor pillar portion 131b by SEG and extending upwards beyond the top surface 140s of the first dielectric sub-layer 140. The second conductor pillar portion 132a and the fourth conductor pillar portion 132b have a dopant concentration different from (or the same to) that of the first conductor pillar portions 131a and the third conductor pillar portion 131b. The first conductor pillar portions 131a and the second conductor pillar portion 132a together form the first conductor pillar 130A; and third conductor pillar portion 131b and the fourth conductor pillar portion 132b together form the second conductor pillar 130B.

Referring to Step S13: forming a first conduction layer 150 over the first dielectric layer. FIG. 1F(1) is a top view illustrating a structure after the first conduction layer 150 is formed over the first dielectric layer 120 according to one embodiment of the present disclosure. FIG. 1F(2) is a cross-sectional view taken along the cutting line C1F1 as depicted in FIG. 1F(1). FIG. 1F(3) is a cross-sectional view taken along the cutting line C1F2 as depicted in FIG. 1F(1).

In the present embodiment, the forming of the first conduction layer 150 includes steps as follows: A first conduction material (not show), such as copper (Cu), Aluminum (Al), tungsten (W) or other suitable conductive material, can be deposited on the top surface 140s of the first dielectric sub-layer 140 over the first dielectric layer (referring to Step S131). A second dielectric sub-layer 160 is then deposited on the first conduction material (referring to Step S132). The first conduction material and the second dielectric sub-layer 160 are patterned to form the first conduction layer 150 and to define an opening hollow 109 passing the first conduction layer 150 and the second dielectric sub-layer 160, wherein the first conductor pillar 130A penetrates through the opening hollow 109 (referring to Step S133) without contacting the first conduction layer 150 and the second dielectric sub-layer 160.

In some embodiments of the present disclosure, the first conduction layer 150 and the second dielectric sub-layer 160 can be formed prior to the forming of the second conductor pillar portion 132a and the fourth conductor pillar portion 132b. In this case, the opening hollow 109 can be defined by an etching process passing the first conduction layer 150 and the second dielectric sub-layer 160 to expose the tops 131t of the first conductor pillar portions 131a and the third conductor pillar portion 131b, prior to the forming of the second conductor pillar portion 132a and the fourth conductor pillar portion 132b.

Referring to Step S14: forming at least one upper dielectric layer 170 over the first conduction layer 150. FIG. 1G(1) is a top view illustrating a structure after the upper dielectric layer 170 is formed over the over the first conduction layer 150 according to one embodiment of the present disclosure. FIG. 1G(2) is a cross-sectional view taken along the cutting line C1G1 as depicted in FIG. 1G(1). FIG. 1G(3) is a cross-sectional view taken along the cutting line C1G2 as depicted in FIG. 1G(1).

In the present embodiment, the forming of the upper dielectric layer 170 includes steps as follows: Firstly, at least one layer of upper dielectric material (not shown) is deposited to cover the second dielectric sub-layer 160 and the first dielectric sub-layer 140 (the portion of the top surface 140s exposed from the opening hollow 109) to fill in the opening hollow 109 (referring to Step S141). The upper dielectric material is then etched back, such that a top surface 170s of the upper dielectric layer 170 is lower than the top surface 130t of the first conductor pillar 130A and the second conductor pillar 130B (referring to Step S142).

Referring to Step S15: forming an upper conduction layer 180 over the upper dielectric layer 170; wherein the first conductor pillar 130A connects to the upper conduction layer 180 but disconnects from the first conduction layer 150. FIG. 1H(1) is a top view illustrating a structure after the conduction layer 180 is formed over the over the upper dielectric layer 170 according to one embodiment of the present disclosure. FIG. 1H(2) is a cross-sectional view taken along the cutting line C1H1 as depicted in FIG. 1H(1). FIG. 1H(3) is a cross-sectional view taken along the cutting line C1H2 as depicted in FIG. 1H(1).

In some embodiments of the present disclosure, the process for forming of the upper conduction layer 180 can be identical to or different from that for forming the first conductive layer 150.

After series steps of down-stream process are performed, the forming of the device 10 can be implemented. As mentioned, each of the exposed silicon region 102c of the gate terminal and the exposed silicon region of the source/drain terminal has seed regions for the selective epitaxy growth technique (SEG) to grow pillars based on the seed regions. Furthermore, each of the first conductor pillar portions 131a and the third conductor pillar portion 131b also has a seed region or seed pillar in the upper portion thereof, and such seed region or seed pillar could be used for the following selective epitaxy growth. This embodiment could also be applied to allows M1 interconnection (a kind of conductive terminal) or conduction layer to be directly connected to the MX interconnection layer (without a transitional conduction layers M2, M3, . . . MX−1) in a self-alignment way through one vertical conductive or conductor plug, as long as there is a seed portion or seed pillar on the upper portion of the conductive terminal and the conductor pillar portions configured for following selective epitaxy growth technique. The seed portion or seed pillar is not limited to silicon, and any material which could be used as a seed configured for following selective epitaxy growth is acceptable.

Furthermore, using FIG. 1E(3) as an example, the second conductor pillar portion 132a is grown upward by SEG method based on the seed region or seed pillar of the first conductor pillar portions 131a. Since the area of the seed region is the area of the top surface of the first conductor pillar portion 131a, the area of the bottom surface of the second conductor pillar portion 132a will be the same (or substantially the same) as that of the top surface of the first conductor pillar portions 131a, and self-alignment is easily accomplished between the first conductor pillar portions 131a and the second conductor pillar portion 132a.

Embodiment 2

According to one embodiment of the present disclosure, the method for forming a device 20 having a transistor structure 200 includes steps as follows:

Step S21: forming a first dielectric layer over a first terminal and a second terminal of a device.

Step S22: simultaneously forming a first silicon pillar passing through the first dielectric layer and connected to the first terminal and forming a second silicon pillar passing through the first dielectric layer and connected to the second terminal.

Step S221: forming open holes in the first dielectric layer to reveal a silicon region of the first terminal and a silicon region of the second terminal.

Step S222: simultaneously forming the first silicon pillar on the silicon region of the first terminal and forming the second silicon pillar on the silicon region of the second terminal by a selective epitaxy growth.

Step S23: forming a first conduction layer over the first dielectric sub-layer.

Referring to Step S21: forming a first dielectric layer 120 over a first terminal 21 and a second terminal 22 of a device 20. In one embodiment, the first terminal 21 and the second terminal 22 are the top region of the gate terminal and source/drain terminal, respectively. FIG. 2A(1) is a top view illustrating a structure after a first dielectric layer 220 is formed over a transistor structure 200 that is previously formed in a semiconductor substrate 201, according to one embodiment of the present disclosure. FIG. 2A(2) is a cross-sectional view taken along the cutting line C2A1 as depicted in FIG. 2A(1). FIG. 2A(3) is a cross-sectional view taken along the cutting line C2A2 as depicted in FIG. 2A(1).

In the present embodiment, the semiconductor substrate 201 includes a silicon layer, such as a poly-silicon layer or an amorphous silicon layer. As shown in FIGS. 2A(1) to 2A(3), the transistor structure 200 is formed in an active area of the silicon layer defined by a STI 205. The transistor structure 200 has a gate terminal 202 formed on the active area, a transistor channel region 203 formed in the active area beneath the gate terminal 202 and source/drain regions 204 formed in the active area and adjacent to the transistor channel region 203.

The gate terminal 202 comprises a gate dielectric layer 202a, a gate conduction layer 202b formed over the gate dielectric layer 202a, a silicon region 202c formed over the gate conduction layer 202b, a capping layer (e.g. a nitride layer) covering the top of the silicon region 202c and at least one spacer (e.g, including a nitride spacer 202s1 and an thermal oxide spacer 202s2) covering the sidewalls of the gate dielectric layer 202a, the gate conduction layer 202b and the silicon region 202c. The top portion of the silicon region 202c could serve as the first terminal 21; and the second terminal 22 can be the drain terminal of the source/drain regions 204.

The first dielectric layer 220 is formed on the semiconductor substrate 201 at least covering the active area including the gate terminal 202 and the source/drain regions 204 as well as the STI 205.

Referring to Step S22: simultaneously forming a first silicon pillar 231a passing through the first dielectric layer 220 and connected to the first terminal 21 and forming a second silicon pillar 231b passing through the a first dielectric layer 220 and connected to the second terminal 22. FIG. 2B(1) is a top view illustrating a structure after the first silicon pillar 231a and the second silicon pillar 231b are formed according to one embodiment of the present disclosure. FIG. 2B(2) is a cross-sectional view taken along the cutting line C2B1 as depicted in FIG. 2B(1). FIG. 2B(3) is a cross-sectional view taken along the cutting line C2B2 as depicted in FIG. 2B(1). Those silicon pillar could be made of highly doped silicon for higher conductivity.

In the present embodiment, the forming of the first silicon pillar 231a and the second silicon pillar 231b includes steps as follows: Firstly, a plurality of open holes (such as the open holes 207a and 207b) are formed in the first dielectric layer 220 to respectively reveal the top portion of the silicon region 202c of the first terminal 21 and the drain terminal of the source/drain regions 204 serving as the second terminal 22 (referring to Step S221).

Next, referring to Step S222, the first silicon pillar 231a is formed on the silicon region 202c of the first terminal 21 that is exposed from the open hole 207a by a SEG, and the second silicon pillar 231b is formed on the silicon region of the second terminal 22 that is exposed from the open hole 207b by the same SEG, simultaneously. Wherein, each of the first silicon pillar 231a and the second silicon pillar 231b has a top surface 231t higher than that of the first dielectric layer 220.

In some embodiments, a first dielectric sub-layer 240 is then formed over the first dielectric layer 220 to make the top surface 240s of the first dielectric sub-layer 240 substantially coplanaring with the top surface 203t of the first silicon pillar 231a and the second silicon pillar 231b. planarizing the first dielectric sub-layer.

Referring to Step S23: forming a first conduction layer 250 over the first dielectric sub-layer 240. FIG. 2C(1) is a top view illustrating a structure after the first conduction layer 250 is formed over the first dielectric sub-layer 240 according to one embodiment of the present disclosure. FIG. 2C(2) is a cross-sectional view taken along the cutting line C2C1 as depicted in FIG. 2C(1). FIG. 2C(3) is a cross-sectional view taken along the cutting line C2C2 as depicted in FIG. 2C(1).

In the present embodiment, the first conduction layer 250 is a patterned metal layer and includes a first metal sub-layer layer 250a and a second metal sub-layer 250b serving as the connecting wires respectively landing on the top surface 203t of the first silicon pillar 231a and the second silicon pillar 231b.

The exposed heads (the top surface 230t of the first conductor pillar 230A and the second conductor pillar 230B) can be used as the landing pads for facilitating M1 (the first conduction layer 250) to connect with the conductor pillars (the first conductor pillar 230A and the second conductor pillar 230B) to touch on both the gate (the first terminal 21) or the diffusion areas (the second terminal 22), respectively. There is no need to make larger metal M1 pad which need to have a large size covering the openings of holes (the open holes 207a and 207b) since there is no worry of doing any etching steps on oxide or dielectric related to these contact holes.

After series steps of down-stream process are performed, the forming of the device 20 can be implemented.

Embodiment 3

According to one embodiment of the present disclosure, the method for forming a device 30 having a transistor structure 200 includes steps as follows:

Step S31: forming a first dielectric layer over a first terminal and a second terminal of a device.

Step S32: simultaneously forming a first silicon pillar passing through the a first dielectric layer and connected to the first terminal and forming a second silicon pillar passing through the a first dielectric layer and connected to the second terminal.

Step S321: forming open holes in the first dielectric layer to reveal a silicon region of the first terminal and a silicon region of the second terminal.

Step S322: simultaneously forming the first silicon pillar on the silicon region of the first terminal and forming the second silicon pillar on the silicon region of the second terminal by a selective epitaxy growth.

Step S33: replacing the first silicon pillar by a first conductor pillar and replacing the second silicon pillar by a second conductor pillar.

Step S34: forming a first conduction layer over the first dielectric sub-layer.

The structure of the device 30 and the manufacture method thereof are similar to that of device 20. The difference between these two is that, in the device 30, a first conductor pillar 330A and a second conductor pillar 330B is used to take the place of the first silicon pillar 231a and the second silicon pillar 231b. Since the steps S31 to S32 for forming the device 30 are identical to the steps S21 to S22 for forming the device 20, thus the detail procedural and material applied thereby will not redundantly described here, and the identical elements of the embodiments are designated with the same reference numerals. The process for forming the device 30 is described from step S33.

Referring to Step S33: replacing the first silicon pillar 231a by a first conductor pillar 330A and replacing the second silicon pillar 231b by a second conductor pillar 330B. FIG. 3A(1) is a top view illustrating a structure after the first conductor pillar 330A and the second conductor pillar 330B are formed according to one embodiment of the present disclosure. FIG. 3A(2) is a cross-sectional view taken along the cutting line C3A1 as depicted in FIG. 3A(1). FIG. 3A(3) is a cross-sectional view taken along the cutting line C3A2 as depicted in FIG. 3A(1).

In the present embodiment, the replacement of the first silicon pillar 231a and the second silicon pillar 231b includes steps as follows: Firstly, a selective etching technique is performed to remove the first silicon pillar 231a and the second silicon pillar 231b to make the silicon region 202c of the first terminal 21 and the drain terminal of the source/drain regions 204 serving as the second terminal 22 respectively exposed from the open holes 207a and 207b.

A metal-plug process is then performed to form a titanium nitride (TiN) layer 330n on the sidewalls and the bottoms of the open holes 207a and 207b. Next, tungsten metal is deposited on the top surface 240s of the first dielectric sub-layer 240 to fill the open holes 207a and 207b. Subsequently, a CMP process or an etching back process is performed to remove the portion of the tungsten metal disposed on the top surface 240s of the first dielectric sub-layer 240, thereby two tungsten pillars 330w surrounded by the TiN layer 330n are respectively formed in the open holes 207a and 207b.

Wherein, the tungsten pillars 330w and the portion of the TiN layer 330n that are both disposed in the open hole 207a together form the first conductor pillar 330A. The tungsten pillars 330w and the portion of the TiN layer 330n that are both disposed in the open hole 207b together form the second conductor pillar 330B. Each of the first conductor pillar 330A and the second conductor pillar 330B has a top surface 330t substantially coplanaring with the top surface 240s of the first dielectric sub-layer 240.

Referring to Step S34: forming a first conduction layer 350 over the first dielectric sub-layer 240. FIG. 3B(1) is a top view illustrating a structure after the first conduction layer 350 is formed over the first dielectric sub-layer 240 according to one embodiment of the present disclosure. FIG. 3B(2) is a cross-sectional view taken along the cutting line C3B1 as depicted in FIG. 3B(1). FIG. 3B(3) is a cross-sectional view taken along the cutting line C3B2 as depicted in FIG. 3B(1).

In the present embodiment, the first conduction layer 350 is a patterned metal layer and includes a first metal sub-layer 350a and a second metal sub-layer 350b serving as the connecting wires respectively landing on the top surface 330t of the first conductor pillar 330A and the second conductor pillar 330B.

After series steps of down-stream process are performed, the forming of the device 30 can be implemented.

Embodiment 4

According to one embodiment of the present disclosure, the method for forming a device 40 having a transistor structure 200 includes steps as follows:

Step S41: forming a first dielectric layer over a first terminal and a second terminal of a device.

Step S42: simultaneously forming a first silicon pillar passing through the a first dielectric layer and connected to the first terminal and forming a second silicon pillar passing through the a first dielectric layer and connected to the second terminal.

Step S43: replacing the first silicon pillar by a first conductor pillar and replacing the second silicon pillar by a second conductor pillar.

Step S44: simultaneously forming a first highly doped silicon pillar on the first conductor pillar and forming a second highly doped silicon pillar on the second conductor pillar.

Step S45: forming a first conduction layer over the first dielectric sub-layer.

The structure of the device 40 and the manufacture method thereof are similar to that of device 30. The difference between these two is that the device 40 further includes a first highly doped silicon pillar 410a and a second highly doped silicon pillar 410b. Since the steps S41 to S43 for forming the device 40 are identical to the steps S31 to S33 for forming the device 30, thus the detail procedural and material applied thereby will not redundantly described here, and the identical elements of the embodiments are designated with the same reference numerals. The process for forming the device 40 is described from step S44.

Referring to Step S44: simultaneously forming a first highly doped silicon pillar 410a connected to the first conductor pillar 330A and forming a second highly doped silicon pillar 410b connected to the second conductor pillar 330B. FIG. 4A(1) is a top view illustrating a structure after the first highly doped silicon pillar 410a and the second highly doped silicon pillar 410b are formed over the first conductor pillar 330A and the second conductor pillar 330B as depicted in FIG. 4A(1) according to one embodiment of the present disclosure. FIG. 4A(2) is a cross-sectional view taken along the cutting line C4A1 as depicted in FIG. 4A(1). FIG. 4A(3) is a cross-sectional view taken along the cutting line C4A2 as depicted in FIG. 4A(1).

The forming of the first highly doped silicon pillar 410a and the second highly doped silicon pillar 410b includes steps as follows: Upper portions of the two tungsten pillars 330w and the TiN layer 330n respectively formed in the open holes 207a and 407b are removed by an etching process (such as, a selective etching technique). Subsequently, highly doped N+ poly silicon is deposited on the first dielectric sub-layer 240 to fill the portion of open holes 207a and 207b originally occupied by the removed upper portions of the two tungsten pillars 330w and the TiN layer 330n.

A CMP process or an etching back process is then performed to remove the portion of the highly doped N+ poly silicon disposed on the top surface 240s of the first dielectric sub-layer 240, thereby the first highly doped silicon pillar 410a and the second highly doped silicon pillar 410b are formed in the upper portion of open holes 207a and 207b originally occupied by the removed upper portions of the tungsten pillars 330w and the TiN layer 330n. Wherein each of the first highly doped silicon pillar 410a and the second highly doped silicon pillar 410b is surrounded by the first dielectric sub-layer 240, and has a top surface 410s coplanaring with the top surface 240s of the first dielectric sub-layer 240. In an another way, a conductor pillar could include the tungsten pillars and the first highly doped silicon pillar, that is, the conductor pillar has a seed region or seed pillar in the upper portion thereof.

Referring to Step S45: forming a first conduction layer 450 over the first dielectric sub-layer 240. FIG. 4B(1) is a top view illustrating a structure after the first conduction layer 450 is formed over the first dielectric sub-layer 240 according to one embodiment of the present disclosure. FIG. 4B(2) is a cross-sectional view taken along the cutting line C4B1 as depicted in FIG. 4B(1). FIG. 4B(3) is a cross-sectional view taken along the cutting line C4B2 as depicted in FIG. 4B(1).

In the present embodiment, the first conduction layer 450 is a patterned metal layer and includes a first metal sub-layer 350a and a second metal sub-layer 450b serving as the connecting wires respectively landing on the top surface 410s the first highly doped silicon pillar 410a and the second highly doped silicon pillar 410b. The exposed top surface 410s the first highly doped silicon pillar 410a and the second highly doped silicon pillar 410b can be used as the landing pads for facilitating M1 (the first conduction layer 450) to connect with the conductor pillars (the first conductor pillar 330A and the second conductor pillar 330B) to touch on both the gate (the first terminal 21) or the diffusion areas (the second terminal 22), respectively.

After series steps of down-stream process are performed, the forming of the device 40 can be implemented.

Embodiment 5

According to one embodiment of the present disclosure, the method for forming a device 50 having a transistor structure 200 includes steps as follows:

Step S51: forming a first dielectric layer over a first terminal and a second terminal of a device.

Step S52: simultaneously forming a first silicon pillar passing through the first dielectric layer and connected to the first terminal and forming a second silicon pillar passing through the a first dielectric layer and connected to the second terminal.

Step S53: replacing the first silicon pillar by a first conductor pillar and replacing the second silicon pillar by a second conductor pillar.

Step S54: simultaneously forming a first highly doped silicon pillar on the first conductor pillar and forming a second highly doped silicon pillar on the second conductor pillar.

Step S55: forming a first conduction layer over the first dielectric sub-layer.

Step S56: forming highly doped silicon side pillars respectively on the first highly doped silicon pillar and the second highly doped silicon pillar.

The structure of the device 50 and the manufacture method thereof are similar to that of device 40. The difference between these two is that the device 50 further included highly doped silicon side pillars 520 connected to the first conduction layer 550. Since the steps S51 to S54 for forming the device 50 are identical to the steps S41 to S44 for forming the device 40, thus the detail procedural and material applied thereby will not redundantly described here, and the identical elements of the embodiments are designated with the same reference numerals. The process for forming the device 50 is described from step S55.

FIG. 5(1) is a top view illustrating a structure after the first conduction layer 550 and the highly doped silicon side pillars are formed according to one embodiment of the present disclosure. FIG. 5(2) is a cross-sectional view taken along the cutting line C51 as depicted in FIG. 5(1). FIG. 5(3) is a cross-sectional view taken along the cutting line C52 as depicted in FIG. 5(1).

The forming of the first conduction layer 550 (referring to step S55) includes steps as follows: Firstly, a patterned metal layer including a first metal sub-layer 550*a* and a second metal sub-layer 550*b* is formed to make the first metal sub-layer 550*a* and the second metal sub-layer 550*b* respectively landing on the first highly doped silicon pillar 410*a* and the second highly doped silicon pillar 410*b*.

Next, referring to step S56: a portion of the first metal sub-layer 550*a* and a portion of the second metal sub-layer 550*b* are removed (for example, by an etching process) to partially expose the top surface 410*s* of the first highly doped silicon pillar 410*a* and the second highly doped silicon pillar 410*b*. Subsequently, a SEG is performed base on the exposed portions of the top surface 410*s* to grow two highly doped silicon side pillars 520 respectively on the first highly doped silicon pillar 410*a* and the second highly doped silicon pillar 410*b*, wherein the two highly doped silicon side pillars 520 respectively connect to the (vertical) sidewalls of the etched first metal sub-layer 550*a* and the second metal sub-layer 550*b*.

Based on this structure, even if the width of the metal conduction layer (such as, the first metal sub-layer 550*a* or the second metal sub-layer 550*b*) is the same as that of the underneath contact plug (which may be as small as minimum feature size), then the photolithographic masking Misalignment tolerance can cause that the metal conduction layer cannot fully cover the contact (as shown in FIGS. 5(2) and 5(3)), though there is no worry about the resistance between the metal conduction layer and contact may be too high due to shortages of contact areas. The invention here is that further using SEG to grow some extra highly doped silicon material (side pillars 520) to attach the vertical walls of the metal conduction layer.

After series steps of down-stream process are performed, the forming of the device 50 can be implemented.

Embodiment 6

According to one embodiment of the present disclosure, the method for forming a device 60 having a transistor structure 200 includes steps as follows:

Step S61: forming a first dielectric layer over a first terminal and/or a second terminal of a device.

Step S62: forming a first silicon pillar passing through the a first dielectric layer and connected to the first terminal and/or forming a second silicon pillar passing through the a first dielectric layer and connected to the second terminal.

Step S63: replacing the first silicon pillar by a first conductor pillar and replacing the second silicon pillar by a second conductor pillar.

Step S64: forming a first highly doped silicon pillar on the first conductor pillar and forming a second highly doped silicon pillar on the second conductor pillar.

Step S65: forming a first conduction layer over the first dielectric sub-layer.

Step S66: forming a third conductor pillar and a fourth conductor pillar respectively on the first highly doped silicon pillar and the second highly doped silicon pillar, so as to make the first conduction layer surrounds and connects to the third conductor pillar and the fourth conductor pillar.

Step S67: simultaneously forming a third highly doped silicon pillar on the third conductor pillar and forming a fourth highly doped silicon pillar on the fourth conductor pillar.

The structure of the device 60 and the manufacture method thereof are similar to that of device 40. The difference between these two is that the interconnection structure of the device 60 can further extended. Since the steps S61 to S64 for forming the device 60 are identical to the steps S41 to S44 for forming the device 40, thus the detail procedural and material applied thereby will not redundantly described here, and the identical elements of the embodiments are designated with the same reference numerals. The process for forming the device 50 is described from step S65.

Referring to Step S65: forming a first conduction layer 650 over the first dielectric sub-layer 240. FIG. 6A(1) is a top view illustrating a structure after the first conduction layer 650 is formed over the first dielectric sub-layer 240 FIG. 6A(2) is a cross-sectional view taken along the cutting line C6A1 as depicted in FIG. 6A(1).

Prior to the forming of the first conduction layer 650, two undoped silicon pillars 610 are formed respectively on the top surface 410*s* of the first highly doped silicon pillar 410*a* and the second highly doped silicon pillar 410*b*. In the present embodiment, a SEG is performed base on the top surface 410*s* of the first highly doped silicon pillar 410*a* and the second highly doped silicon pillar 410*b* to grow two undoped silicon pillars 610 respectively, wherein each of the two undoped silicon pillars 610 has a top surface 610s higher than the top surface 240s of the first dielectric sub-layer 240.

Next, the first conduction layer 650 is formed on the first dielectric sub-layer 240 to surround and connect to these two undoped silicon pillars 610. In the present embodiment the first conduction layer 650 has a top surface 650s lower than the top surface 610s of these two undoped silicon pillars 610. Subsequently, a dielectric sub-layer 640 is formed on the top surface 650s of the first conduction layer 650 to surround and connect to these two undoped silicon pillars 610. Wherein, the top surface 640s of the second dielectric sub-layer 640 substantially coplanaring with the top surface 610s of these two undoped silicon pillars 610.

Referring to Step S66: forming a third conductor pillar 630A and a fourth conductor pillar 630B respectively on the first highly doped silicon pillar 410a and the second highly doped silicon pillar 410b, so as to make the first conduction layer 650 surrounding and connecting to the third conductor pillar 630A and the fourth conductor pillar 630B. FIG. 6B(1) is a top view illustrating a structure after the third conductor pillar 630A and the fourth conductor pillar 630B are formed on the first highly doped silicon pillar 410a and the second highly doped silicon pillar 410b according to one embodiment of the present disclosure. FIG. 6B (2) is a cross-sectional view taken along the cutting line C6B1 as depicted in FIG. 6B(1). FIG. 6B(3) is a cross-sectional view taken along the cutting line C6B2 as depicted in FIG. 6B(1).

In the present embodiment, the forming of the third conductor pillar 630A and a fourth conductor pillar 630B includes steps as follows: Firstly, these two undoped silicon pillars 610 are removed to form two open holes 607a and 607b, and a metal-plug process is then performed to form a TiN layer 630n on the sidewalls and the bottoms of the open holes 607a and 607b. Next tungsten metal is deposited on the top surface 640s of the second dielectric sub-layer 640 to fill the open holes 607a and 607b. Subsequently, a CMP process or an etching back process is performed to remove the portion of the tungsten metal disposed on the top surface 640s of the second dielectric sub-layer 640, thereby two tungsten pillars 630w surrounded by the TiN layer 630n are respectively formed in the open holes 607a and 607b.

In another embodiment, besides the two undoped silicon pillars 610 are removed, the first highly doped silicon pillar 410a and the second highly doped silicon pillar 410b could be removed as well. Then a metal-plug process is performed to form a TiN layer 630n and the tungsten pillar 630w in the open holes 607a and 607b. Therefore, the fourth conductor pillar 630B will contact the second conductor pillar 330B, and the third conductor pillar 630A will contact the first conductor pillar 330A, as shown in FIG. 6B(4) and FIG. 6B( ). Thus, the resistance of this pillar structure could be lower.

Wherein, the tungsten pillars 630w and the portion of the TiN layer 630n that are both disposed in the open hole 607a together form the third conductor pillar 630A. The tungsten pillars 630w and the portion of the TiN layer 630n that are both disposed in the open hole 607b together form the fourth conductor pillar 630B. Each of the third conductor pillar 630A and the fourth conductor pillar 630B has a top surface 630s substantially coplanaring with the top surface 640s of the second dielectric sub-layer 640.

Referring to Step S67: simultaneously forming a third highly doped silicon pillar 660a on the third conductor pillar 630A and forming a fourth highly doped silicon pillar 660b on the fourth conductor pillar 630B. FIG. 6C(1) is a top view illustrating a structure after the third highly doped silicon pillar 660a and the fourth highly doped silicon pillar 660b are formed over the third conductor pillar 630A and the fourth conductor pillar 630B according to one embodiment of the present disclosure. FIG. 6C(2) is a cross-sectional view taken along the cutting line C6C1 as depicted in FIG. 6C(1). FIG. 6C(3) is a cross-sectional view taken along the cutting line C6C2 as depicted in FIG. 6C(1).

The forming of the third highly doped silicon pillar 660a and the fourth highly doped silicon pillar 660b includes steps as follows: Upper portions of the two tungsten pillars 630w and the TiN layer 630n respectively formed in the open holes 607a and 607b are removed by an etching process. Subsequently, highly doped N+ poly silicon is deposited on the second dielectric sub-layer 640 to fill the portion of open holes 607a and 607b originally occupied by the removed upper portions of the two tungsten pillars 630w and the TiN layer 630n.

A CMP process or an etching back process is then performed to remove the portion of the highly doped N+ poly silicon disposed on the top surface 640s of the second dielectric sub-layer 640, thereby the third highly doped silicon pillar 660a and the fourth highly doped silicon pillar 660b are then formed in the upper portion of open holes 607a and 607b, wherein the third highly doped silicon pillar 660a and the fourth highly doped silicon pillar 660b are surrounded by the second dielectric sub-layer 640, and has a top surface 660s coplanaring with the top surface 640s of the second dielectric sub-layer 640.

Thereinafter, the first conduction layer 650 and the second dielectric sub-layer 640 are patterned to form a first metal sub-layer 650a and a second metal sub-layer 650b serving as the connecting wires respectively surround and connect to the third conductor pillar 630A and the fourth conductor pillar 630B.

After series steps of down-stream process are performed, the forming of the device 60 can be implemented. Furthermore, using FIG. 6A(3) and FIG. 6C(3) as an example, the undoped silicon pillar 610 is first grown upward by SEG method based on the seed region of the first highly doped silicon pillar 410a (FIG. 6A(3)), and then the undoped silicon pillar 610 is replaced by the highly doped silicon pillar 660a and the third conductor pillar 630A (FIG. 6C(3)). Since the area of the seed region is the area of the top surface of the first highly doped silicon pillar 410a, the area of the bottom surface of the undoped silicon pillar 610 will be the same (or substantially the same) as that of the top surface of the first highly doped silicon pillar 410a, and the area of the bottom surface of the third conductor pillar 630A (which replaces the undoped silicon pillar 610) will also be the same (or substantially the same) as that of the top surface of the first highly doped silicon pillar 410a. Thus, self-alignment is easily accomplished between the first highly doped silicon pillar 410a and the third conductor pillar 630A.

That is, stating alternatively, as shown in FIG. 6C(3), a lower conductor pillar (the combination of 330A and 410a) has a seed region or seed pillar (such as the highly doped silicon pillar 410a) in the upper portion thereof, and the higher conductor pillar (the combination of 630A and 660a) has a seed region or seed pillar (such as the highly doped silicon pillar 660a) in the upper portion thereof as well, the area of the top surface of the lower conductor pillar is the same or substantially the same as that of the bottom surface of the higher conductor pillar because of the self-alignment disclosed herein.

Embodiment 7

According to one embodiment of the present disclosure, the method for forming a device 70 having a transistor structure 200 includes steps as follows:

Step S71: forming a first dielectric layer over a first terminal and a second terminal of a device.

Step S72: forming a first silicon pillar passing through the a first dielectric layer and connected to the first terminal and forming a second silicon pillar passing through the a first dielectric layer and connected to the second terminal.

Step S73: replacing the first silicon pillar by a first conductor pillar and replacing the second silicon pillar by a second conductor pillar.

Step S74: forming a first highly doped silicon pillar on the first conductor pillar and forming a second highly doped silicon pillar on the second conductor pillar.

Step S75: forming a first conduction layer over the first dielectric sub-layer.

Step S76: forming a third conductor pillar and a fourth conductor pillar respectively on the first highly doped silicon pillar and the second highly doped silicon pillar, so as to make the first conduction layer surrounds and connects to the third conductor pillar and the fourth conductor pillar.

Step S77: forming a third highly doped silicon pillar on the third conductor pillar and forming a fourth highly doped silicon pillar on the fourth conductor pillar.

Step S78: repeating the Steps S75 and S77.

The structure of the device 70 and the manufacture method thereof are similar to that of device 60. The difference between these two is that the interconnection structure of the device 70 can further extended by repeating the steps S75 to S77. Since the steps S71 to S77 for forming the device 70 are identical to the steps S61 to S67 for forming the device 60, thus the detail procedural and material applied thereby will not redundantly described here, and the identical elements of the embodiments are designated with the same reference numerals. The process for forming the device 70 is described from step S78.

FIG. 7A(1) is a top view illustrating a structure after the step S75 is repeated to form a second conduction layer 750 over the second dielectric sub-layer 640 according to one embodiment of the present disclosure. FIG. 7A (2) is a cross-sectional view taken along the cutting line C7A1 as depicted in FIG. 7A(1). FIG. 7A(3) is a cross-sectional view taken along the cutting line C7A2 as depicted in FIG. 7A(1).

In the present embodiment, prior to the forming of the second conduction layer 750, two undoped silicon pillars 710 are formed respectively on the top surface 660s of the third highly doped silicon pillar 660a and the fourth highly doped silicon pillar 660b. In the present embodiment, a SEG is performed base on the top surface 660s of the third highly doped silicon pillar 660a and the fourth highly doped silicon pillar 660b to grow the two undoped silicon pillars 710 respectively. Subsequently, a second dielectric layer 720 is formed to cover the first dielectric sub-layer 240, the second dielectric sub-layer 640 and the first conduction layer 650. Wherein each of the two undoped silicon pillars 710 has a top surface 710s higher than the top surface 720s of the second dielectric layer 720.

Next, the second conduction layer 750 is formed on the second dielectric layer 720 to surround and connected to these two undoped silicon pillars 710. Subsequently, a third dielectric sub-layer 740 is formed on the top surface 750s of the second conduction layer 750 to surround and connected to these two undoped silicon pillars 710. Wherein, the top surface 740s of the third dielectric sub-layer 740 substantially coplanaring with the top surface 710s of these two undoped silicon pillars 710.

FIG. 7B(1) is a top view illustrating a structure after a fifth conductor pillar 730A and a sixth conductor pillar 730B are formed on the third highly doped silicon pillar 660a and the fourth highly doped silicon pillar 660b according to one embodiment of the present disclosure. FIG. 7B(2) is a cross-sectional view taken along the cutting line C7B1 as depicted in FIG. 7B(1). FIG. 7B(3) is a cross-sectional view taken along the cutting line C7B2 as depicted in FIG. 7B(1).

Similar to the step S66 for forming the third conductor pillar 630A and the fourth conductor pillar 630B, the fifth conductor pillar 730A and the sixth conductor pillar 730B are formed by replace these two undoped silicon pillars 710 with two tungsten pillars 730w surrounded by a TiN layer 730n.

Again, similar to FIG. 6B(4) and FIG. 6B(5), besides the two undoped silicon pillars 710 are removed, the first highly doped silicon pillar 660a and the second highly doped silicon pillar 660b could be removed as well. Then a metal-plug process is performed to form a TiN layer 730n and a tungsten pillars 730w in open holes. Therefore, the fourth conductor pillar 630B will contact the sixth conductor pillar 730B, and the third conductor pillar 630A will contact the fifth conductor pillar 730A, as shown in FIG. 7B(4) and FIG. 7B(5). Thus, the resistance of this structure will be lower. The structures in FIG. 6B(4), FIG. 6B(5), FIG. 7B(4) and FIG. 7B(5) could be repeated applied to the following processes to form higher conductor pillar to other level of metal layers.

FIG. 7C(1) is a top view illustrating a structure after a fifth highly doped silicon pillar 760a and a sixth highly doped silicon pillar 760b are formed over the fifth conductor pillar 730A and the sixth conductor pillar 730B as according to one embodiment of the present disclosure. FIG. 7C(2) is a cross-sectional view taken along the cutting line C7C1 as depicted in FIG. 7C(1). FIG. 7C(3) is a cross-sectional view taken along the cutting line C6C2 as depicted in FIG. 6C(1).

Similar to the step S67 for forming the highly doped silicon pillar 660a and the fourth highly doped silicon pillar 660b, the fifth highly doped silicon pillar 760a and the sixth highly doped silicon pillar 760b can be formed by highly doped N+ poly silicon taking the place of the upper portions of the fifth conductor pillar 730A and the sixth conductor pillar 730B. Wherein the fifth highly doped silicon pillar 760a and the sixth highly doped silicon pillar 760b are surrounded by the second conduction layer 750 and the third dielectric sub-layer 740, and has a top surface 760t coplanaring with the top surface 740s of the third dielectric sub-layer 740.

Thereinafter, the second conduction layer 750 and the third dielectric sub-layer 740 are patterned to form a third metal sub-layer 750a and a fourth metal sub-layer 650b serving as the connecting wires respectively surrounds and connects to the fifth conductor pillar 730A and the sixth conductor pillar 730B.

After series steps of down-stream process are performed, the forming of the device 60 can be implemented. Again, stating alternatively, as shown in FIG. 7C(3), the previously mentioned higher conductor pillar (the combination of 630A and 660a) has a seed region or seed pillar (such as the highly doped silicon pillar 660a) in the upper portion thereof, and the upper conductor pillar (the combination of 730A and 760a) has a seed region or seed pillar (such as the highly doped silicon pillar 760a) in the upper portion thereof as well, the area of the top surface of the higher conductor pillar is the same or substantially the same as that of the bottom surface of the upper conductor pillar because of the self-alignment disclosed herein. Based on the FIG. 6C(3) and FIG. 7C(3), all conductor pillars could be self-aligned from the bottom conductor pillar to the upper or top conductor pillar to achieve vertical connections between them, which is different from the conventional alignment method from the upper conductor pillar to the bottom conductor pillar.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

Figure 8:
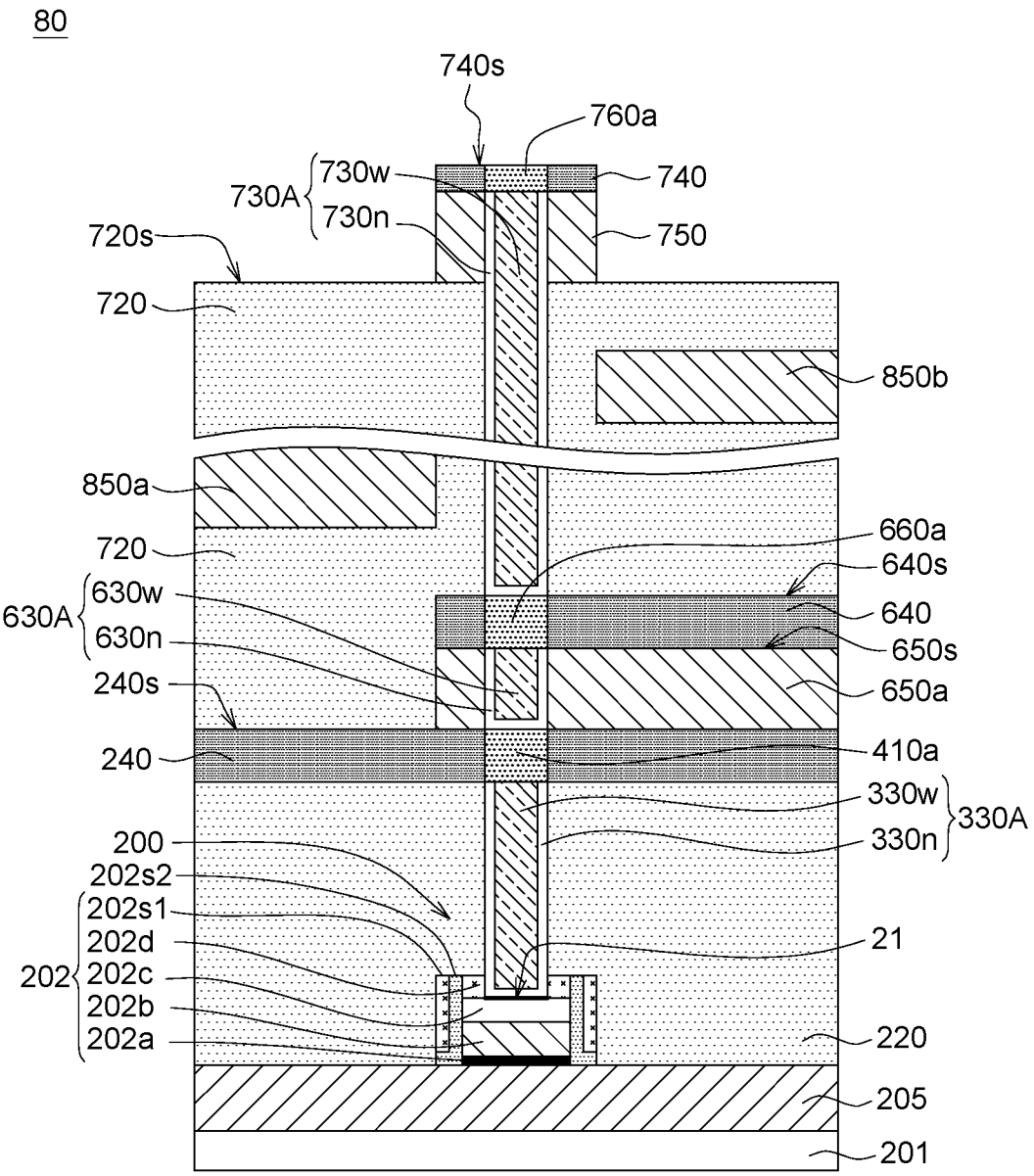
FIG. 8 is a cross-sectional view illustrating a device having a transistor structure according to further another embodiment of the present disclosure.

FIG. 8 is a cross-sectional view illustrating a device 80 having a transistor structure 200 according to further another embodiment of the present disclosure. In the present embodiment, the structure of the device 80 and the manufacture method thereof are similar to that of device 70. The difference between these two is that the device 80 can further include other conduction layers 850a and 850b between the first conduction layer (e.g., the first metal sub-layer 650a) and the upper conduction layer (e.g., the second conduction layer 750), wherein each of the middle conduction layers 850a and 850b vertically shifts with (not vertically aligns to) each other, and the conductor pillar (e.g., the fifth conductor pillar 730A) does not electrically connect the plurality of middle conduction layers 850a and 850b.

What is claimed is:

1. An interconnection structure comprising:
   a first dielectric layer over a first conductive terminal;
   a first conduction layer over the first dielectric layer;
   a conductor pillar penetrating through the first dielectric layer and connected to the first conductive terminal;
   an upper dielectric layer over the first conduction layer; and
   an upper conduction layer over the upper dielectric layer;
   wherein the conductor pillar penetrates through the upper dielectric layer, the conductor pillar connects to the upper conduction layer and a seed region of the first conductive terminal, but the conductor pillar does not electrically connect the first conduction layer;
   the conductor pillar comprises a first epitaxial conductor pillar portion and a second epitaxial conductor pillar portion, the first epitaxial conductor pillar portion is surrounded by the first dielectric layer and the second epitaxial conductor pillar portion is surrounded by the upper dielectric layer; an area of a top surface of the first epitaxial conductor pillar portion is the same as an area of a bottom surface of the second epitaxial conductor pillar portion; a top surface of the second epitaxial conductor pillar portion is higher than a top surface of the upper dielectric layer; and the upper conduction layer contacts the top surface and sidewalls of the second epitaxial conductor pillar portion.

2. The interconnection structure according to claim 1, further comprising a plurality of middle conduction layers between the first conduction layer and the upper conduction layer, wherein each middle conduction layer vertically shifts with each other, and the conductor pillar does not electrically connect the plurality of middle conduction layers.

3. The interconnection structure according to claim 1, wherein the first epitaxial conductor pillar portion is formed on the seed region of the first conductive terminal, wherein the seed region is a silicon seed region.

4. The interconnection structure according to claim 3, wherein the seed region of the first conductive terminal is made of a poly-silicon.

5. The interconnection structure according to claim 1, wherein the second epitaxial conductor pillar portion is formed on a seed region of the first epitaxial conductor pillar portion.

6. The interconnection structure according to claim 1, wherein the first conductive terminal is a gate terminal of a semiconductor transistor; wherein the gate terminal comprises a gate dielectric layer, a gate metal layer over the gate dielectric layer, and the seed region is over the gate metal layer.

7. The interconnection structure according to claim 1, wherein the first conductive terminal is a gate terminal of a semiconductor transistor; wherein the gate terminal comprises a gate dielectric layer, and a gate poly-silicon layer over the gate dielectric layer, and the seed region is a portion of the gate poly-silicon layer.

8. The interconnection structure according to claim 1, wherein the first conductive terminal is a drain terminal of a semiconductor transistor.

9. An interconnection structure comprising:
   a semiconductor transistor formed on a semiconductor substrate, the semiconductor transistor having a gate terminal and a drain region;
   a first dielectric layer over the semiconductor transistor;
   a first conduction layer over the first dielectric layer;
   an upper dielectric layer over the first conduction layer;
   an upper conduction layer over the upper dielectric layer; and
   a conductor pillar penetrates through the first dielectric layer and the upper dielectric layer, the conductor pillar comprises a first epitaxial semiconductor pillar portion and a second epitaxial semiconductor pillar portion; a top surface of the first epitaxial semiconductor pillar portion is higher than a top surface of the first dielectric layer; and a top surface of the second epitaxial semiconductor pillar portion is higher than a top surface of the upper dielectric layer;
   wherein the upper conduction layer is over the second epitaxial semiconductor pillar portion, the upper conduction layer contacts the top surface and sidewalls of the second epitaxial semiconductor pillar portion, and the first dielectric layer does not contact to the second epitaxial semiconductor pillar portion.

* * * * *